US012757376B2

(12) United States Patent
Kim et al.

(10) Patent No.: US 12,757,376 B2
(45) Date of Patent: Oct. 6, 2026

(54) SEMICONDUCTOR MEMORY DEVICE

(71) Applicant: SAMSUNG ELECTRONICS CO., LTD., Suwon-si (KR)

(72) Inventors: Sangsig Kim, Seoul (KR); Taeho Park, Seoul (KR); Jaemin Son, Seoul (KR); Yunwoo Shin, Seoul (KR); Juhee Jeon, Seoul (KR); Kyoungah Cho, Seoul (KR)

(73) Assignees: SAMSUNG ELECTRONICS CO., LTD., Suwon-si (KR); Korea University Research and Business Foundation, Seoul (KR)

( * ) Notice: Subject to any disclaimer, the term of this patent is extended or adjusted under 35 U.S.C. 154(b) by 338 days.

(21) Appl. No.: 18/636,876

(22) Filed: Apr. 16, 2024

(65) Prior Publication Data

US 2025/0089234 A1 Mar. 13, 2025

(30) Foreign Application Priority Data

Sep. 7, 2023 (KR) ........................ 10-2023-0119278

(51) Int. Cl.
*H10B 12/00* (2023.01)

(52) U.S. Cl.
CPC .................................... *H10B 12/20* (2023.02)

(58) Field of Classification Search
CPC ...... H10B 12/488; H10B 12/482; G11C 8/14; G11C 11/4097
See application file for complete search history.

(56) References Cited

U.S. PATENT DOCUMENTS

| | | | |
|---|---|---|---|
| 7,109,544 | B2 | 9/2006 | Schloesser et al. |
| 10,971,490 | B2 | 4/2021 | Zhou et al. |
| 2006/0273370 | A1 | 12/2006 | Forbes |
| 2017/0330623 | A1 | 11/2017 | Kim et al. |
| 2021/0225842 | A1 | 7/2021 | Kim et al. |

(Continued)

FOREIGN PATENT DOCUMENTS

| | | | |
|---|---|---|---|
| CN | 115443534 | A | 12/2022 |
| JP | 7251865 | B2 | 4/2023 |
| KR | 10-0613526 | B1 | 8/2006 |

OTHER PUBLICATIONS

Communication dated Sep. 17, 2024, issued by European Patent Center in European Patent Application No. 24166827.6.

*Primary Examiner* — Mohammad A Rahman
(74) *Attorney, Agent, or Firm* — Sughrue Mion, PLLC

(57) ABSTRACT

A semiconductor memory device is provided. The semiconductor device includes: a word line extending in a lateral direction; a sensing line apart from the word line, the sensing line overlapping the word line in a vertical direction and extending in the lateral direction; a vertical semiconductor structure passing through the word line and the sensing line in the vertical direction, the vertical semiconductor structure having a vertical channel region facing the word line in the lateral direction; and a gate dielectric film between the vertical channel region and the word line. The vertical semiconductor structure includes a first heavily doped film of a first conductivity type, a first lightly doped film of a second conductivity type, a second lightly doped film of the first conductivity type, and a second heavily doped film of the second conductivity type, which are sequentially provided in the vertical direction.

20 Claims, 57 Drawing Sheets

(56) References Cited

U.S. PATENT DOCUMENTS

| | | | | |
|---|---|---|---|---|
| 2022/0189952 | A1 | 6/2022 | Beigel et al. | |
| 2022/0189986 | A1* | 6/2022 | Ninomiya | H10B 43/27 |
| 2022/0367470 | A1 | 11/2022 | Harada et al. | |
| 2023/0008471 | A1 | 1/2023 | Harada et al. | |
| 2023/0070119 | A1 | 3/2023 | Lue et al. | |
| 2023/0106561 | A1 | 4/2023 | Hsu | |

* cited by examiner

Y1 - Y1'

Y1 - Y1'

Y1 - Y1'

Y1 - Y1'

Y1 - Y1'

SEMICONDUCTOR MEMORY DEVICE

CROSS-REFERENCE TO RELATED APPLICATION

This application claims priority to Korean Patent Application No. 10-2023-0119278, filed on Sep. 7, 2023, in the Korean Intellectual Property Office, the disclosure of which is incorporated herein by reference in its entirety.

BACKGROUND

The present disclosure relates to a semiconductor memory device, and more particularly, to a semiconductor memory device including a plurality of memory cells arranged three-dimensionally.

Due to recent developments in electronics technology, the downscaling of semiconductor devices has rapidly progressed. Accordingly, the miniaturization of memory cells is required, and current memory cells have limitations in maintaining high integration and reliability. Therefore, there is a need to develop a semiconductor memory device having a structure with smaller memory cells and increased integration density of memory cells.

SUMMARY

One or more embodiments provide a semiconductor memory device having a structure that facilitates downscaling of memory cells and increases the integration density of the memory cells.

According to an aspect of an embodiment, a semiconductor memory device includes: a word line extending in a lateral direction; a sensing line apart from the word line, the sensing line overlapping the word line in a vertical direction and extending in the lateral direction; a vertical semiconductor structure passing through the word line and the sensing line in the vertical direction, the vertical semiconductor structure having a vertical channel region facing the word line in the lateral direction; and a gate dielectric film between the vertical channel region and the word line. The vertical semiconductor structure includes a first heavily doped film of a first conductivity type, a first lightly doped film of a second conductivity type, a second lightly doped film of the first conductivity type, and a second heavily doped film of the second conductivity type, which are sequentially provided in the vertical direction. The vertical channel region includes the first lightly doped film or the second lightly doped film. The sensing line is in contact with the first heavily doped film of the vertical semiconductor structure.

According to another aspect of an embodiment, a semiconductor memory device including a memory cell string including a plurality of memory cells arranged in a line in a vertical direction. Each of the plurality of memory cells includes: a word line extending in a lateral direction; a sensing line apart from the word line, the sensing line overlapping the word line in the vertical direction and extending in the lateral direction; a vertical semiconductor structure passing through the word line and the sensing line in the vertical direction, the vertical semiconductor structure having a vertical channel region facing the word line in the lateral direction; and a gate dielectric film between the vertical channel region and the word line. In each of the plurality of memory cells, the vertical semiconductor structure includes a first heavily doped film of a first conductivity type, a first lightly doped film of a second conductivity type, a second lightly doped film of the first conductivity type, and a second heavily doped film of the second conductivity type, which are sequentially provided in the vertical direction. The vertical channel region includes the first lightly doped film or the second lightly doped film in each of the plurality of memory cells. The sensing line is in contact with the first heavily doped film of the vertical semiconductor structure in each of the plurality of memory cells.

According to another aspect an embodiment, a semiconductor memory device including a memory cell array including a plurality of memory cells three-dimensionally and repeatedly arranged on a substrate in a first lateral direction, a second lateral direction, and a vertical direction, wherein the first lateral direction crosses the second lateral direction, and the vertical direction is perpendicular to each of the first lateral direction and the second lateral direction. The memory cell array includes: a plurality of sensing lines and a plurality of word lines alternately arranged, one-by-one, in the vertical direction, the plurality of sensing lines and the plurality of word lines being apart from each other in the vertical direction; a plurality of insulating films respectively between the plurality of sensing lines and the plurality of word lines; a stack structure passing through the plurality of sensing lines, the plurality of word lines, and the plurality of insulating films in the vertical direction, the stack structure including a plurality of vertical semiconductor structures overlapping each other in the vertical direction, each of the plurality of vertical semiconductor structures having a vertical channel region; an insulating pillar passing through the plurality of vertical semiconductor structures in the vertical direction; a plurality of gate dielectric films between respective vertical channel regions of the plurality of vertical semiconductor structures and the plurality of word lines; and a plurality of bit lines passing through the plurality of insulating films. From among the plurality of memory cells, memory cells arranged in a line in the vertical direction share a selected one of the plurality of bit lines. Each of the plurality of vertical semiconductor structures includes a first heavily doped film of a first conductivity type, a first lightly doped film of a second conductivity type, a second lightly doped film of the first conductivity type, and a second heavily doped film of the second conductivity type, which are sequentially provided in the vertical direction. The vertical channel region of each of the plurality of vertical semiconductor structures includes the first lightly doped film or the second lightly doped film.

BRIEF DESCRIPTION OF DRAWINGS

The above and other aspects and features will be more apparent from the following description of embodiments, taken in conjunction with the accompanying drawings, in which:

FIG. 3C is an enlarged cross-sectional view of a portion "EX3" of FIG. 3A;

FIG. 3D is an enlarged cross-sectional view of a portion "EX4" of FIG. 3B;

FIGS. 13A to 33B are diagrams of a method of manufacturing a semiconductor memory device, according to embodiments, wherein FIGS. 13A, 14A, 15A, 16, 17, 18A, 19A, 20, 21, 22A, 24A, 25A, 26A, 27A, 29, 30, 32A, and 33A are cross-sectional views, according to a process sequence, of a portion corresponding to a cross-section taken along line X1-X1' of FIG. 1, FIGS. 13B, 14B, 15B, 18B, 19B, 22B, 23, 24B, 25B, 26B, 27B, 28, 31, 32B, and 33B are cross-sectional views, according to a process sequence, of a portion corresponding to a cross-section taken along line Y1-Y1' of FIG. 1.

DETAILED DESCRIPTION

Figure 1:
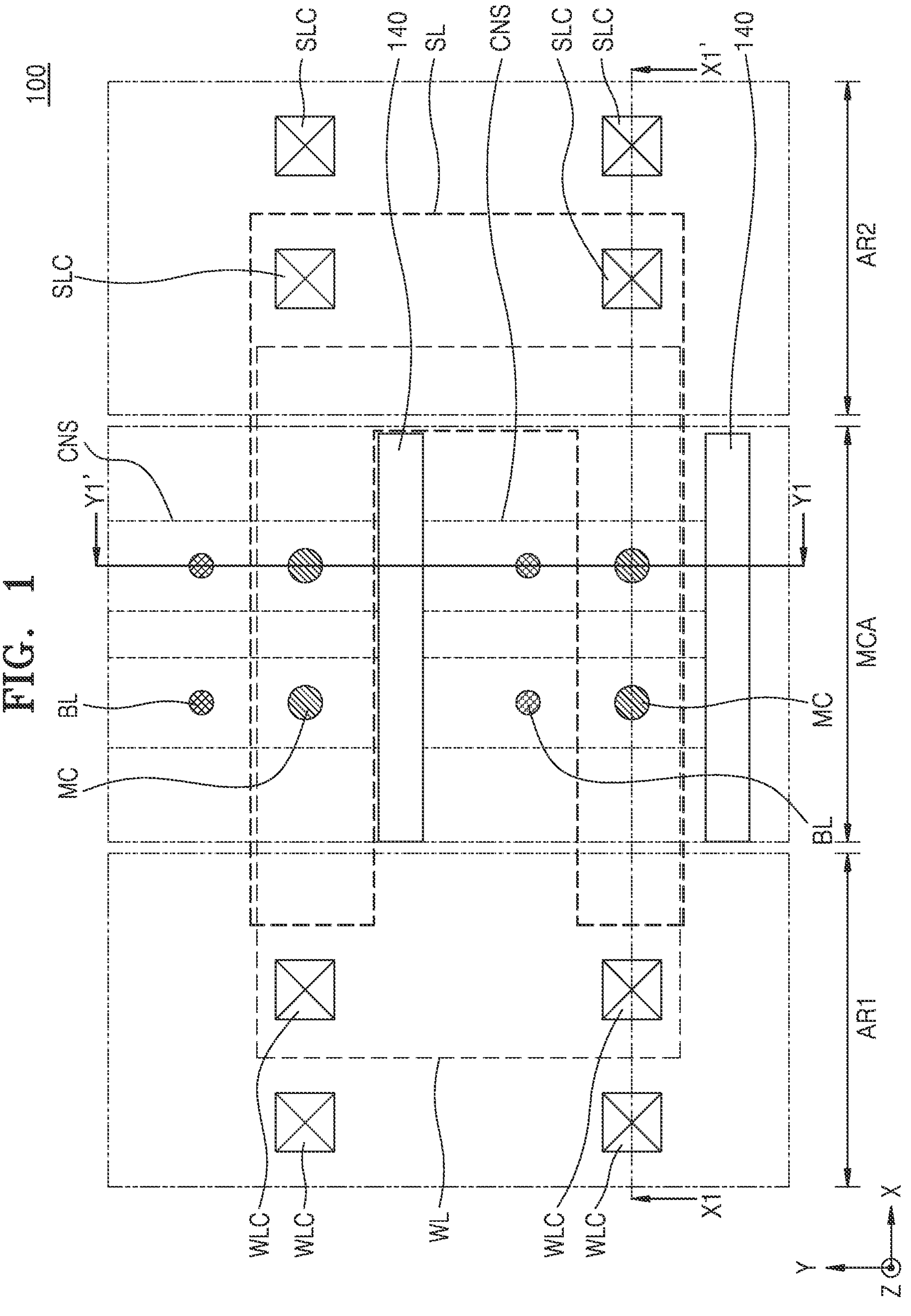
FIG. 1 is a plan layout diagram of some regions of a semiconductor memory device according to embodiments.

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. The same reference numerals are used to denote the same elements in the drawings, and repeated descriptions thereof will be omitted.

Figure 2A:
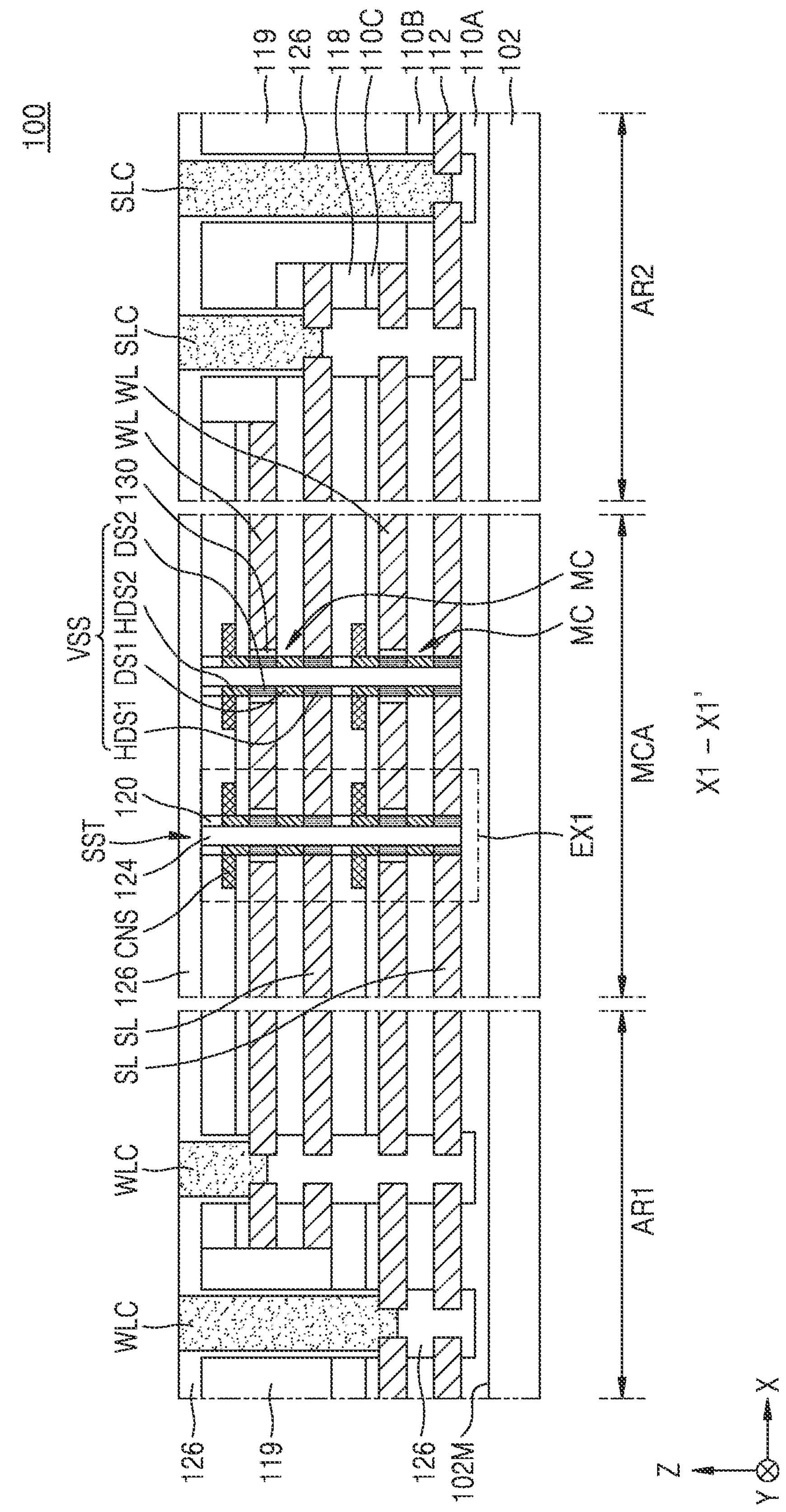
FIG. 2A is a cross-sectional view taken along line X1-X1' of FIG. 1.
Figure 2B:
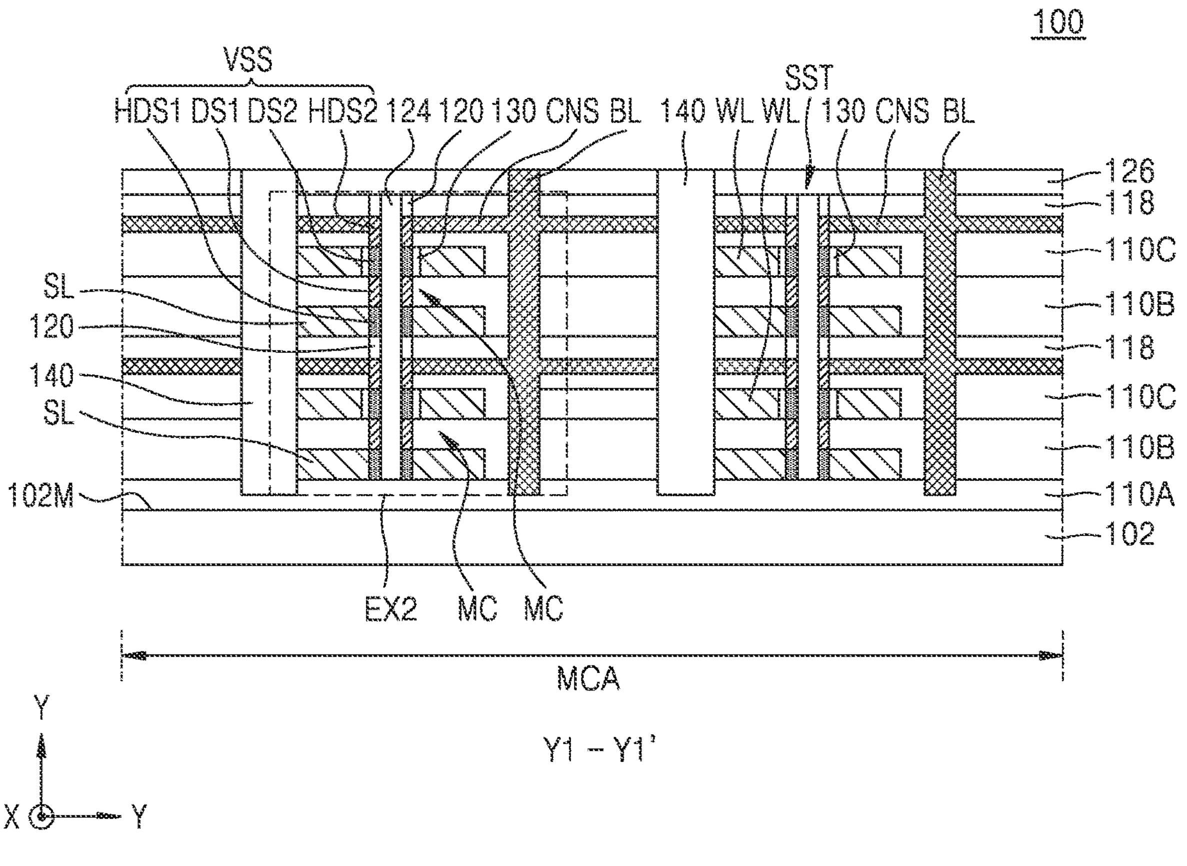
FIG. 2B is a cross-sectional view taken along line Y1-Y1' of FIG. 1.
Figure 2C:
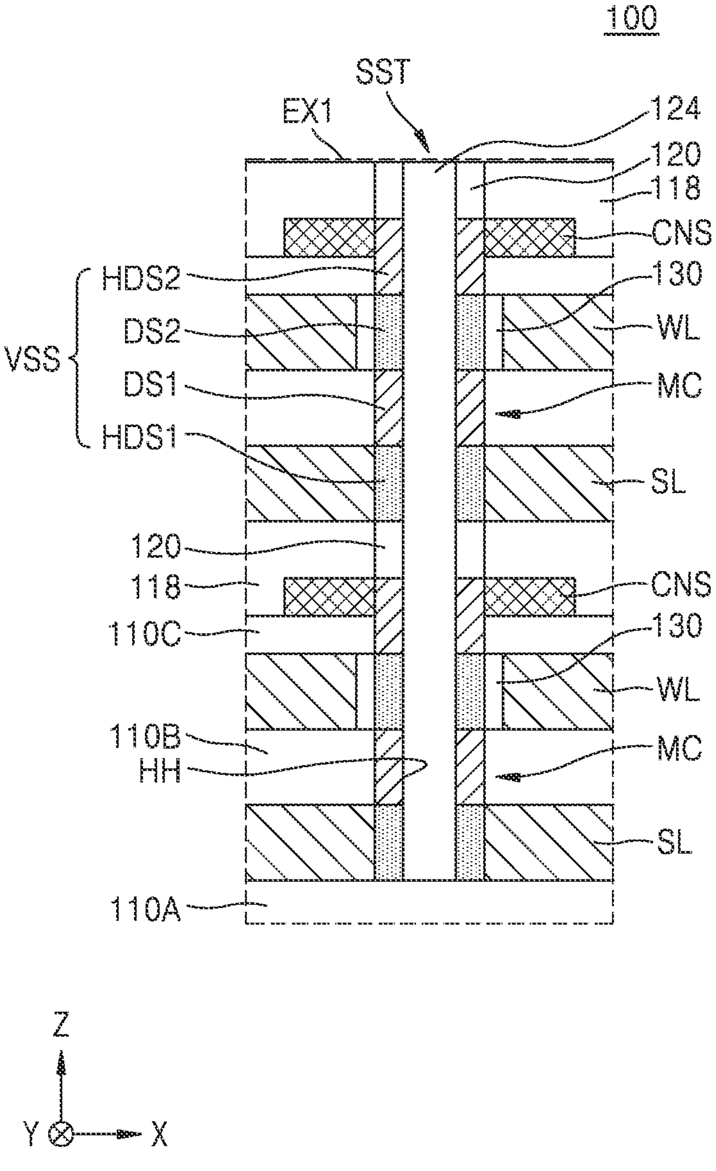
FIG. 2C is an enlarged cross-sectional view of a portion "EX1" of FIG. 2A.
Figure 2D:
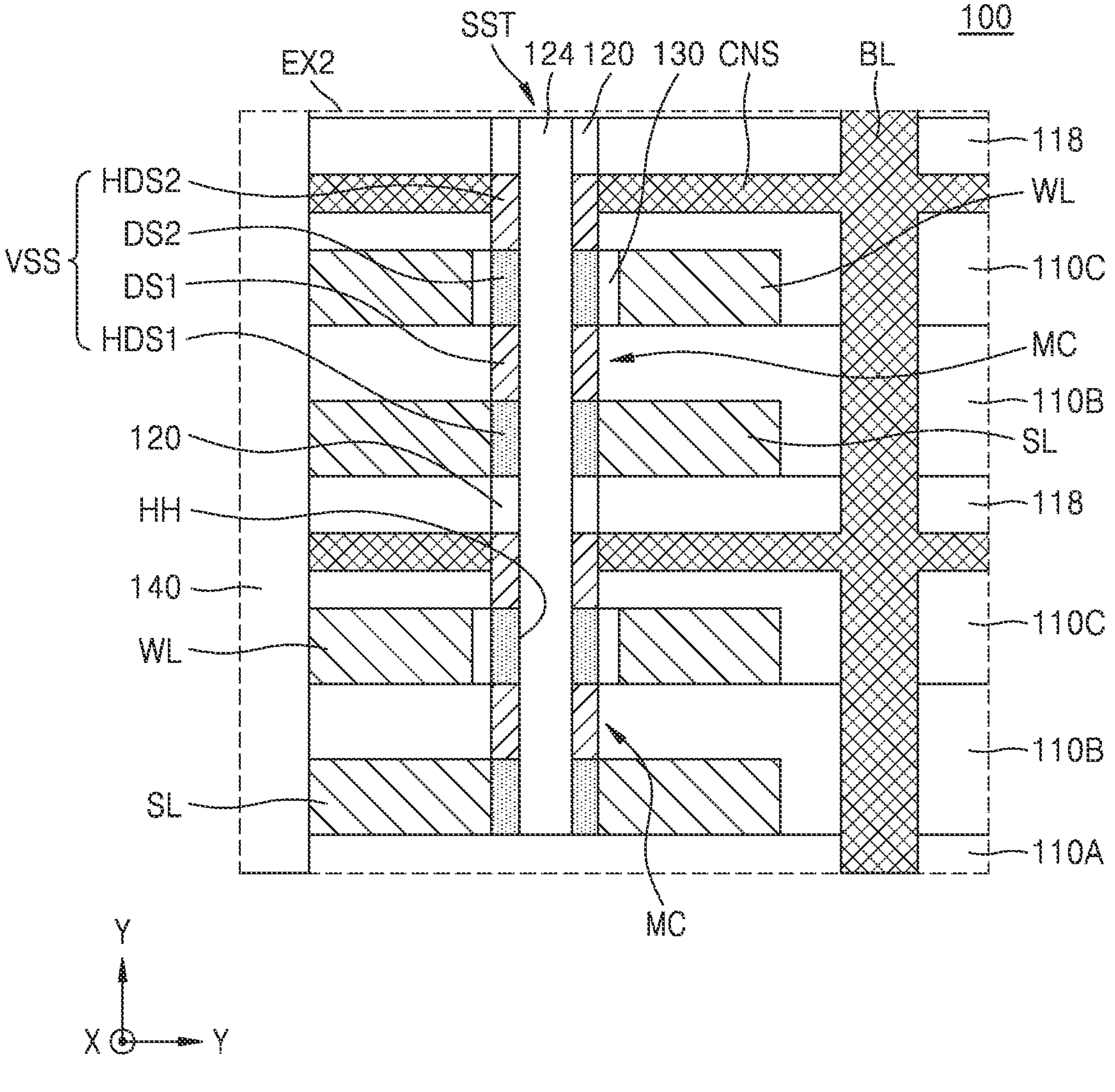
FIG. 2D is an enlarged cross-sectional view of a portion "EX2" of FIG. 2B.

FIGS. 1 and 2A to 2D are diagrams of a semiconductor memory device 100 according to embodiments. FIG. 1 is a plan layout diagram of some regions of the semiconductor memory device 100. FIG. 2A is a cross-sectional view taken along line X1-X1' of FIG. 1. FIG. 2B is a cross-sectional view taken along line Y1-Y1' of FIG. 1. FIG. 2C is an enlarged cross-sectional view of a portion "EX1" of FIG. 2A. FIG. 2D is an enlarged cross-sectional view of a portion "EX2" of FIG. 2B.

Referring to FIGS. 1 and 2A to 2D, the semiconductor memory device 100 may include a substrate 102, a memory cell array unit MCA on the substrate 102, and a first connection unit AR1 and a second connection unit AR2, which are on the substrate 102 and apart from each other in a first lateral direction (X direction) with the memory cell array unit MCA therebetween.

The memory cell array unit MCA may include a plurality of memory cells MC, which are three-dimensionally and repeatedly arranged in the first lateral direction (X direction) and a second lateral direction (Y direction), which cross each other, and may be perpendicular to each other, and a vertical direction (Z direction), which is perpendicular to each of the first lateral direction (X direction) and the second lateral direction (Y direction).

The substrate 102 may include a semiconductor substrate including silicon (Si), germanium (Ge), or SiGe.

The memory cell array unit MCA may include a plurality of sensing lines SL and a plurality of word lines WL, which are alternately arranged one-by-one in the vertical direction (Z direction) and apart from each other in the vertical direction (Z direction). A selected one of a plurality of insulating films 110A, 110B, and 110C may be between a lowermost one of the plurality of sensing lines SL and the substrate 102 and between each of the plurality of sensing lines SL and each of the plurality of word lines WL.

A plurality of stack structures SST, each of which includes a plurality of vertical semiconductor structures VSS overlapping each other in the vertical direction (Z direction), may be in the memory cell array unit MCA. Each of the plurality of vertical semiconductor structures VSS may pass through the word line WL, the sensing line SL, and the plurality of insulating films 110A, 110B, and 110C in the vertical direction (Z direction).

Each of the plurality of word lines WL and the plurality of sensing lines SL may be planar and extend in a lateral direction (or a direction along an X-Y plane) parallel to a main surface 102M of the substrate 102. The plurality of word lines WL and the plurality of sensing lines SL may overlap each other in the vertical direction (Z direction).

The plurality of word lines WL and the plurality of sensing lines SL may each include tungsten (W), aluminum (Al), molybdenum (Mo), ruthenium (Ru), aluminum (Al), cobalt (Co), titanium (Ti), titanium nitride (TiN), tantalum (Ta), tantalum nitride (TaN), tungsten nitride (WN), titanium silicon nitride (TiSiN), tungsten silicon nitride (WSiN), doped polysilicon, or a combination thereof, without being limited thereto. Each of the plurality of insulating films (e.g., 110A, 110B, and 110C) may include a silicon oxide film, without being limited thereto.

Each of the plurality of vertical semiconductor structures VSS may include a first heavily doped film HDS1, a first lightly doped film DS1, a second lightly doped film DS2, and a second heavily doped film HDS2, which are sequentially stacked from a portion of the vertical semiconductor structure VSS, which is closest to the substrate 102, in the vertical direction (Z direction). In each of the plurality of vertical semiconductor structures VSS, the first heavily doped film HDS1 and the second lightly doped film DS2 may be of a first conductivity type, and the first lightly doped film DS1 and the second heavily doped film HDS2 may be of a second conductivity type, which is opposite to the first conductivity type. As used herein, the terms "heavily doped" and "lightly doped" are relative terms. A heavily doped film refers to a film having a higher dopant concentration than a lightly doped film, and the lightly doped film refers to a film having a lower dopant concentration than the heavily doped film.

In embodiments, in each of the plurality of vertical semiconductor structures VSS, the first heavily doped film HDS1, the first lightly doped film DS1, the second lightly doped film DS2, and the second heavily doped film HDS2 may each include a doped silicon (Si) film, and a dopant concentration of each of the first heavily doped film HDS1 and the second heavily doped film HDS2 may be higher than a dopant concentration of each of the first lightly doped film DS1 and the second lightly doped film DS2. For example, the first heavily doped film HDS1 and the second lightly doped film DS2 may each include a polysilicon film doped with n-type impurities, and a dopant concentration of n-type impurities in the first heavily doped film HDS1 may be higher than a dopant concentration of n-type impurities in the second lightly doped film DS2. In addition, the first lightly doped film DS1 and the second heavily doped film HDS2 may each include a polysilicon film doped with p-type impurities, and a dopant concentration of p-type impurities in the second heavily doped film HDS2 may be higher than a dopant concentration of p-type impurities in the first lightly doped film DS1. In embodiments, the n-type impurities may be selected from phosphorus (P), arsenic (As), and antimony (Sb), and the p-type impurities may be selected from boron (B) and gallium (Ga).

In an example, each of a dopant concentration of n-type impurities in the first heavily doped film HDS1 and a dopant concentration of p-type impurities in the second heavily doped film HDS2 may be selected in a range of about $1\times10^{19}$ atoms/$cm^3$ to about $9\times10^{20}$ atoms/$cm^3$, and each of a dopant concentration of p-type impurities in the first lightly doped film DS1 and a dopant concentration of n-type impurities in the second lightly doped film DS2 may be selected in a range of about $1\times10^{17}$ atoms/$cm^3$ to about $9\times10^{18}$ atoms/$cm^3$, without being limited thereto.

Each of the plurality of vertical semiconductor structures VSS may include a vertical channel region, and the vertical channel region may include any one selected from the first lightly doped film DS1 and the second lightly doped film DS2. FIGS. 2A to 2D illustrate a structure in which the vertical channel region includes the second lightly doped film DS2 in each of the plurality of vertical semiconductor structures VSS. In each of the plurality of vertical semiconductor structures VSS, the second lightly doped film DS2 used as the vertical channel region may face the word line WL in a lateral direction (or a direction along an X-Y plane), which is parallel to the main surface 102M of the substrate 102. The plurality of sensing lines SL may be respectively in contact with the first heavily doped films HDS1 of the plurality of vertical semiconductor structures VSS.

In other embodiments, differently from those shown in FIGS. 2A to 2D, in each of the plurality of vertical semiconductor structures VSS, the vertical channel region may include the first lightly doped film DS1. In this case, each of the plurality of word lines WL may face the first lightly doped film DS1 of the vertical semiconductor structure VSS.

A gate dielectric film 130 may be between the vertical channel region (refer to the second lightly doped film DS2 in FIGS. 2A to 2D) of each of the plurality of vertical semiconductor structures VSS and the word line WL adjacent to the vertical channel region. In embodiments, the gate dielectric film 130 may include a paraelectric material. For example, the gate dielectric film 130 may include silicon oxide, silicon nitride, silicon oxynitride, or a combination thereof. In other embodiments, the gate dielectric film 130 may include a high-k dielectric material. The high-k dielectric material may have a dielectric constant of about 10 to about 25. For example, the high-k dielectric material may include hafnium oxide, aluminum oxide, zirconium oxide, or a combination thereof, without being limited thereto. In still other embodiments, the gate dielectric film 130 may include a combination of a paraelectric material and a high-k dielectric material.

The semiconductor memory device 100 may include an insulating pillar 124, which, in the vertical direction (Z direction), passes through the plurality of vertical semiconductor structures VSS that are arranged to overlap each other in the vertical direction (Z direction). In each of the plurality of vertical semiconductor structures VSS, the first heavily doped film HDS1, the first lightly doped film DS1, the second lightly doped film DS2, and the second heavily doped film HDS2 may have a hollow HH that accommodates the insulating pillar 124. Each of the plurality of vertical semiconductor structures VSS may have a pipe shape surrounding the insulating pillar 124 and have a ring shape in a view from above (on an X-Y plane).

As shown in FIGS. 2B and 2D, the semiconductor memory device 100 may include a plurality of bit lines BL, which pass through the plurality of insulating films 110B and 110C in the vertical direction (Z direction). The plurality of bit lines BL may be apart from the plurality of word lines WL and the plurality of sensing lines SL in the second lateral direction (Y direction). Each of the plurality of bit lines BL may be connected to the second heavily doped film HDS2 included in the vertical semiconductor structure VSS through a conductive connection structure CNS. The conductive connection structure CNS may be in contact with and surround the second heavily doped film HDS2 included in the vertical semiconductor structure VSS. The plurality of bit lines BL and a plurality of conductive connection structures CNS connected to the plurality of bit lines BL may each include W, Al, Mo, Ru, Al, Co, Ti, TiN, Ta, TaN, WN, TiSiN, WSiN, doped polysilicon, or a combination thereof, without being limited thereto.

Each of the plurality of bit lines BL may extend long in the vertical direction (Z direction) and face the vertical semiconductor structure VSS in the second lateral direction (Y direction) with the plurality of word lines WL and the plurality of sensing lines SL therebetween. In the semiconductor memory device 100, the plurality of memory cells MC arranged in a line in the vertical direction (Z direction) may constitute one memory cell string. The plurality of memory cells MC included in the one memory cell string may share a selected one of the plurality of bit lines BL.

The semiconductor memory device 100 may include a plurality of inter-cell insulating films 118 and a plurality of inter-cell local insulating films 120. Each of the plurality of inter-cell insulating films 118 may be between two adjacent ones of the plurality of memory cells MC that are arranged in a line in the vertical direction (Z direction). The plurality of inter-cell local insulating films 120 may be between the insulating pillar 124 and the inter-cell insulating film 118 and surround the insulating pillar 124. The inter-cell insulating film 118 and the inter-cell local insulating film 120 may constitute an inter-cell insulating structure between two memory cells MC, which are adjacent to each other in the vertical direction (Z direction), to separate the two memory cells MC from each other.

In the memory cell array unit MCA, a portion of a buried insulating film 126 may cover the plurality of memory cells MC, a plurality of insulating pillars 124, an uppermost one of the inter-cell insulating films 118, and the plurality of inter-cell local insulating films 120. As shown in FIG. 2A, in the first connection unit AR1 and the second connection unit AR2, another portion of the buried insulating film 126 may be in contact with an end portion of each of the plurality of word lines WL and the plurality of sensing lines SL in the first lateral direction (X direction).

As shown in FIGS. 1 and 2B, the semiconductor memory device 100 may include a plurality of isolation insulating films 140. Each of the plurality of isolation insulating films 140 may have a bar-shaped planar shape extending long in the first lateral direction (X direction) in the memory cell array unit MCA. Each of the plurality of isolation insulating films 140 may be between two adjacent ones of a plurality of memory cell strings that are arranged in a line in the second lateral direction (Y direction). The plurality of isolation insulating films 140 may pass through the plurality of insulating films 110A, 110B, and 110C, the plurality of inter-cell insulating films 118, and the buried insulating film 126 in the vertical direction (Z direction). Each of the plurality of isolation insulating films 140 may be in contact with the plurality of word lines WL and the plurality of sensing lines SL included in one memory cell string that is adjacent to the isolation insulating film 140 on one side of the second lateral direction (Y direction).

The plurality of insulating pillars 124, the plurality of inter-cell insulating films 118, the plurality of inter-cell local insulating films 120, the buried insulating film 126, and the plurality of isolation insulating films 140 may each include a silicon oxide film, without being limited thereto.

As shown in FIG. 2A, in the first connection unit AR1 and the second connection unit AR2, the plurality of word lines WL and the plurality of sensing lines SL may extend in varying lengths in the first lateral direction (X direction). Accordingly, in the first connection unit AR1 and the second connection unit AR2, a plurality of step units including the plurality of word lines WL and the plurality of sensing lines SL may be formed. In the first connection unit AR1 and the second connection unit AR2, spaces defined by the plurality of step units may be filled by a mold insulating film 119. The mold insulating film 119 may include a silicon oxide film.

A plurality of word line contacts WLC may be in the first connection unit AR1. Each of the plurality of word line contacts WLC may be apart from the vertical semiconductor structure VSS of the memory cell MC in the first lateral direction (X direction) and connected to a selected one of the plurality of word lines WL.

A plurality of sensing line contacts SLC may be in the second connection unit AR2. Each of the plurality of sensing line contacts SLC may be apart from the vertical semiconductor structure VSS of the memory cell MC in the first lateral direction (X direction) and connected to a selected one of the plurality of sensing lines SL.

The plurality of word line contacts WLC and the plurality of sensing line contacts SLC may each pass through an insulating structure including the buried insulating film 126 and the mold insulating film 119 in the vertical direction (Z direction). The plurality of word line contacts WLC and the plurality of sensing line contacts SLC may each include W, Al, Mo, Ru, Al, Co, Ti, TiN, Ta, TaN, WN, TiSN, WSiN, doped polysilicon, or a combination thereof, without being limited thereto.

A related DRAM device may have a structure (i.e., a 1T-1C structure) in which one memory cell includes one transistor and one capacitor. As related DRAM devices become more highly integrated, an aspect of a capacitor may increase, which may cause a leakage current to increase. The increase in the leakage current may affect data reliability. Thus, the capacitor may become an obstacle to downscaling using vertical stack structures.

Feedback field-effect transistor (FBFET)-based memory devices may have a low operating voltage and a sharp subthreshold swing (SS) of less than 60 mV/decade by using a positive feedback loop. Unlike related DRAM devices, the FBFET-based memory devices have the advantage of low power consumption because a refresh operation is not required. In addition, an FBFET-based semiconductor memory device may have a wide current sensing margin due to a high on-off current ratio and have the advantage of ensuring compatibility with a current process of manufacturing a complementary metal-oxide-semiconductor (CMOS) transistor.

In the plurality of vertical semiconductor structures VSS included in the semiconductor memory device 100 according to embodiments, the first heavily doped film HDS1 may include an $n^+$ doping region doped with an n-type dopant, the first lightly doped film DS1 may include a p doping region doped with a p-type dopant, the second lightly doped film DS2 may include an n doping region doped with an n-type dopant, and the second heavily doped film HDS2 may include a $p^+$ doping region doped with a p-type dopant. The n-type dopant may be selected from P, As, and Sb. The p-type dopant may be selected from B and Ga.

In embodiments, in each of the plurality of vertical semiconductor structures VSS, the second lightly doped film DS2 including the n doping region may be used as the vertical channel region. In this case, the word line WL may face the second lightly doped film DS2 including the n doping region in a lateral direction with the gate dielectric film 130 therebetween. The memory cell MC may constitute a p-FBFET-based DRAM cell, which does not include a capacitor but includes one transistor.

In other embodiments, in each of the plurality of vertical semiconductor structures VSS, the first lightly doped film DS1 including the p doping region may be used as the vertical channel region. In this case, the word line WL may face the first lightly doped film DS1 including the p doping region in a lateral direction with the gate dielectric film 130 therebetween. The memory cell MC may constitute an n-FBFET-based DRAM cell, which does not include a capacitor but includes one transistor.

As described above, the semiconductor memory device 100 according to embodiments may be implemented as the p-FBFET-based DRAM cell or the n-FBFET-based DRAM cell and be compatible with a current process of manufacturing a CMOS transistor. Also, by using an FBFET-based memory cell, which does not need a capacitor, as a DRAM cell having one transistor, a structure advantageous for high integration may be provided.

In addition, because each of the plurality of memory cells MC includes one transistor and does not include a capacitor, the semiconductor memory device 100 according to embodiments may be miniaturized to provide a high-density, compact three-dimensional (3D) array structure. Furthermore, in the semiconductor memory device 100 according to embodiments, the plurality of memory cells MC, which overlap each other in the vertical direction (Z direction) may include a 3D stack-type memory cell array that shares one bit line BL. Therefore, the semiconductor memory device 100 according to embodiments may overcome problems caused by the density limits of bit lines, which have been encountered in semiconductor memory devices having two-dimensional (2D) structures, provide a structure that is advantageous for high integration of semiconductor memory devices, and provide excellent competitiveness in various aspects including performance, power, chip area, and cost.

Figure 3A:
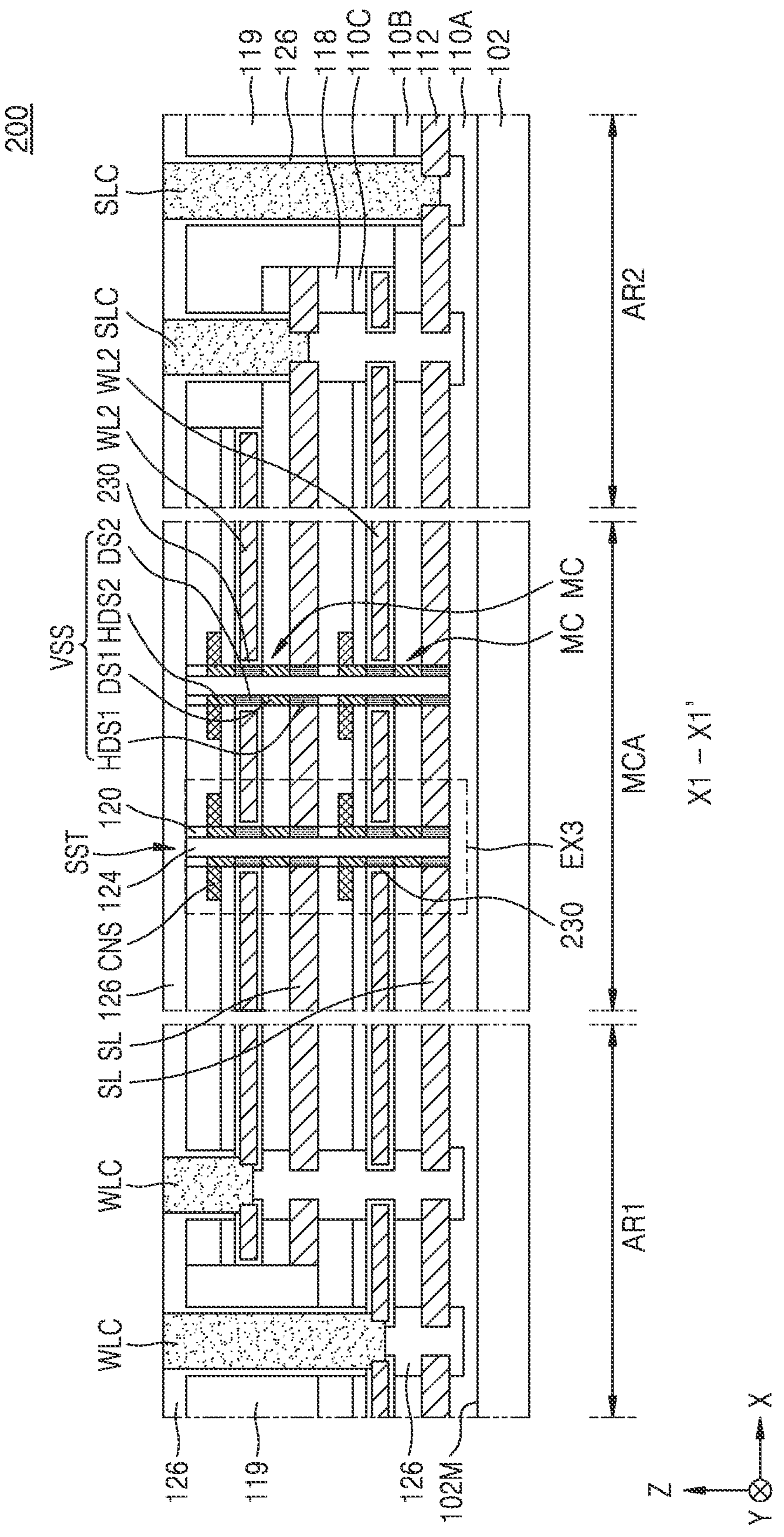
FIGS. 3A, 3B, 3C and 3D are cross-sectional views of a semiconductor memory device according to embodiments.
Figure 3B:
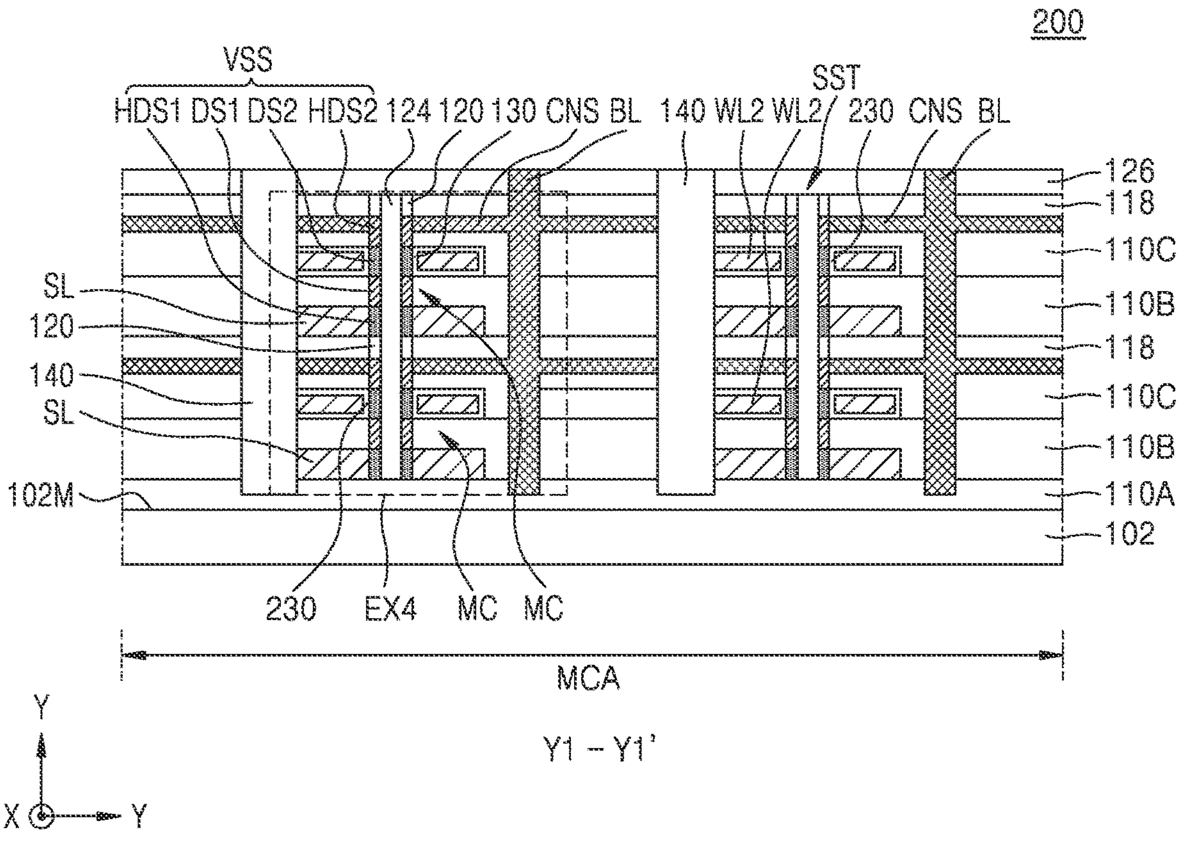
Figure 3C:
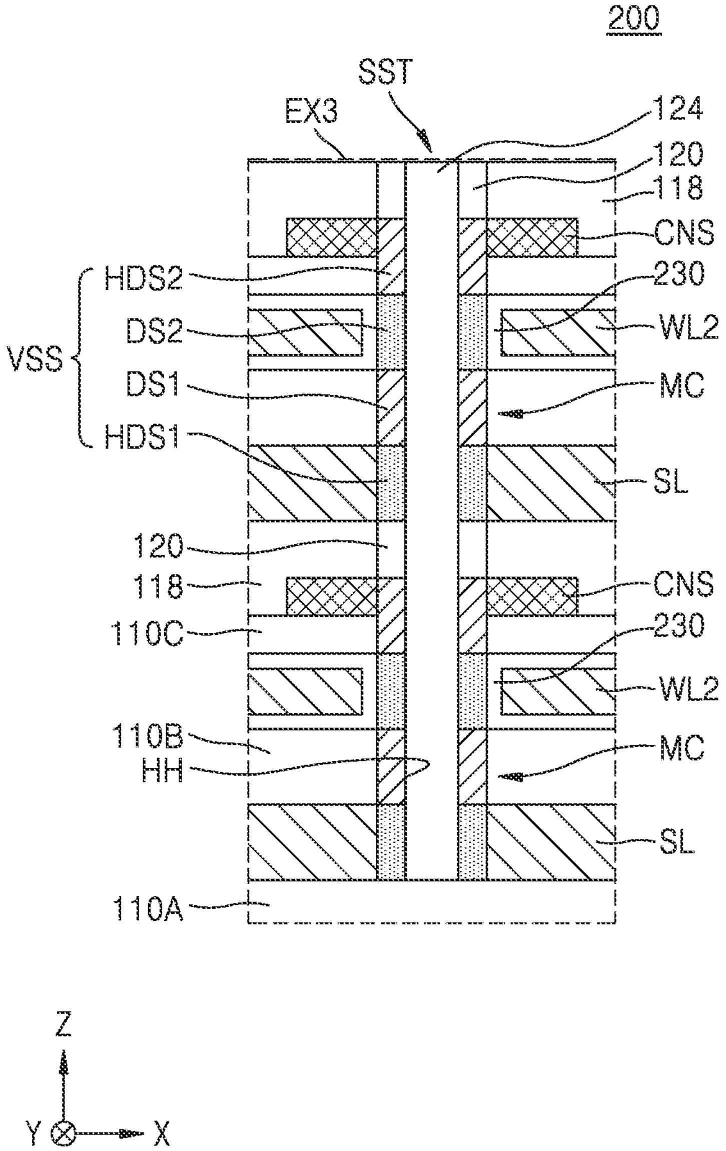
Figure 3D:
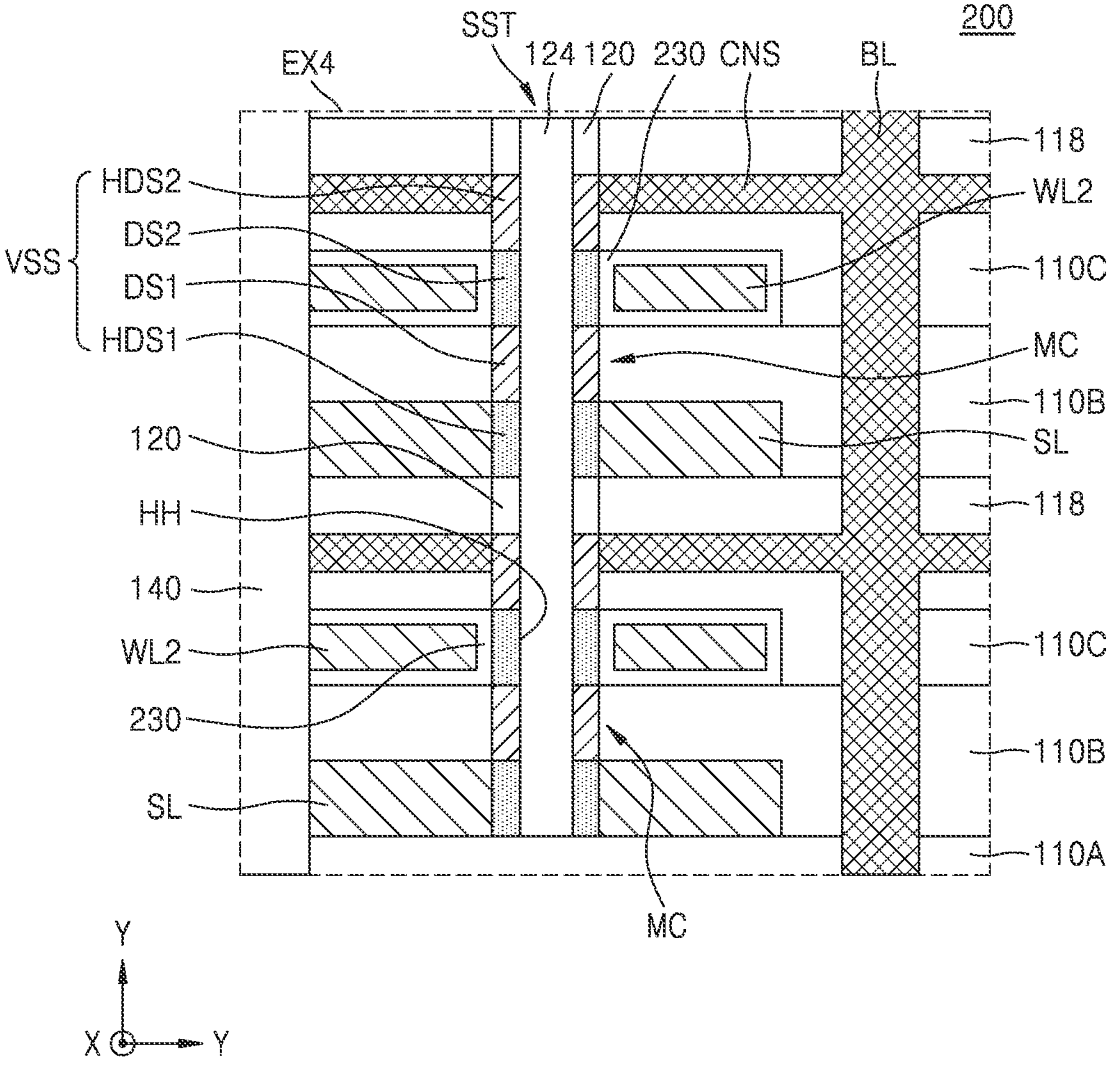

FIGS. 3A to 3D are diagrams of a semiconductor memory device 200 according to embodiments. Specifically, FIG. 3A is a cross-sectional view of a portion corresponding to a cross-section taken along line X1-X1' of FIG. 1. FIG. 3B is a cross-sectional view of a portion corresponding to a cross-section taken along line Y1-Y1' of FIG. 1. FIG. 3C is an enlarged cross-sectional view of a portion "EX3" of FIG. 3A. FIG. 3D is an enlarged cross-sectional view of a portion "EX4" of FIG. 3B. The semiconductor memory device 200 may substantially have the same plan layout as the plan layout shown in FIG. 1. In FIGS. 3A to 3D, the same reference numerals are used to denote the same reference elements as in FIGS. 1 and 2A to 2D, and detailed descriptions thereof are omitted here.

Referring to FIGS. 3A to 3D, the semiconductor memory device 300 may substantially have the same configuration as the semiconductor memory device 100 described with reference to FIGS. 1 and 2A to 2D. However, the semiconductor memory device 200 may include a plurality of word lines WL2 instead of the plurality of word lines WL shown in FIGS. 2A to 2D, and include a gate dielectric film 230 instead of the gate dielectric film 130 shown in FIGS. 2A to 2D.

The plurality of word lines WL2 and the gate dielectric film 230 may substantially have the same configurations as the plurality of word lines WL and the gate dielectric film 130, which have been described with reference to FIGS. 1 and 2A to 2D. However, of each of the plurality of word lines WL2, a sidewall facing the second lightly doped film DS2 included in the vertical semiconductor structure VSS, a bottom surface facing the insulating film 110B, and a top surface facing the insulating film 110C may be each covered by the gate dielectric film 230. As shown in FIG. 3A, in the first connection unit AR1, each of the plurality of word line contacts WLC may pass through the gate dielectric film 230 and be connected to a selected one of the plurality of word lines WL.

Figure 4:
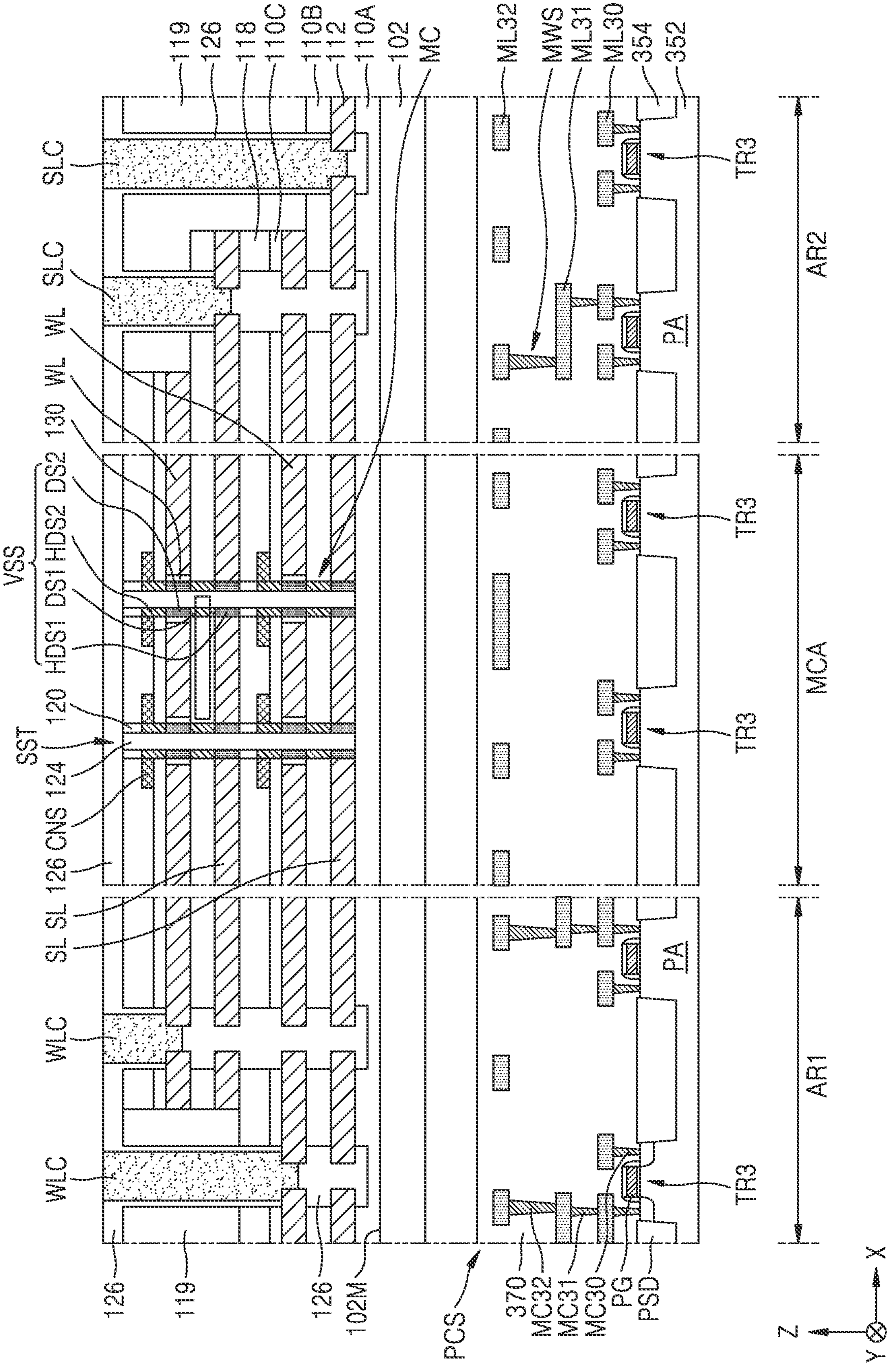
FIG. 4 is a cross-sectional view of a semiconductor memory device according to embodiments.

FIG. 4 is a cross-sectional view of a semiconductor memory device 300 according to embodiments. FIG. 4 illustrates a cross-sectional configuration of a portion corresponding to a cross-section taken along line X1-X1' of FIG. 1. In FIG. 4, the same reference numerals are used to denote the same reference elements as in FIGS. 1 and 2A to 2D, and detailed descriptions thereof are omitted here.

Referring to FIG. 4, the semiconductor memory device 300 may substantially have the same configuration as the semiconductor memory device 100 described with reference to FIGS. 1 and 2A to 2D. However, the semiconductor memory device 300 may include a peripheral circuit structure PCS, which overlaps a memory cell array unit MCA, a first connection unit AR1, and a second connection unit AR2 in a vertical direction (Z direction).

The peripheral circuit structure PCS may include a plurality of peripheral circuits and a multilayered wiring structure MWS. The plurality of peripheral circuits may be formed on the peripheral circuit substrate 352. The multilayered wiring structure MWS may connect the plurality of peripheral circuits to each other or connect the plurality of peripheral circuits to conductive elements located in the memory cell array unit MCA, the first connection unit AR1, and the second connection unit AR2.

An active region PA may be defined by a device isolation film 354 in the peripheral circuit substrate 352. Details of the peripheral circuit substrate 352 may substantially be the same as those of a substrate 102 described with reference to FIGS. 2A and 2B. A plurality of transistors TR3 may be formed on the active region PA of the peripheral circuit substrate 352. Each of the plurality of transistors TR3 may include a peripheral gate PG and peripheral source/drain regions PSD formed in the active region PA on both sides of the peripheral gate PG. In embodiments, the peripheral circuit structure PCS may further include unit devices, such as resistors and capacitors. An interlayer insulating film 370 may be formed on the plurality of transistors TR3. The interlayer insulating film 370 may include a silicon oxide film, a silicon nitride film, a silicon oxynitride (SiON) film, a silicon oxycarbonitride (SiOCN) film, or a combination thereof.

In the peripheral circuit structure PCS, the multilayered wiring structure MWS may include a plurality of peripheral circuit layers ML30, ML31, and ML32 and a plurality of peripheral circuit contacts MC30, MC31, and MC32. Some of the plurality of peripheral circuit layers ML30, ML31, and ML32 may be electrically connected to the plurality of transistors TR3. The plurality of peripheral circuit contacts MC30, MC31, and MC32 may be configured to connect some peripheral circuit layers selected from the plurality of peripheral circuit layers ML30, ML31, and ML32 to each other. The plurality of peripheral circuit layers ML30, ML31, and ML32 and the plurality of peripheral circuit contacts MC30, MC31, and MC32 may be covered by the interlayer insulating film 370.

The plurality of peripheral circuit layers ML30, ML31, and ML32 and the plurality of peripheral circuit contacts MC30, MC31, and MC32 may each include a metal, a conductive metal nitride, a metal silicide, or a combination thereof. For example, the plurality of peripheral circuit layers ML30, ML31, and ML32 and the plurality of peripheral circuit contacts MC30, MC31, and MC32 may each include a conductive material, such as tungsten, molybdenum, titanium, cobalt, tantalum, nickel, tungsten silicide, titanium silicide, cobalt silicide, tantalum silicide, and nickel silicide. FIG. 4 illustrates an example in which the plurality of peripheral circuit layers ML30, ML31, and ML32 have a triple wiring structure in the vertical direction (Z direction), but embodiments are not limited to those illustrated in FIG. 4. For example, the plurality of peripheral circuit layers ML30, ML31, ML32 may have a multilayered wiring structure of two layers or at least four layers.

In embodiments, a plurality of word line contacts WLC in the first connection unit AR1, a plurality of sensing line contacts SLC in the second connection unit AR2, and a plurality of bit lines (refer to BL in FIG. 2B) in the memory cell array unit MCA may be each connected to a selected one of the plurality of peripheral circuit layers ML30, ML31, and ML32 included in the peripheral circuit structure PCS.

Figure 5A:
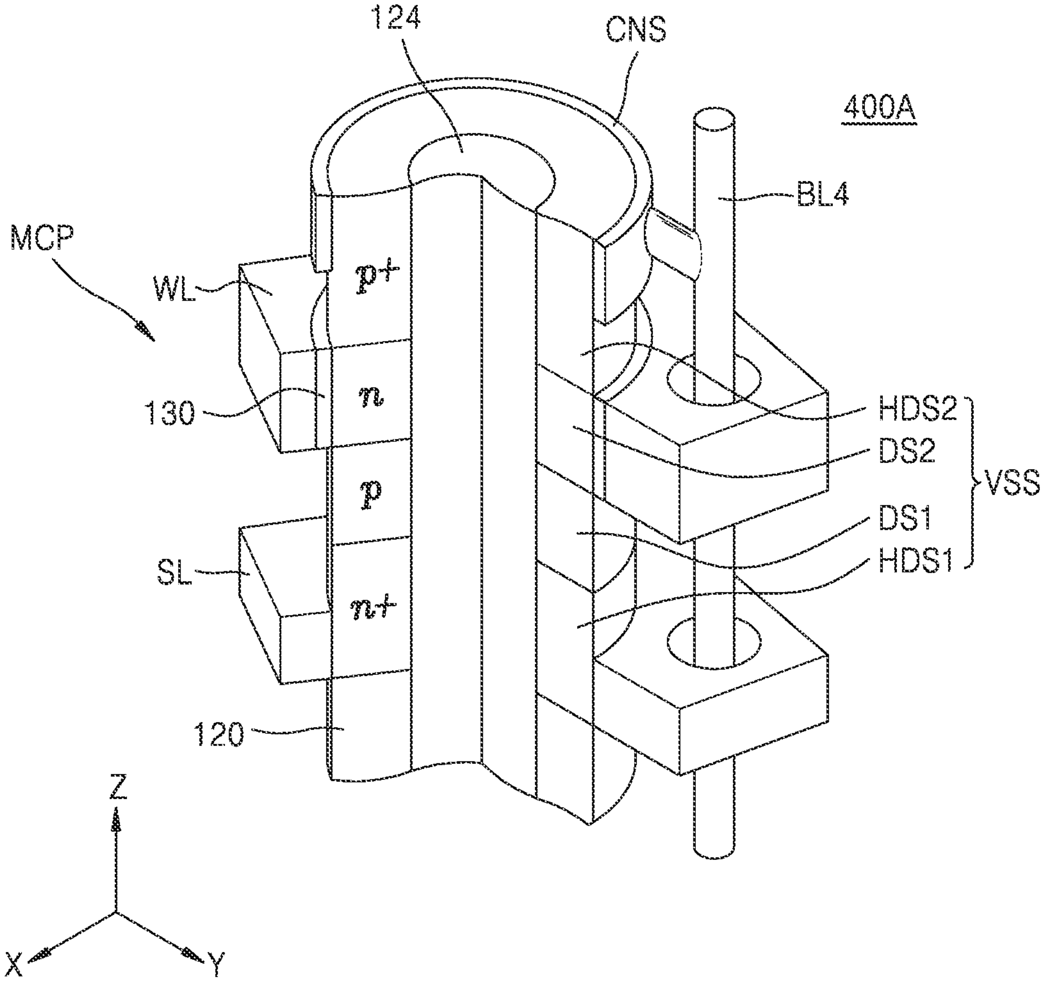
FIG. 5A is a partially cut-away perspective view of a memory cell included in a semiconductor memory device according to embodiments.
Figure 5B:
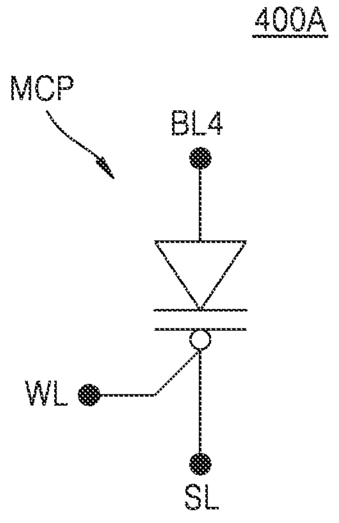
FIG. 5B is an equivalent circuit diagram of the memory cell shown in FIG. 5A.

FIGS. 5A and 5B are diagrams of a semiconductor memory device 400A according to embodiments. More specifically, FIG. 5A is a partially cut-away perspective view of an example of a structure of a memory cell MCP included in the semiconductor memory device 400A, and FIG. 5B is an equivalent circuit diagram of the memory cell MCP shown in FIG. 5A. The illustration of insulating films between conductive elements to insulate the conductive elements from each other is omitted in FIG. 5A. In FIGS. 5A and 5B, the same reference numerals are used to denote the same reference elements as in FIGS. 1 and 2A to 2D, and detailed descriptions thereof are omitted here.

Referring to FIGS. 5A and 5B, the semiconductor memory device 400A may substantially have the same configuration as the semiconductor memory device 100 described with reference to FIGS. 1 and 2A to 2D. However, the semiconductor memory device 400A may include the memory cell MCP instead of the memory cell MC.

The memory cell MCP may substantially have the same configuration as the memory cell MC described with reference to FIGS. 2A to 2D. The memory cell MCP may include a vertical semiconductor structure VSS. The vertical semiconductor structure VSS may include a first heavily doped film HDS1 including an $n^+$ doping region, a first lightly doped film DS1 including a p doping region, a second lightly doped film DS2 including an n doping region, and a second heavily doped film HDS2 including a $p^+$ doping region.

In the semiconductor memory device 400A, a bit line BL4 may pass through the word line WL and the sensing line WL in the vertical direction (Z direction). The bit line BL4 may be apart from each of the word line WL and the sensing line WL in a lateral direction (or a direction along an X-Y plane). An insulating film may be between the bit line BL4 and the word line WL and between the bit line BL4 and the sensing line WL.

The memory cell MCP may constitute a 1T-DRAM cell having a vertical channel structure, which does not include a capacitor but includes one transistor with a p-FBFET-based structure. In the vertical semiconductor structure VSS of the memory cell MCP, the second lightly doped film DS2 including the n doping region may be used as a vertical channel region, and a gate dielectric film 130 may be between the word line WL and the second lightly doped film DS2. The sensing line SL may be in contact with the first heavily doped film HDS1 including the $n^+$ doping region, and a conductive connection structure CNS connected to the bit line BL4 may be in contact with the second heavily doped film HDS2 including the $p^+$ doping region.

Figure 5C:
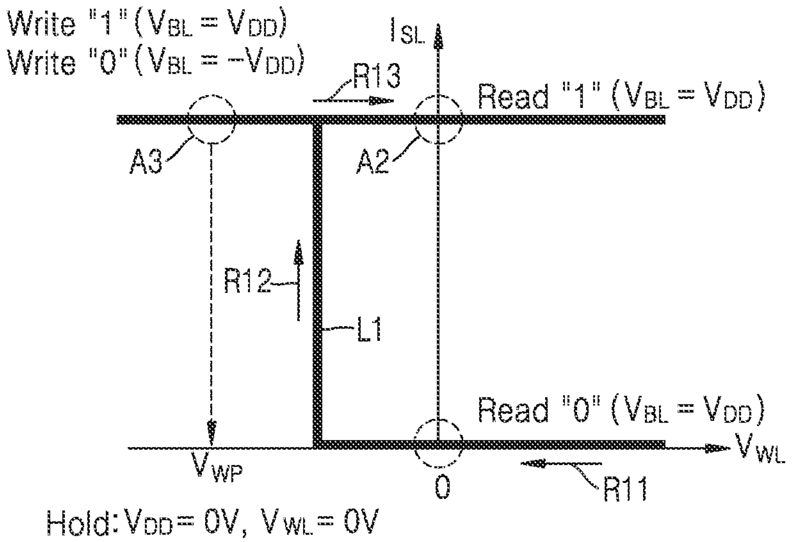
FIG. 5C is a graph for explaining operating characteristics in the memory cell shown in FIGS. 5A and 5B.

FIG. 5C is a graph for explaining operating characteristics in the memory cell MCP shown in FIGS. 5A and 5B. In FIG. 5C, an abscissa denotes a voltage VWL at a word line (refer to WL in FIG. 5A), and an ordinate denotes current ISL at a sensing line (refer to SL in FIG. 5A. Table 1 shows operating conditions in the memory cell MCP shown in FIGS. 5A and 5B.

TABLE 1

| | $V_{BL}$ (V) | $V_{WL}$ (V) |
|---|---|---|
| Write "1" | $V_{DD}$ | $V_{Wp}$ |
| Write "0" | $-V_{DD}$ | $V_{Wp}$ |
| Read | $V_{DD}$ | 0 |
| Read | 0 | 0 |

In Table 1, $V_{BL}$ denotes a voltage at a bit line BL, each of $V_{DD}$ and $-V_{DD}$ denotes a voltage applied to the bit line BL, $V_{WL}$ denotes a voltage at the word line WL, and $V_{Wp}$ denotes a voltage applied to the word line WL. In embodiments, the voltage $V_{DD}$ may be selected in a range of about 0.5 V to about 3 V, the voltage $-V_{DD}$ may be selected in a range of about −3 V to about −0.5 V, and the voltage $V_{Wp}$ may be selected in a range of about −2 V to about −0.5 V, without being limited thereto.

Referring to FIG. 5C and Table 1, to enable a write operation, when $V_{WL}=V_{Wp}$, the voltage $V_{DD}$ may be applied to the bit line BL to perform write "1," and when $V_{WL}=V_{Wp}$, the voltage $-V_{DD}$ may be applied to the bit line BL to perform write "0."

To enable a read operation, when $V_{BL}=V_{DD}$, a voltage of 0 V may be applied as the voltage $V_{WL}$. When $V_{BL}=V_{DD}$ and the voltage of 0 V is applied as the voltage $V_{WL}$, the memory cell MCP may have bistable characteristics, thus enabling the read operation. That is, when $V_{BL}=V_{DD}$, the voltage of 0 V may be applied as the voltage $V_{WL}$ (i.e., $V_{WL}$=0 V), and thus, a state of the memory cell MCP may be read based on a value of the current $I_{SL}$ of the sensing line SL.

To enable a hold operation, a voltage may not be applied from the outside. That is, $V_{BL}$ may be floated, or may equal 0 V, and $V_{WL}$ may be floated, or may equal 0 V. The memory cell MCP may be maintained in a memory state due to charges stored in the vertical channel region for a predetermined period of time even when no voltage is applied from the outside.

In FIG. 5C, a variation in current $I_{SL}$ at the sensing line SL with respect to a variation in the voltage $V_{BL}$ at the bit line BL is shown as line L1. In FIG. 5C, arrows R11, R12, and R13 indicate a path along which the current $I_{SL}$ at the sensing line SL changes along the line L1. In FIG. 5C, current $I_{SL}$ at a position in a circular dashed line indicated by A1 corresponds to an off current Ioff, current $I_{SL}$ at a position in a circular dashed line indicated by A2 corresponds to an on current Ion, and current $I_{SL}$ at a position in a circular dashed line indicated by A3 corresponds to a current value at which a write "0" operation or a write "1" operation is performed when a voltage at the word line WL is the voltage $V_{Wp}$.

Figure 6A:
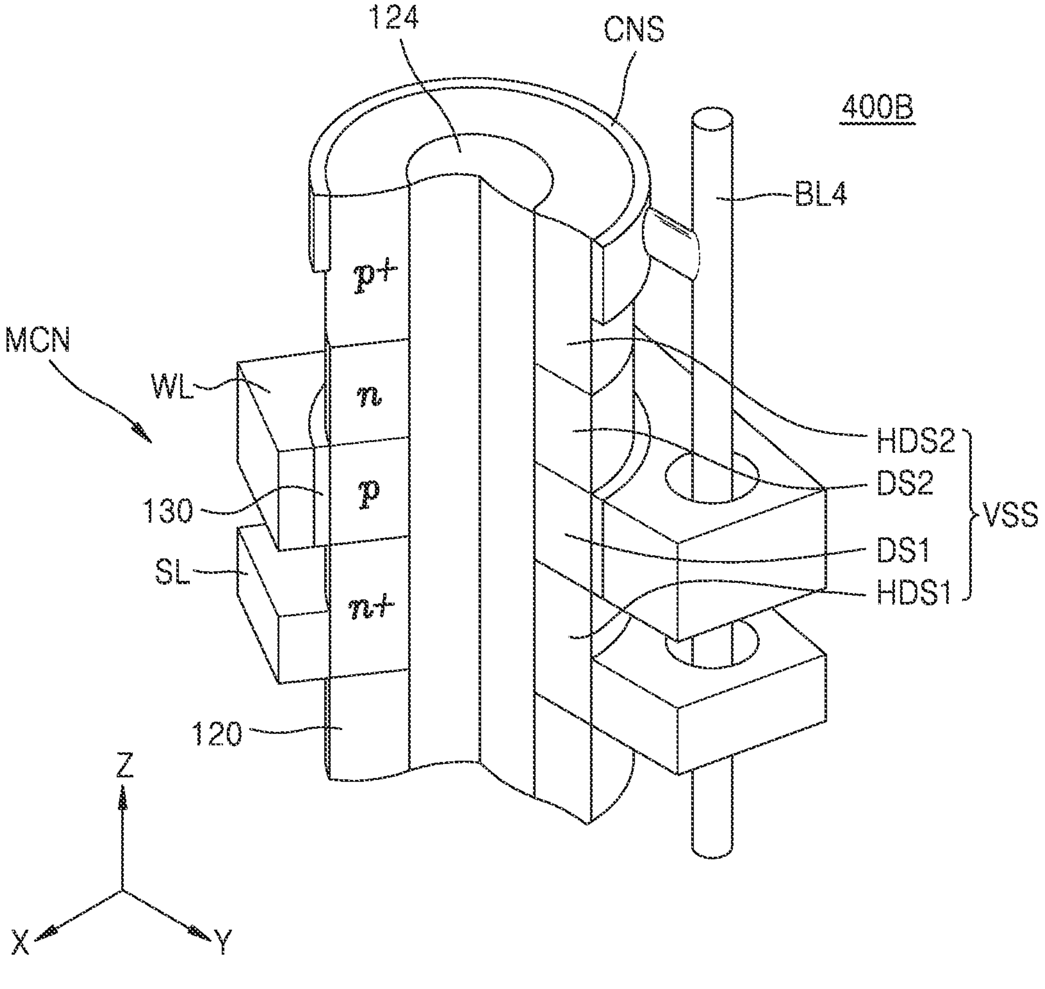
FIG. 6A is a partially cut-away perspective view of a memory cell included in a semiconductor memory device according to embodiments.
Figure 6B:
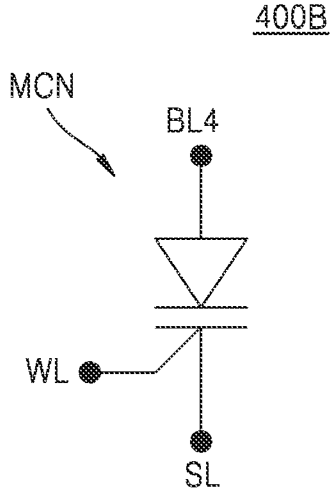
FIG. 6B is an equivalent circuit diagram of the memory cell shown in FIG. 6A.

FIGS. 6A and 6B are diagrams of a semiconductor memory device 400B according to embodiments. More specifically, FIG. 6A is a partially cut-away perspective view of an example of a structure of a memory cell MCN included in the semiconductor memory device 400B, and FIG. 6B is an equivalent circuit diagram of the memory cell MCN shown in FIG. 6A. The illustration of insulating films between conductive elements to insulate the conductive elements from each other is omitted in FIG. 6A. In FIGS. 6A and 6B, the same reference numerals are used to denote the same reference elements as in FIGS. 1, 2A to 2D, and 5A, and detailed descriptions thereof are omitted here.

Referring to FIGS. 6A and 6B, the semiconductor memory device 400B may substantially have the same configuration as the semiconductor memory device 400A described with reference to FIG. 5A. However, the semiconductor memory device 400B may include a memory cell MCN.

The memory cell MCN may substantially have the same configuration as the memory cell MCP described with reference to FIG. 5A. The memory cell MCN may include a vertical semiconductor structure VSS. The vertical semiconductor structure VSS may include a first heavily doped film HDS1 including an $n^+$ doping region, a first lightly doped film DS1 including a p doping region, a second lightly doped film DS2 including an n doping region, and a second heavily doped film HDS2 including a $p^+$ doping region.

The memory cell MCN may constitute a 1T-DRAM cell having a vertical channel structure, which does not include a capacitor but includes one transistor with an n-FBFET-based structure. In the vertical semiconductor structure VSS of the memory cell MCN, the first lightly doped film DS1 including the p doping region may be used as a vertical channel region, and a gate dielectric film 130 may be between a word line WL and the first lightly doped film DS1. A sensing line SL may be in contact with the first heavily doped film HDS1 including the $n^+$ doping region, and a conductive connection structure CNS connected to a bit line BL may be in contact with the second heavily doped film HDS2 including the $p^+$ doping region.

Figure 6C:
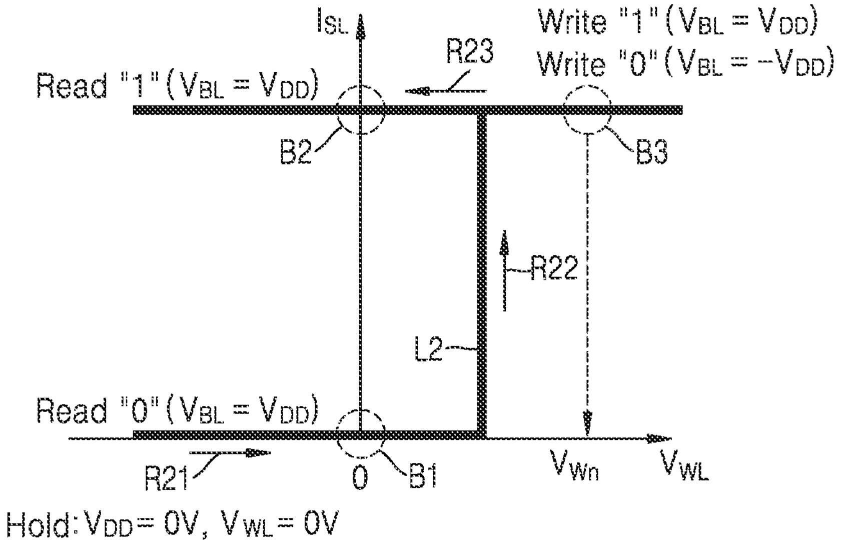
FIG. 6C is a graph for explaining operating characteristics in the memory cell shown in FIGS. 6A and 6B.

FIG. 6C is a graph for explaining operating characteristics in the memory cell MCN shown in FIGS. 6A and 6B. In FIG. 6C, an abscissa denotes a voltage $V_{WL}$ at a word line (refer to WL in FIG. 6A), and an ordinate denotes current ISL at a sensing line (refer to SL in FIG. 6A). Table 2 shows operating conditions in the memory cell MCN shown in FIGS. 6A and 6B.

TABLE 2

| | $V_{BL}$ (V) | $V_{WL}$ (V) |
|---|---|---|
| Write “1” | $V_{DD}$ | $V_{Wn}$ |
| Write “0” | $-V_{DD}$ | $V_{Wn}$ |
| Read | $V_{DD}$ | 0 |
| Read | 0 | 0 |

In Table 2, $V_{BL}$ denotes a voltage at a bit line BL, each of $V_{DD}$ and $-V_{DD}$ denotes a voltage applied to the bit line BL, $V_{WL}$ denotes a voltage at the word line WL, and $V_{Wn}$ denotes a voltage applied to the word line WL. In embodiments, the voltage $V_{DD}$ may be selected in a range of about 0.5 V to about 3 V, the voltage$-V_{DD}$ may be selected in a range of about −3 V to about −0.5 V, and the voltage $V_{Wn}$ may be selected in a range of about 0.5 V to about 2 V, without being limited thereto.

Referring to FIG. 6C and Table 2, to enable a write operation, when $V_{WL}=V_{Wn}$, the voltage $V_{DD}$ may be applied to the bit line BL to perform write “1,” and when $V_{WL}=V_{Wn}$, the voltage$-V_{DD}$ may be applied to the bit line BL to perform write “0.”

To enable a read operation, when $V_{BL}=V_{DD}$, a voltage of 0 V may be applied as the voltage $V_{WL}$. When $V_{BL}=V_{DD}$ and the voltage of 0 V is applied as the voltage $V_{WL}$, the memory cell MCN may have bistable characteristics, thus enabling the read operation. That is, when $V_{BL}=V_{DD}$, the voltage of 0 V may be applied as the voltage $V_{WL}$ (i.e., $V_{WL}=0$ V), and thus, a state of the memory cell MCN may be read based on a value of the current $I_{SL}$ of the sensing line SL.

To enable a hold operation, a voltage may not be applied from the outside. That is, $V_{BL}$ may be floated, or may equal 0 V, and $V_{WL}$ may be floated, or may equal 0 V. The memory cell MCN may be maintained in a memory state due to charges stored in the vertical channel region for a predetermined period of time even when no voltage is applied from the outside.

In FIG. 6C, a variation in current $I_{SL}$ at the sensing line SL with respect to a variation in the voltage $V_{BL}$ at the bit line BL is shown as line L2. In FIG. 6C, arrows R21, R22, and R23 indicate a path along which the current $I_{SL}$ at the sensing line SL changes along the line L2. In FIG. 6C, current $I_{SL}$ at a position in a circular dashed line indicated by B1 corresponds to an off current Ioff, current $I_{SL}$ at a position in a circular dashed line indicated by B2 corresponds to an on current Ion, and current $I_{SL}$ at a position in a circular dashed line indicated by B3 corresponds to a current value at which a write “0” operation or a write “1” operation is performed when a voltage at the word line WL is the voltage $V_{Wn}$.

Figure 7:
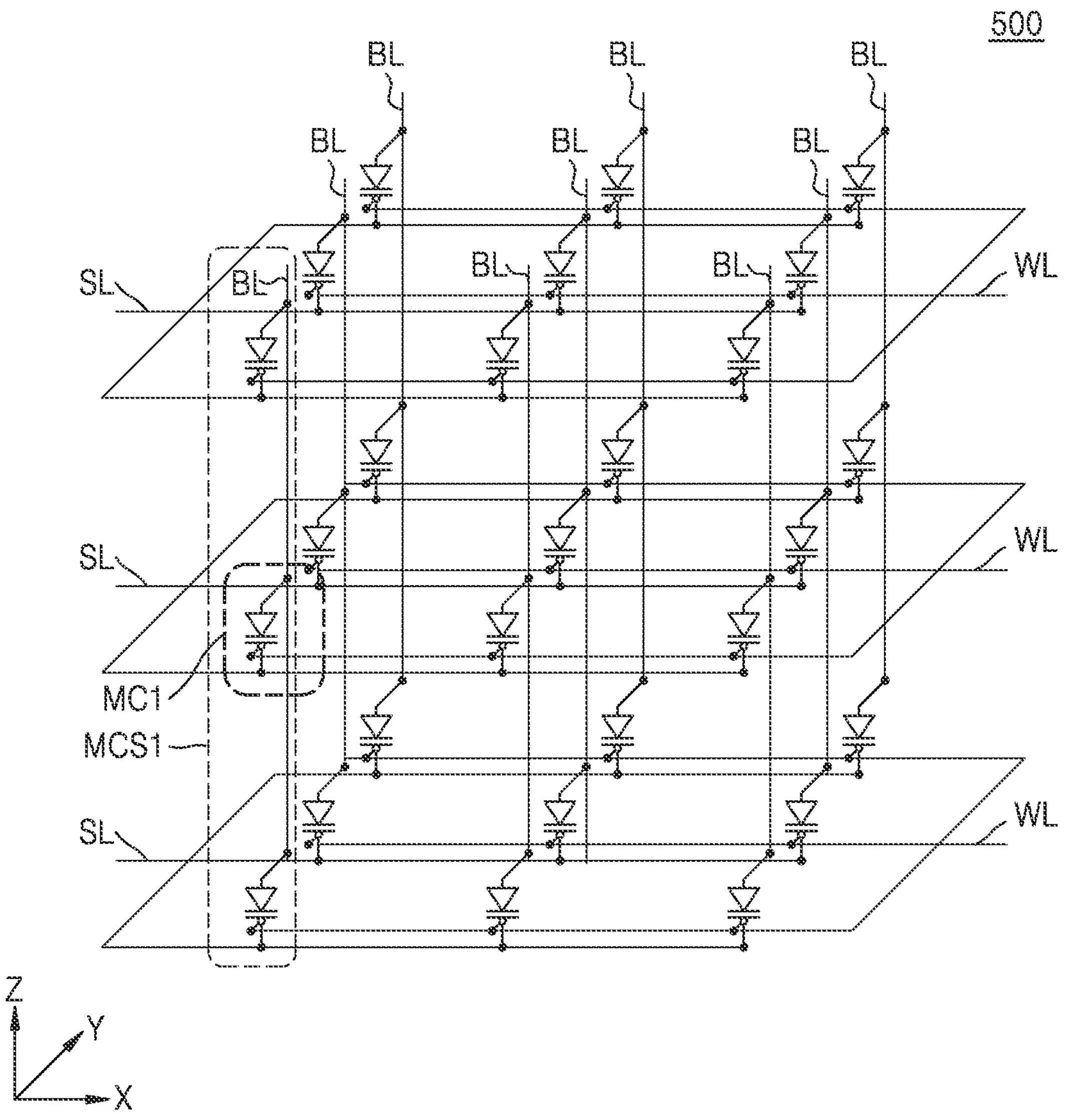
FIG. 7 is a circuit diagram of a semiconductor memory device according to embodiments.

FIG. 7 is a circuit diagram of a semiconductor memory device 500 according to embodiments.

FIG. 7 illustrates a circuit configuration in which a plurality of memory cells MC1, each of which includes a vertical 1T-DRAM cell, are arranged in a 3×3×3 array. In FIG. 7, a group of memory cells MC1 arranged in a line extending in a vertical direction (Z direction) may constitute one memory cell string MCS1.

In embodiments, each of the plurality of memory cells MC1 shown in FIG. 7 may have the same configuration as the memory cell MC described with reference to FIGS. 2A to 2D. In other embodiments, each of the plurality of memory cells MC1 shown in FIG. 7 may have the same configuration as the memory cell MCP described with reference to FIG. 5A.

In the semiconductor memory device 500 having the circuit configuration shown in FIG. 7, the plurality of memory cells MC1 in one memory cell string MCS1 may share one bit line BL. The plurality of memory cells MC1 in one memory cell string MCS1 may be connected to different word lines WL and different sensing lines SL from each other. The plurality of memory cells MC1 arranged at the same vertical level on one plane (X-Y plane) may share one word line WL and one sensing line SL.

Figure 8:
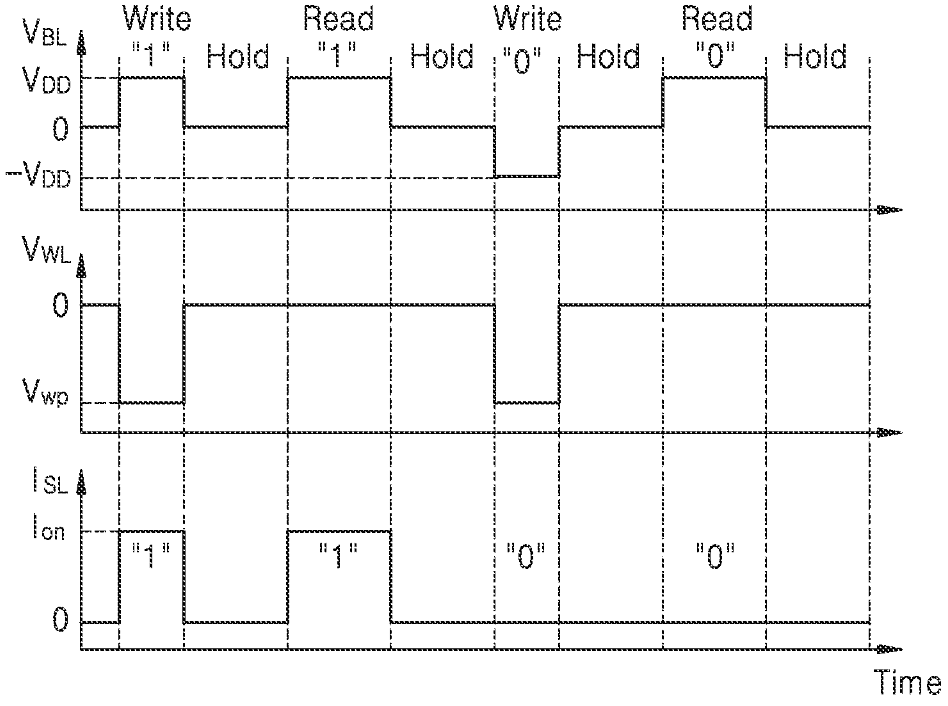
FIG. 8 is a timing diagram of a selected memory cell in the semiconductor memory device having a circuit configuration shown in FIG. 7.

FIG. 8 is a timing diagram of a selected memory cell MC1 in the semiconductor memory device 500 having the circuit configuration shown in FIG. 7.

Referring to FIGS. 7 and 8, a desired memory cell string MCS1 may be determined by selecting one bit line BL out of a plurality of bit lines BL, and one memory cell MC1 may be selected by selecting one word line WL out of a plurality of word lines WL and one sensing line SL out of a plurality of sensing lines SL. In the above-describe manner, a signal of the selected memory cell MCI may be read through the sensing line SL. By applying a required voltage (e.g., a voltage described with reference to Table 1) to each of the selected bit line BL and the selected word line WL, write, read, and hold operations may be selectively performed only on the selected memory cell MC1.

Figure 9:
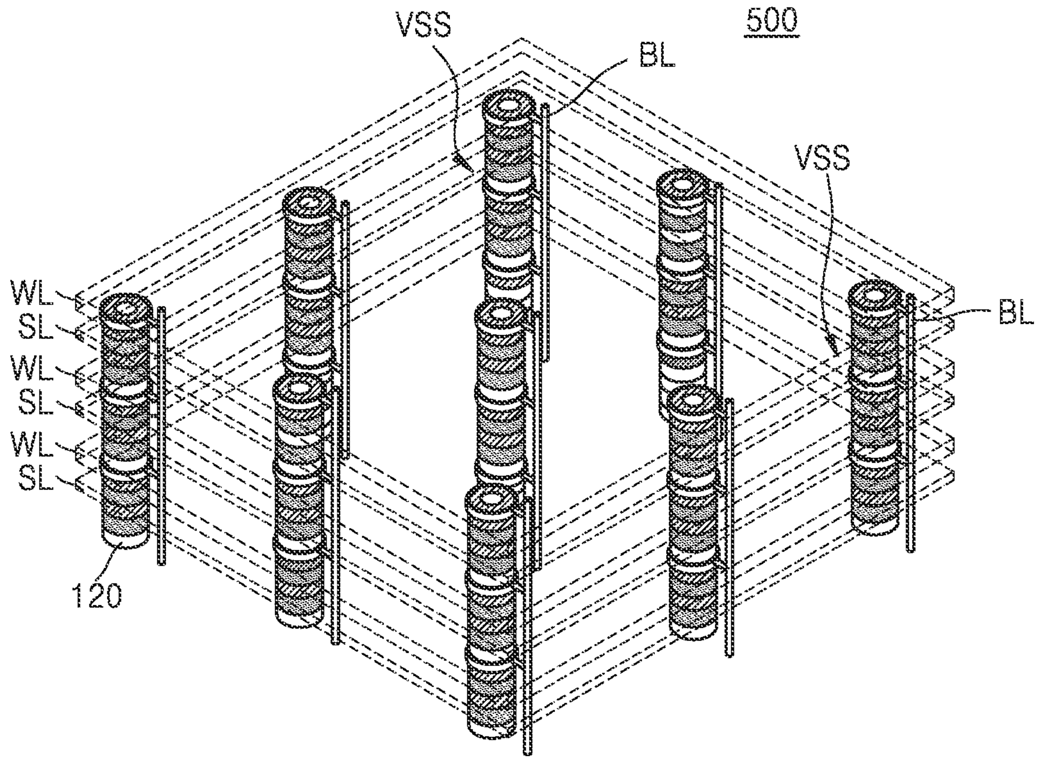
FIG. 9 is a perspective view of a semiconductor memory device arranged in a 3×3×3 array according to the circuit configuration shown in FIG. 7.
Figure 10:
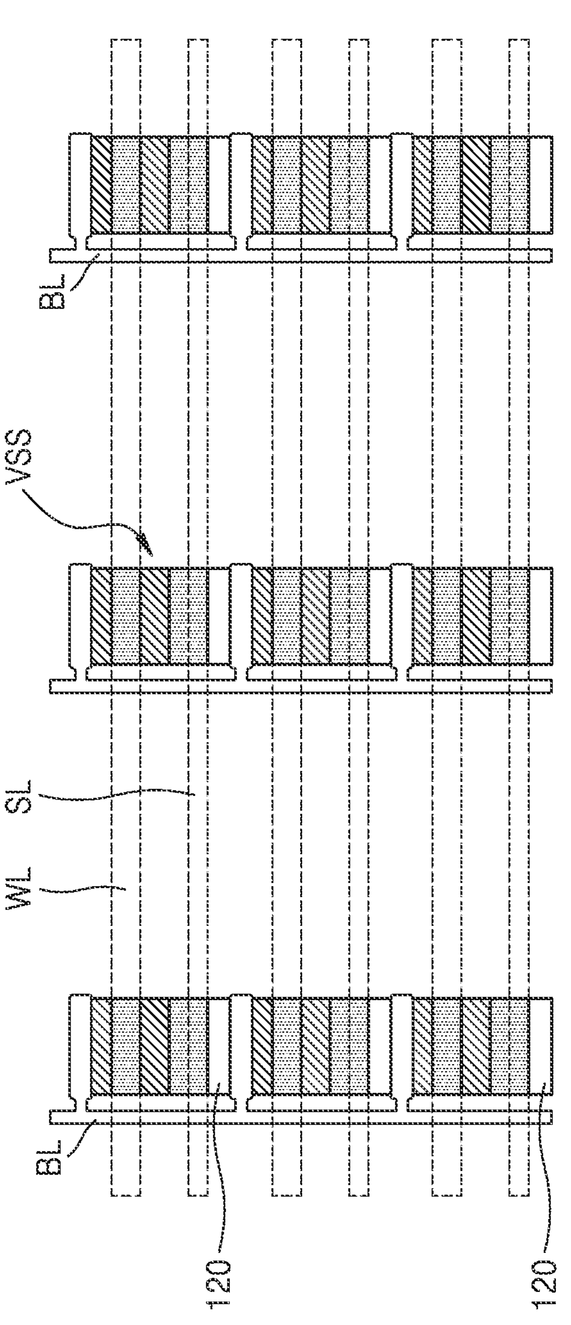
FIG. 10 is a side view of the semiconductor memory device arranged in the 3×3×3 array according to the circuit configuration shown in FIG. 7.

FIG. 9 is a perspective view of a semiconductor memory device 500 arranged in a 3×3×3 array according to the circuit configuration shown in FIG. 7. FIG. 10 is a side view of the semiconductor memory device 500 arranged in the 3×3×3 array according to the circuit configuration shown in FIG. 7. In FIGS. 9 and 10, a plurality of word lines WL and a plurality of sensing lines SL are illustrated with dashed lines.

FIGS. 7, 9, and 10 illustrate the semiconductor memory device 500 arranged in a 3×3×3 array, but embodiments are not limited thereto The number of memory cells MC1 in a first lateral direction (X direction), a second lateral direction (Y direction), and a vertical direction (Z direction) is not specifically limited, and a 3D structure including various numbers of memory cells MC1 may be formed as needed.

Figure 11:
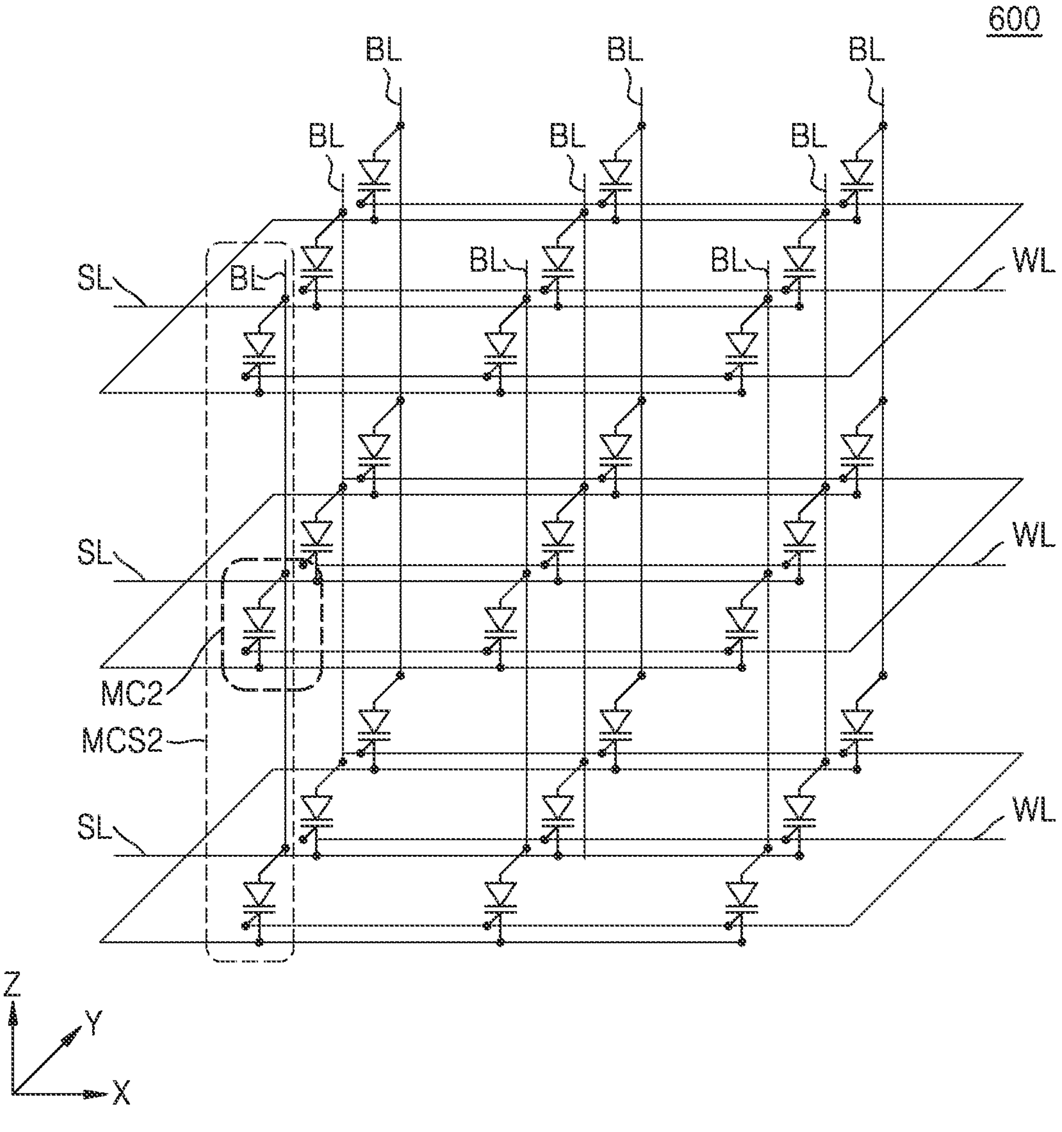
FIG. 11 is a circuit diagram of a semiconductor memory device according to embodiments.

FIG. 11 is a circuit diagram of a semiconductor memory device 600 according to embodiments.

FIG. 11 illustrates a circuit configuration in which a plurality of memory cells MC2, each of which includes a vertical 1T-DRAM cell, are arranged in a 3×3×3 array. In FIG. 11, a group of memory cells MC2 arranged in a line extending in a vertical direction (Z direction) may constitute one memory cell string MCS2.

In embodiments, each of the plurality of memory cells MC2 shown in FIG. 11 may have the same configuration as the memory cell MCN described with reference to FIG. 6A.

In the semiconductor memory device 600 having the circuit configuration shown in FIG. 11, the plurality of memory cells MC2 included in one memory cell string MCS2 may share one bit line BL. A plurality of memory cells MC2 included in one memory cell string MCS2 may be connected to respectively different word lines WL and respectively different sensing lines SL. A plurality of memory cells MC2 arranged in one plane (X-Y plane) at the same vertical level may share one word line WL and one sensing line SL.

Figure 12:
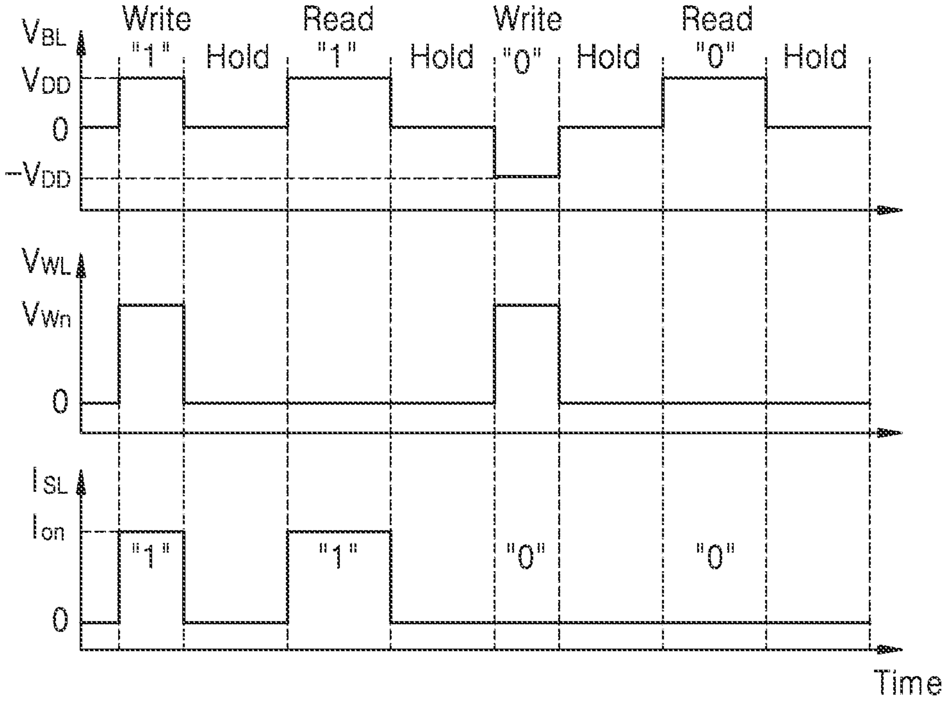
FIG. 12 is a timing diagram of a selected memory cell in a semiconductor memory device having a circuit configuration shown in FIG. 11.

FIG. 12 is a timing diagram of a selected memory cell MC2 in the semiconductor memory device 600 having the circuit configuration shown in FIG. 11.

Referring to FIGS. 11 and 12, a desired memory cell string MCS2 may be determined by selecting one bit line BL out of a plurality of bit lines BL, and one memory cell MC2 may be selected by selecting one word line WL out of a plurality of word lines WL and one sensing line SL out of the plurality of sensing lines SL. In the above-describe manner, a signal of the selected memory cell MC2 may be read through the sensing line SL. By applying a required voltage (e.g., a voltage described with reference to Table 2) to each of the selected bit line BL and the selected word line WL, write, read, and hold operations may be selectively performed only on the selected memory cell MC2.

Similar to that described with reference to FIGS. 9 and 10, the semiconductor memory device 600 having the circuit configuration shown in FIG. 11 may be arranged in a 3×3×3 array or implemented as a 3D structure, which may be variously modified and changed therefrom within the scope of embodiments.

In the semiconductor memory devices 100, 200, 300, 400A, 400B, 500, and 600 according to embodiments described with reference to FIGS. 1 to 12, a memory cell may include one transistor but not include a capacitor. Accordingly, in the semiconductor memory devices 100, 200, 300, 400A, 400B, 500, and 600 according to embodiments, unlike a related technique of storing charges in a capacitor, a DRAM cell may be implemented using a single transistor by storing charges in a vertical channel region of the transistor, thus making it advantageous to provide a finer and more compact 3D array structure. Also, in the semiconductor memory devices 100, 200, 300, 400A, 400B, 500, and 600 according to embodiments, a plurality of memory cells, which overlap each other in a vertical direction, may include a 3D stack-type memory cell array that shares one bit line. Therefore, the semiconductor memory devices 100, 200, 300, 400A, 400B, 500, and 600 according to embodiments may overcome problems caused by the density limits of bit lines, which have been encountered in semiconductor memory devices having 2D structures, and provide a structure that is advantageous for high integration of semiconductor memory devices.

In addition, the semiconductor memory devices 100, 200, 300, 400A, 400B, 500, and 600 according to embodiments may have a relatively low operating voltage and a relatively sharp SS by using a positive feedback loop, and have the advantage of low power consumption, unlike related DRAM devices, because a refresh operation is not required. Furthermore, a wide current sensing margin and a high operating speed due to a relatively high on-off current ratio may be provided. Therefore, the semiconductor memory devices 100, 200, 300, 400A, 400B, 500, and 600 according to embodiments may provide excellent competitiveness in various aspects including performance, power, chip area, and cost.

Next, a method of manufacturing a semiconductor memory device, according to embodiments, is described in detail.

FIGS. 13A to 33B are diagrams of a method of manufacturing a semiconductor memory device, according to embodiments. FIGS. 13A, 14A, 15A, 16, 17, 18A, 19A, 20, 21, 22A, 24A, 25A, 26A, 27A, 29, 30, 32A, and 33A are cross-sectional views, according to a process sequence, of a portion corresponding to a cross-section taken along line X1-X1' of FIG. 1. FIGS. 13B, 14B, 15B, 18B, 19B, 22B, 23, 24B, 25B, 26B, 27B, 28, 31, 32B, and 33B are cross-sectional views, according to a process sequence, of a portion corresponding to a cross-section taken along line Y1-Y1' of FIG. 1. FIG. 18C is an enlarged cross-sectional view of a portion "EXA" in FIG. 18A. FIG. 19C is an enlarged cross-sectional view of a portion "EXA" in FIG. 19A. An example of a method of manufacturing the semiconductor memory device 100 shown in FIGS. 1 and 2A to 2D is described with reference to FIGS. 13A to 33B. In FIGS. 13A to 33B, the same reference numerals are used to denote the same reference elements as in FIGS. 1 and 2A to 2D, and detailed descriptions thereof are omitted here.

Figure 13A:
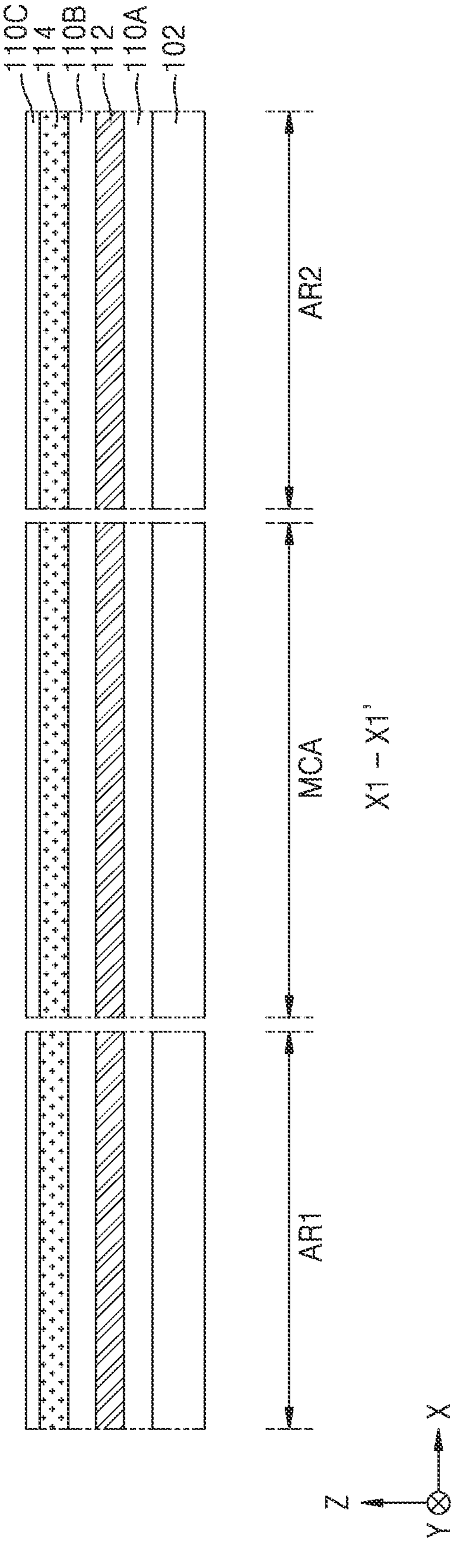
Figure 13B:
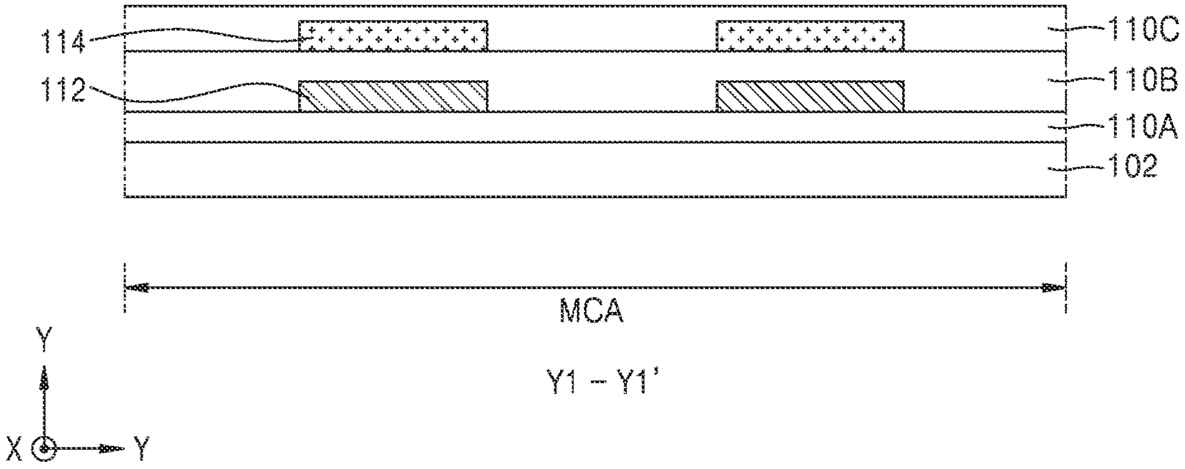

Referring to FIGS. 13A and 13B, an insulating film 110A, a plurality of first sacrificial patterns 112, an insulating film 110B, a plurality of second sacrificial patterns 114, and an insulating film 110C may be sequentially formed on a substrate 102.

Each of the plurality of first sacrificial patterns 112 may be formed to provide a space for a sensing line (refer to SL in FIGS. 2A to 2D), and each of the plurality of second sacrificial patterns 114 may be formed to provide a space for a word line (refer to WL in FIGS. 2A to 2D). The plurality of first sacrificial patterns 112 and the plurality of second sacrificial patterns 114 may be each formed to have a line shape extending long in a first lateral direction (X direction). The insulating film 110B may be formed to cover a top surface and a sidewall of each of the plurality of first sacrificial patterns 112 on the insulating film 110A. The insulating film 110C may be formed to cover a top surface and a sidewall of each of the plurality of second sacrificial patterns 114 on the insulating film 110B.

The insulating films 110A, 110B, and 110C may include a silicon oxide film Each of the first sacrificial pattern 112 and the second sacrificial pattern 114 may include a film including a different material from a silicon oxide film and include a material having a different etch selectivity from the silicon oxide film. In embodiments, the first sacrificial pattern 112 and the second sacrificial pattern 114 may include respectively different films, each of which is selected from a silicon nitride film (SiN), a SiON film, a SiCN film, a SiOCN film, and an aluminum oxide (AlO) film. As used herein, each of the terms "SiN," "SiON," "SiCN," "SiOCN," and "AlO" refers to a material including elements included therein, without referring to a chemical formula representing a stoichiometric relationship. For example, the first sacrificial pattern 112 may include a silicon nitride film, and the second sacrificial pattern 114 may include a SiON film, without being limited thereto.

Figure 14A:
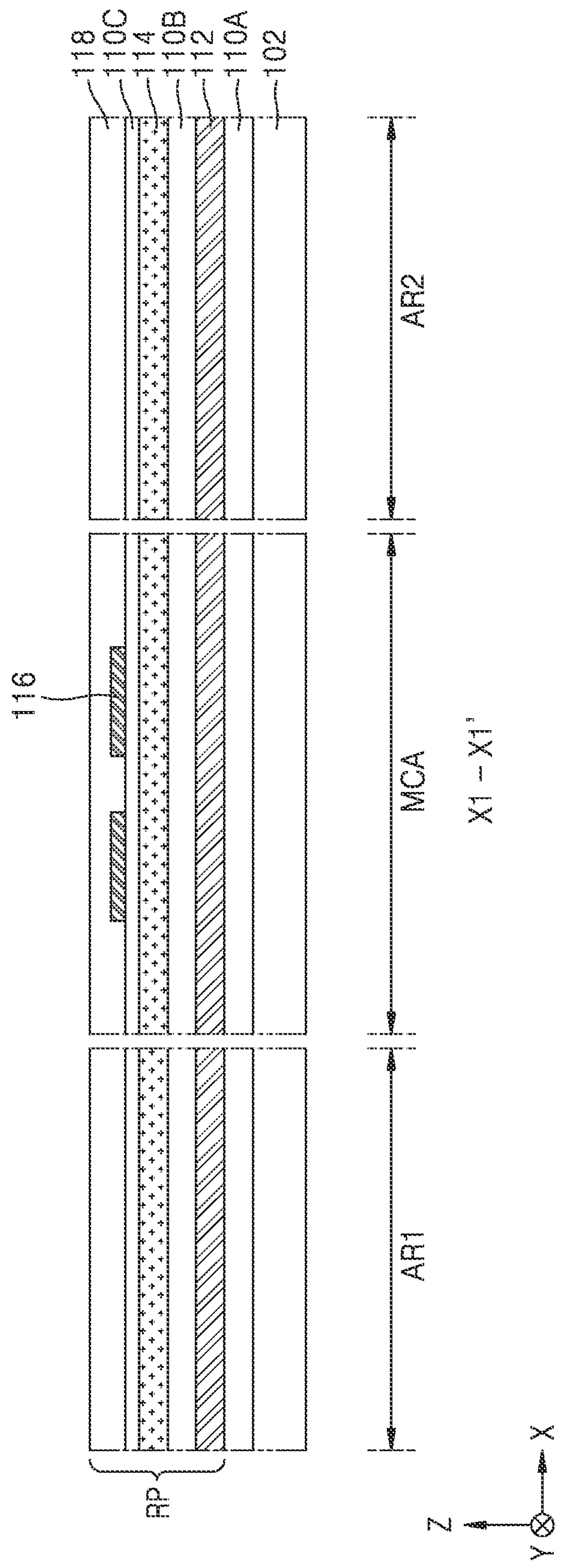
Figure 14B:
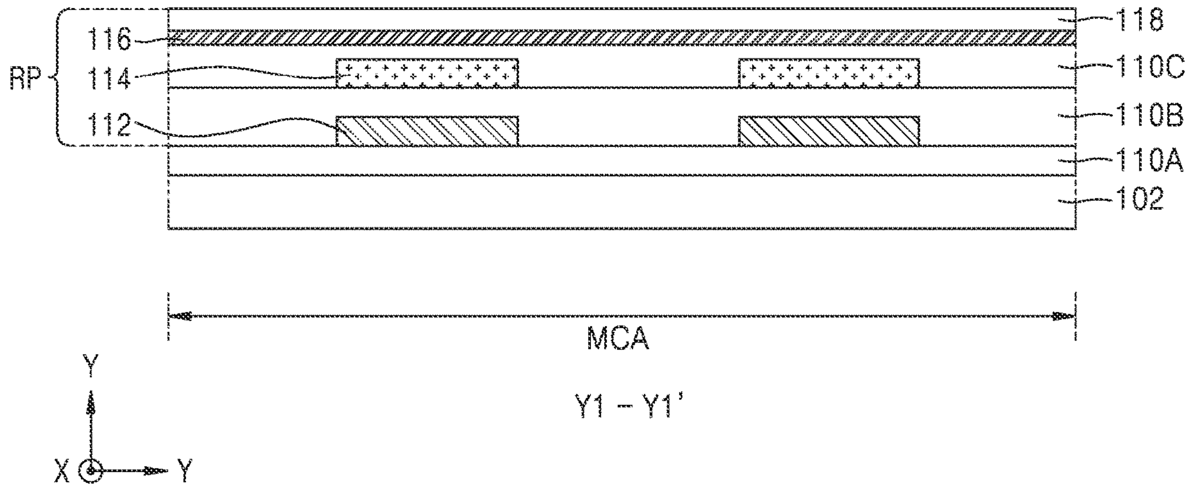

Referring to FIGS. 14A and 14B, a plurality of third sacrificial patterns 116 and an inter-cell insulating film 118 may be sequentially formed on the resultant structure FIGS. 13A and 13B.

Each of the plurality of third sacrificial patterns 116 may be formed to have a line shape extending long in a second lateral direction (Y direction). Each of the plurality of third sacrificial patterns 116 may be formed to provide a space for forming a conductive connection structure (refer to CNS in FIGS. 2A to 2D). The plurality of third sacrificial patterns 116 may include a different material from a constituent material of each of the plurality of first sacrificial patterns 112 and the plurality of second sacrificial patterns 114. The plurality of third sacrificial patterns 116 may include any one film selected from a silicon nitride (SiN) film, a SiON film, a SiCN film, a SiOCN film, and an aluminum oxide (AlO) film. For example, when the plurality of first sacrificial patterns 112 include a silicon nitride film and the plurality of second sacrificial patterns 114 include a SiON film, the plurality of third sacrificial patterns 116 may include an aluminum oxide film, without being limited thereto. The inter-cell insulating film 118 may be formed to cover a top surface and a sidewall of each of the plurality of third sacrificial patterns 116 on the insulating film 110C. The inter-cell insulating film 118 may include a silicon oxide film.

In FIGS. 14A and 14B, a stack structure RP including the plurality of first sacrificial patterns 112, the insulating film 110B, the plurality of second sacrificial patterns 114, the insulating film 110C, the plurality of third sacrificial patterns 116, and the inter-cell insulating film 118 that are sequentially stacked on the substrate 102 may be a structure required to form a plurality of memory cells (refer to MC in FIGS. 2A to 2D), which are arranged at the same vertical level on the substrate 102 in one lateral direction (X-Y plane).

Figure 15A:
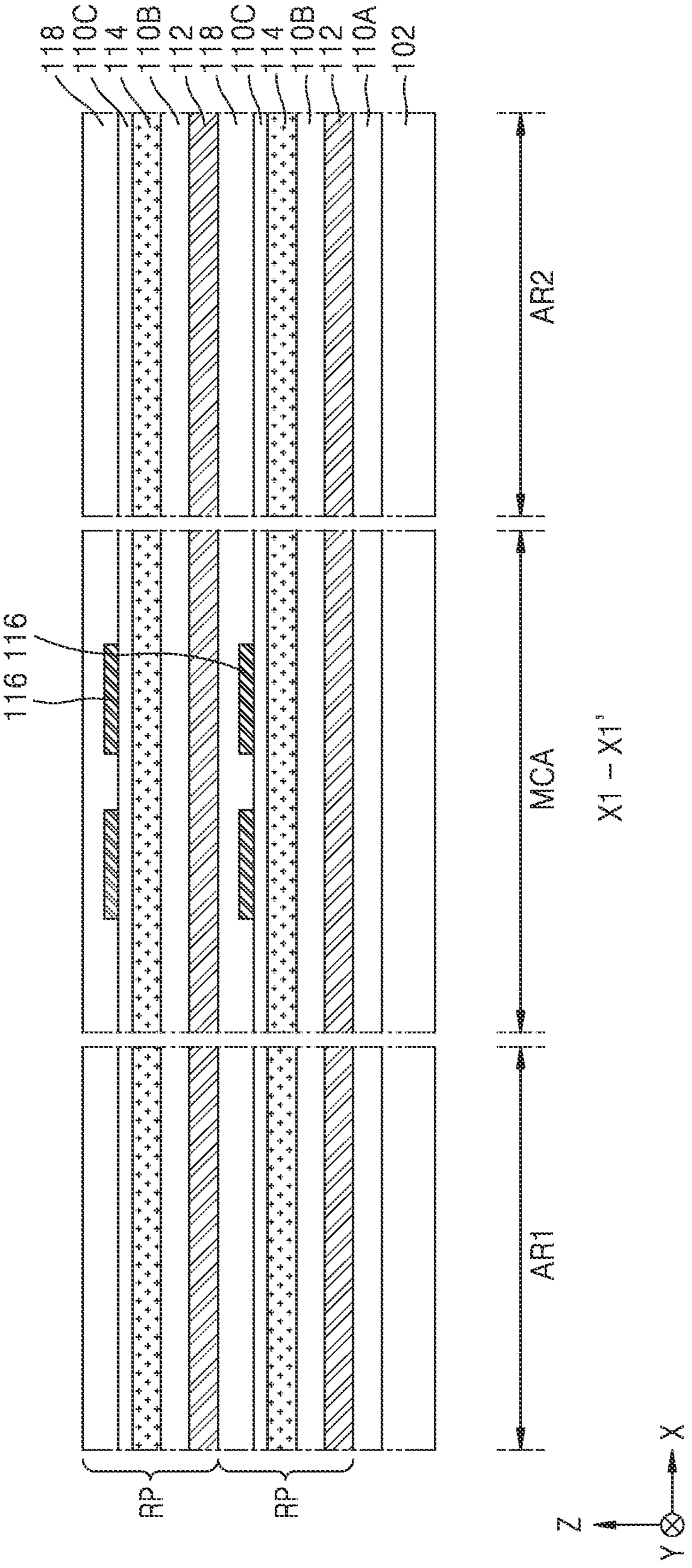
Figure 15B:
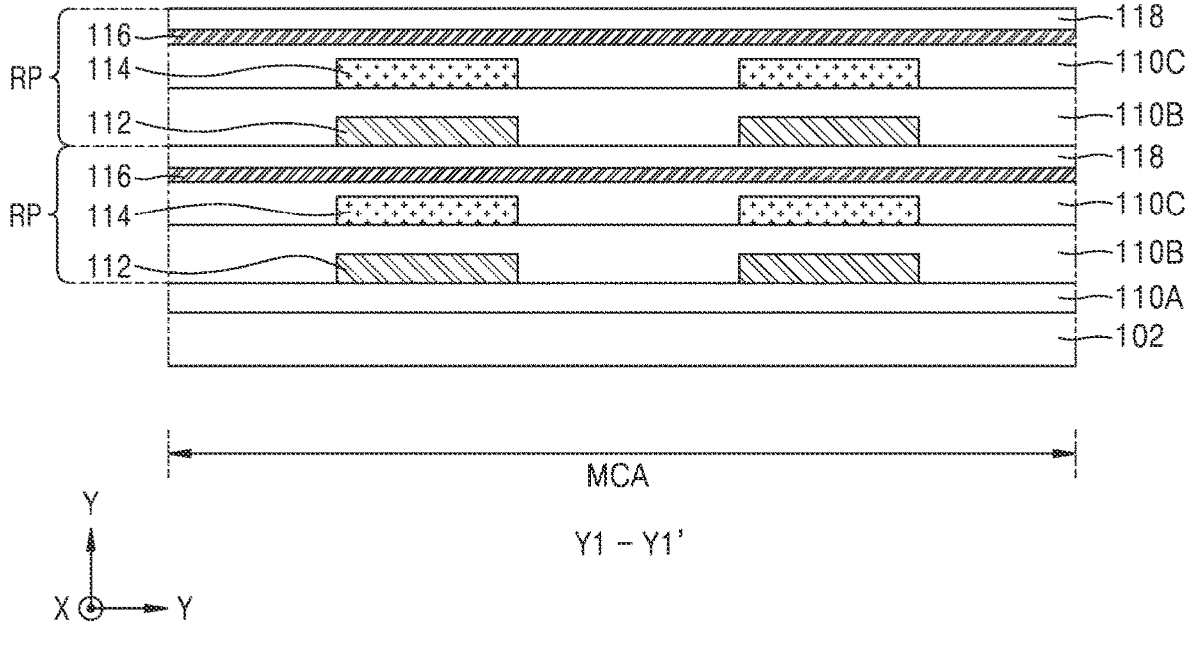

Referring to FIGS. 15A and 15B, in the resultant structure of FIGS. 14A and 14B, the stack structure RP may be repeatedly formed as many times as required in a vertical direction (Z direction). The number of stack structures RP stacked in the vertical direction (Z direction) may correspond to the number of memory cells (refer to MC in FIGS. 2A to 2D) included in one memory cell string extending long in the vertical direction (Z direction). FIGS. 15A and 15B illustrate an example in which two stack structures RP are formed in the vertical direction (Z direction), but embodiments are not limited thereto. The stack structures RP may be repeatedly formed in equal number to the number of memory cells MC required to form one memory cell string.

Figure 16:
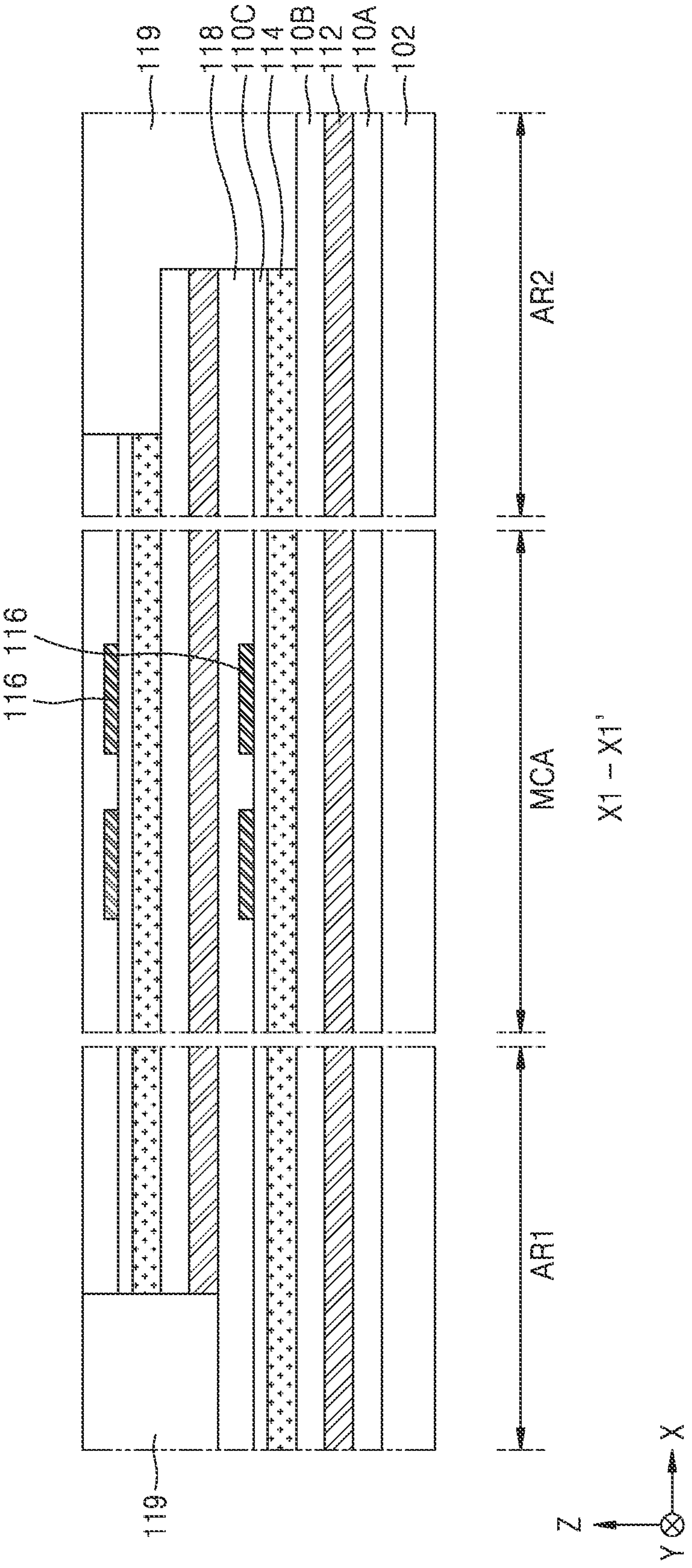

Referring to FIG. 16, in a first connection unit AR1 and a second connection unit AR2 of the resultant structure of FIGS. 15A and 15B, respective portions of a plurality of stack structures RP may be etched to form a plurality of step units, and a mold insulating film 119 may be formed to cover the plurality of step units.

Figure 17:
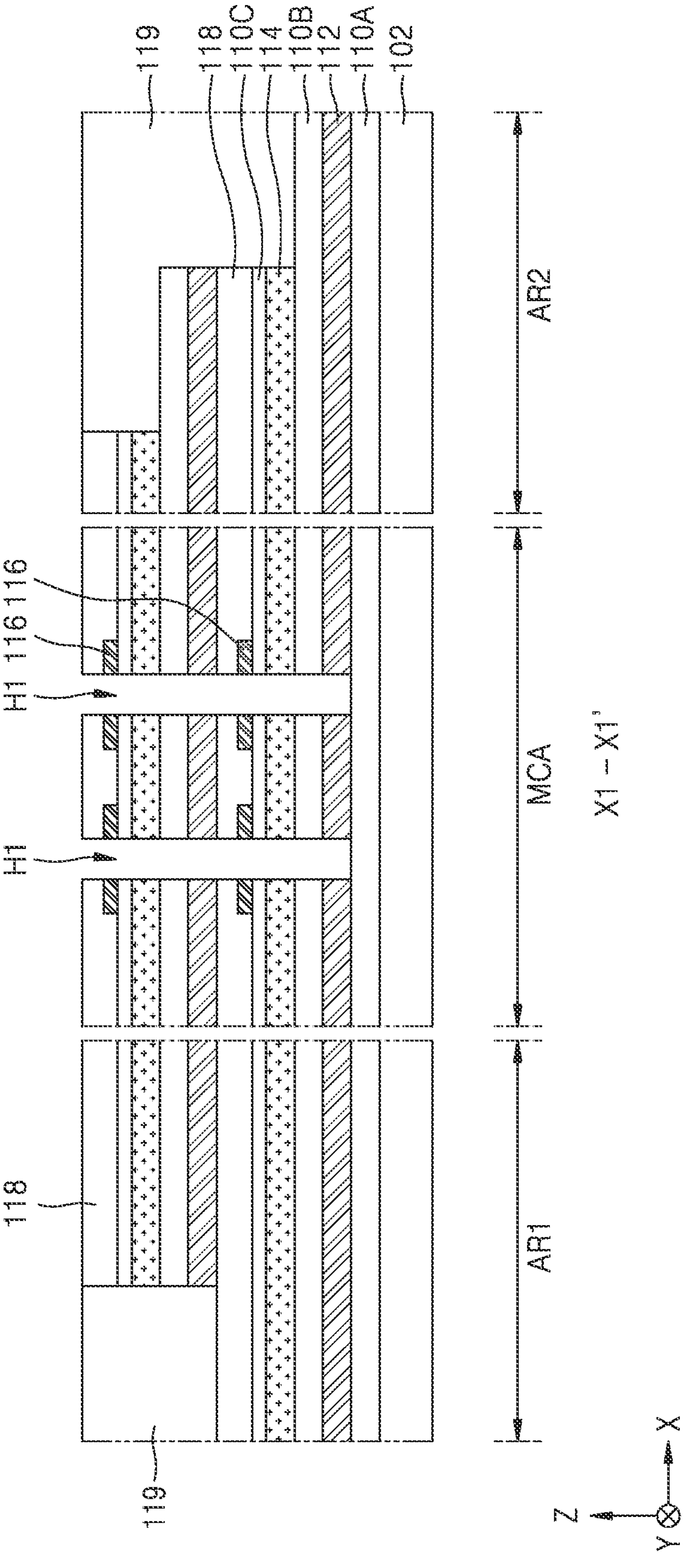

Referring to FIG. 17, in a memory cell array unit MCA, a plurality of channel holes Hl may be formed to pass through the plurality of stack structures RP in the vertical direction (Z direction). The insulating film 110A closest to the substrate 102 may be exposed at the bottom of each of the plurality of channel holes H1. The plurality of channel holes H1 may be formed using an anisotropic dry etching process.

Figure 18A:
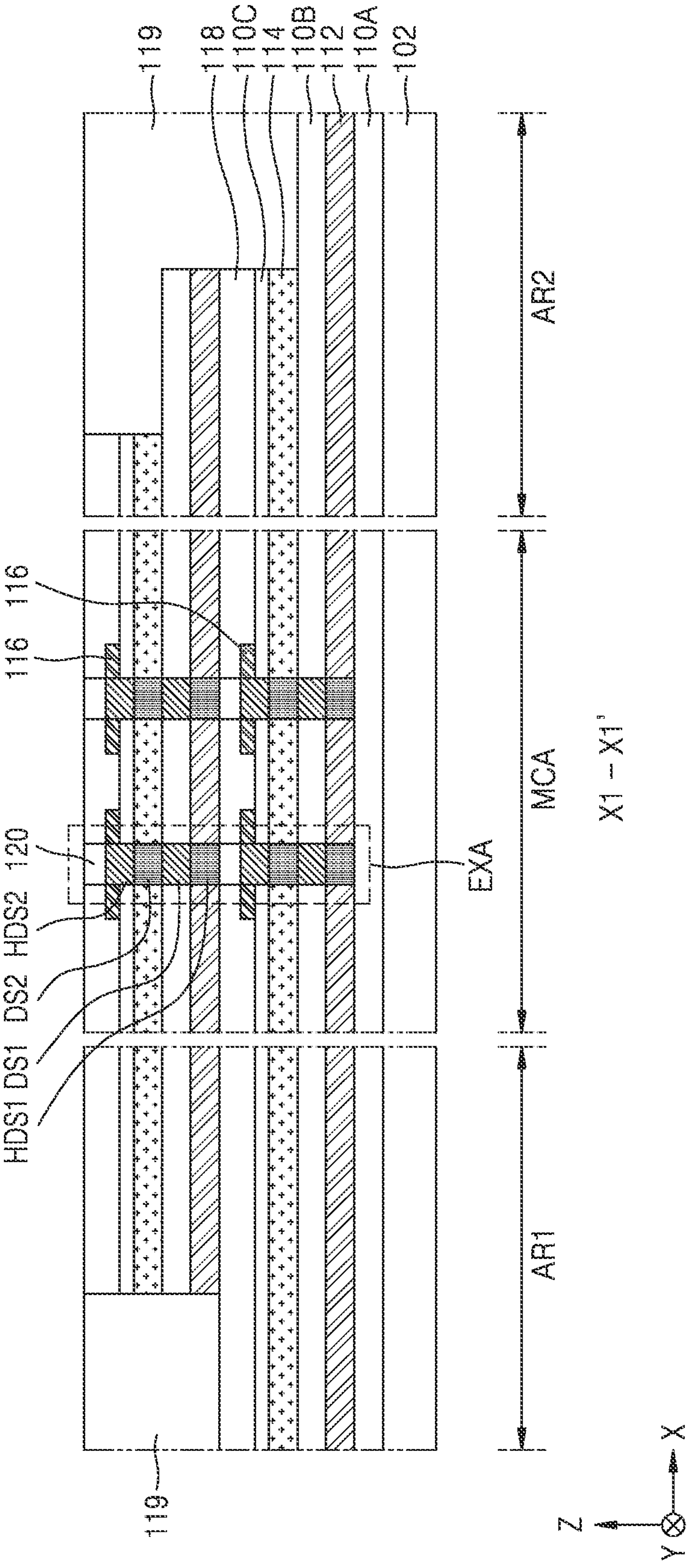
Figure 18B:
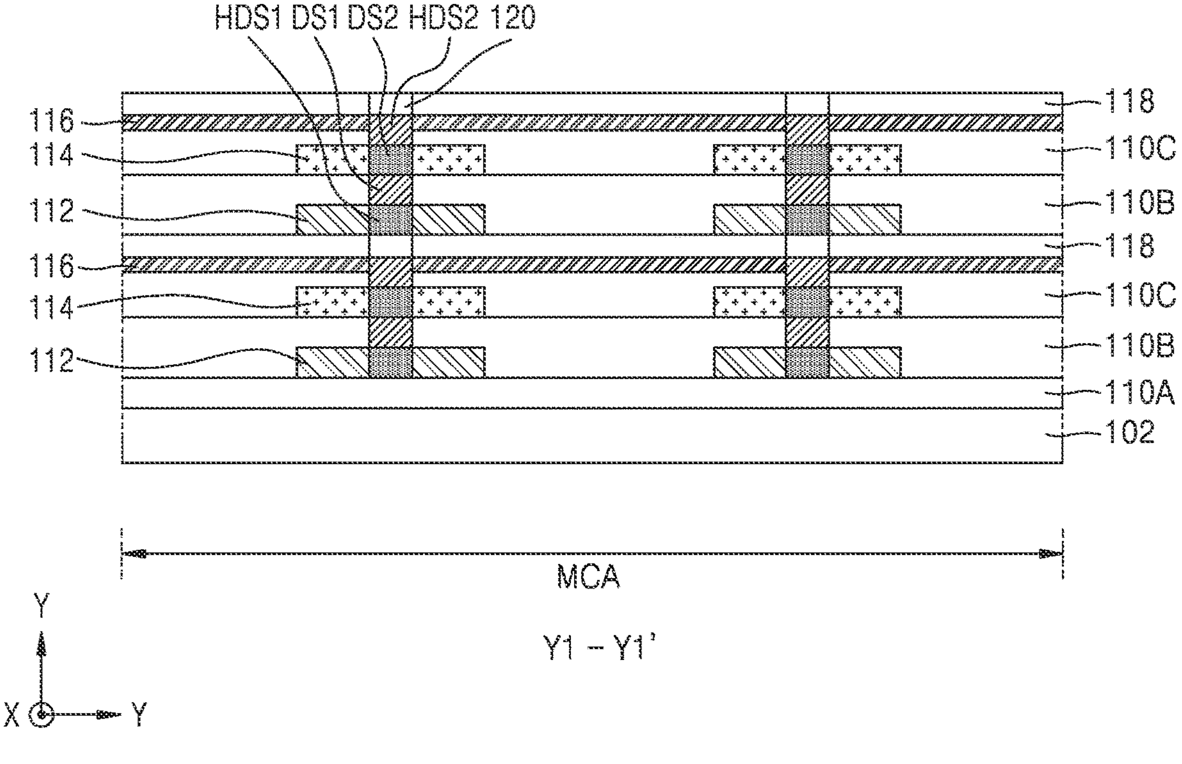
Figure 18C:
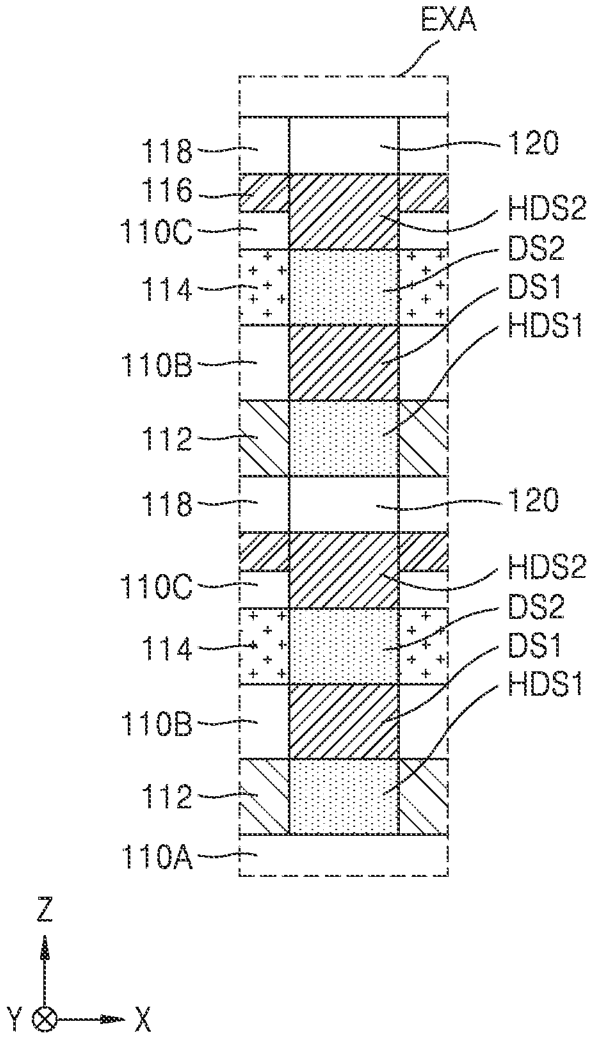
FIG. 18C is an enlarged cross-sectional view of a portion "EXA" in FIG. 18A.

Referring to FIGS. 18A, 18B, and 18C, inside each of the plurality of channel holes H1, a first heavily doped film HDS1, a first lightly doped film DS1, a second lightly doped film DS2, a second heavily doped film HDS2, and an inter-cell local insulating film 120 may be repeatedly and sequentially formed in the vertical direction (Z direction) from the bottom of each of the channel holes H1.

Figure 19A:
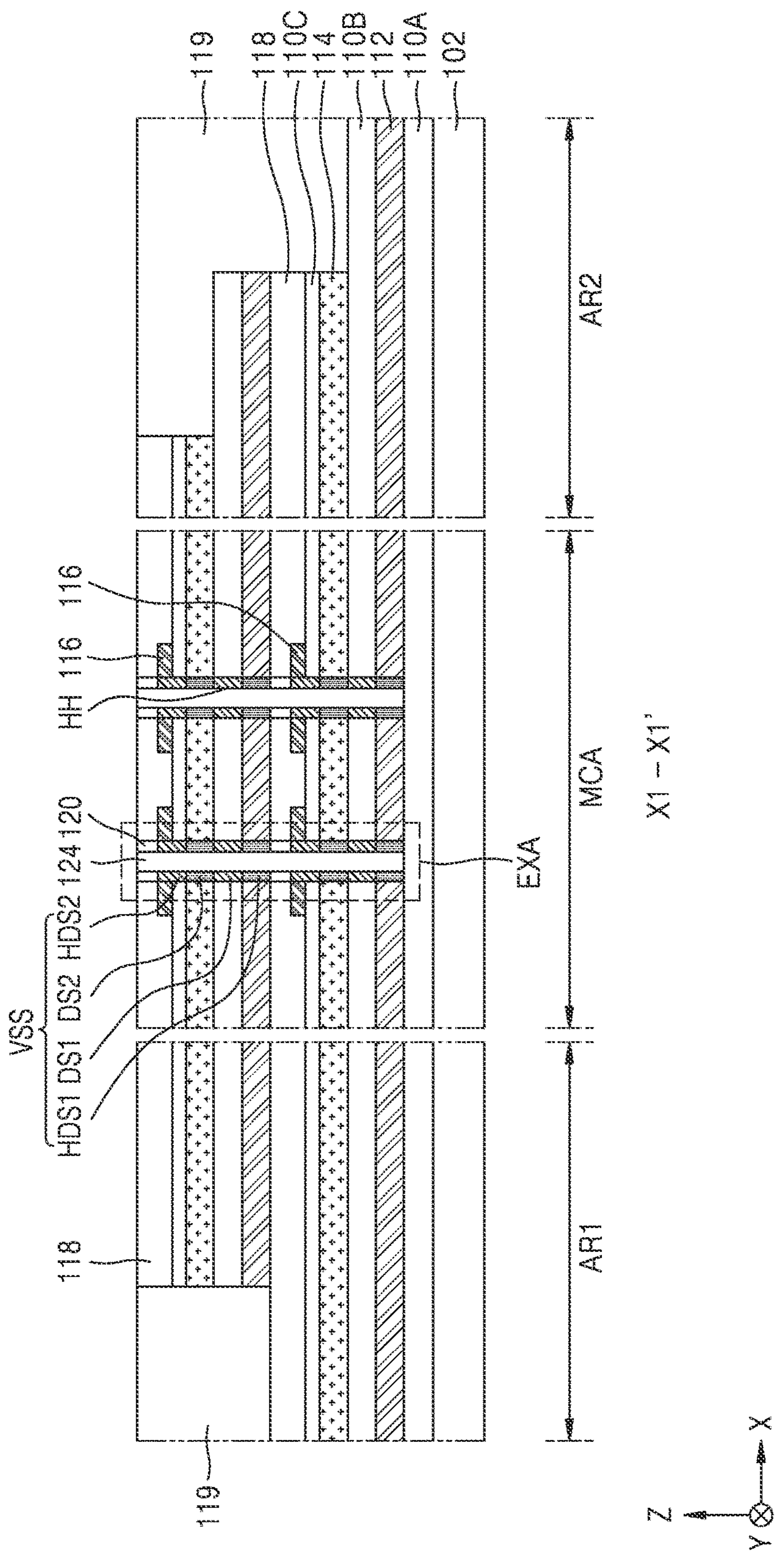
Figure 19B:
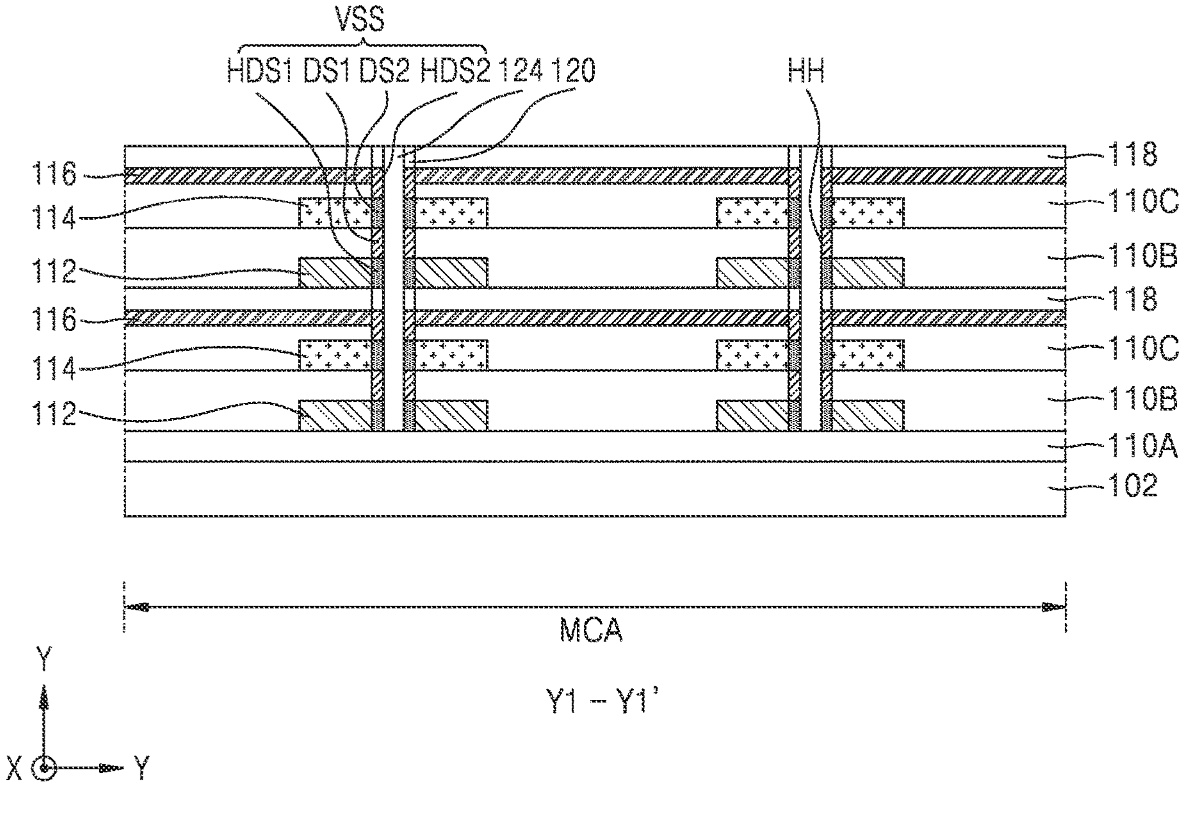
Figure 19C:
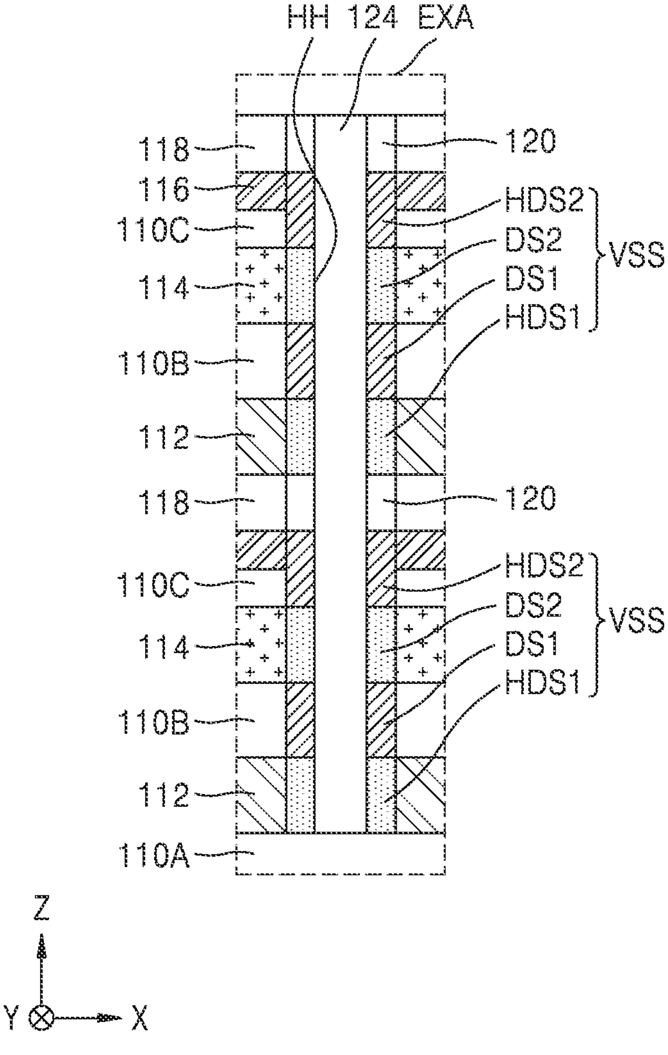
FIG. 19C is an enlarged cross-sectional view of a portion "EXA" in FIG. 19A.

Referring to FIGS. 19A, 19B, and 19C, in the resultant structure of FIGS. 18A, 18B, and 18C, a hollow HH may be formed to pass through a stack structure including the first heavily doped film HDS1, the first lightly doped film DS1, the second lightly doped film DS2, the second heavily doped film HDS2, and the inter-cell local insulating film 120 in the vertical direction (Z direction) inside each of the plurality of channel holes H1. The hollow HH may be filled by an insulating pillar 124.

As a result, each of the first heavily doped film HDS1, the first lightly doped film DS1, the second lightly doped film DS2, the second heavily doped film HDS2, and the inter-cell local insulating film 120 may be left in the form of a ring surrounding the insulating pillar 124. Also, a plurality of vertical semiconductor structures VSS, each of which includes the first heavily doped film HDS1, the first lightly doped film DS1, the second lightly doped film DS2, and the second heavily doped film HDS2, may be obtained.

Figure 20:
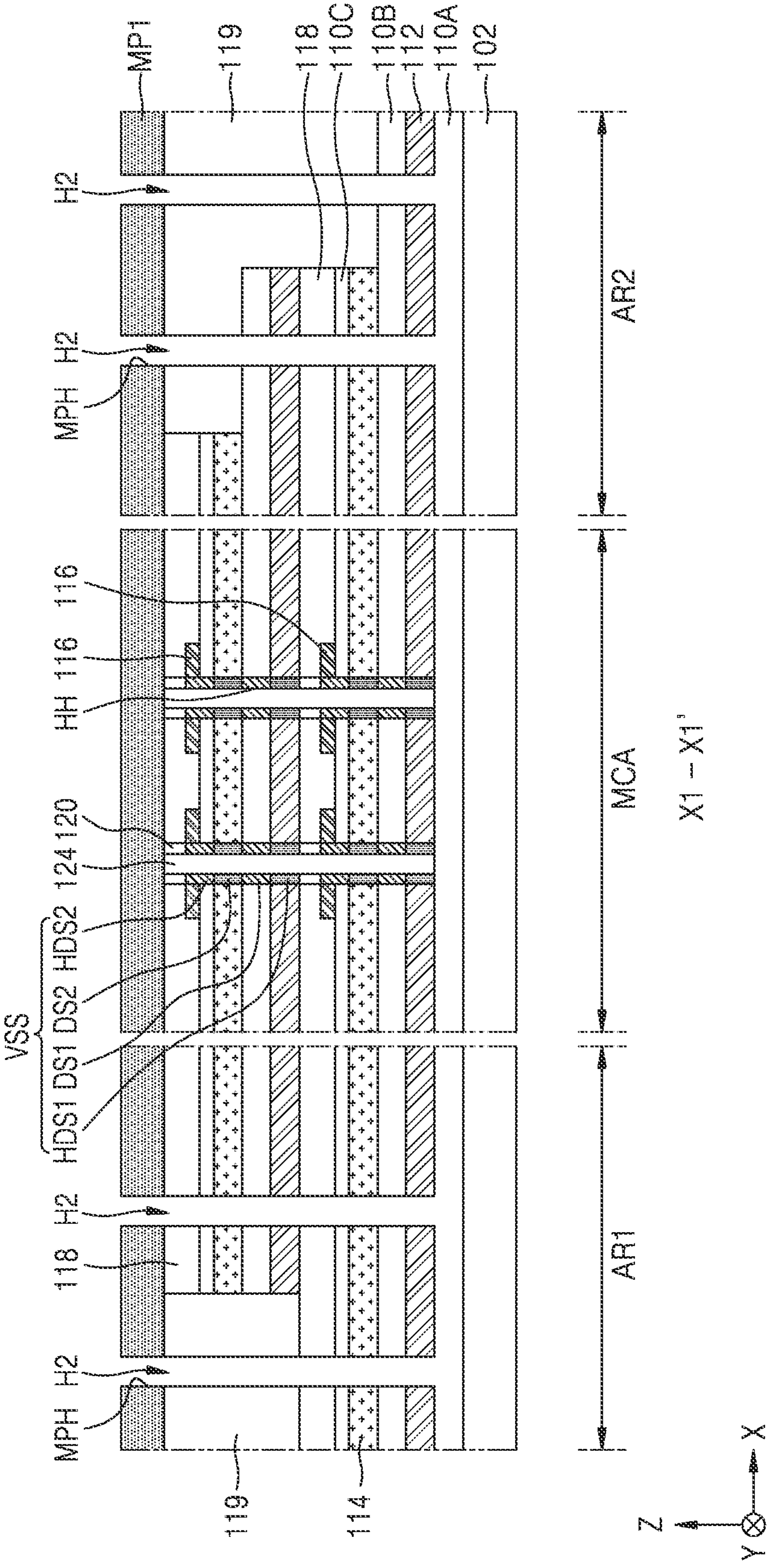

Referring to FIG. 20, a mask pattern MP1 having a plurality of holes MPH may be formed on the resultant structure of FIGS. 19A, 19B, and 19C. After the mask pattern MP1 is formed, in the first connection unit AR1 and the second connection unit AR2, a top surface of the inter-cell insulating film 118 and a top surface of the mold insulating film 119 may be exposed through the plurality of holes MPH. In embodiments, the mask pattern MP1 may include polysilicon, without being limited thereto.

Afterwards, a lower structure exposed through the plurality of holes MPH may be etched by using the mask pattern MP1 as an etch mask, and thus, a plurality of contact holes H2 may be formed. The insulating film 110A closest to the substrate 102 may be exposed at the bottom of each of the plurality of contact holes H2. The plurality of contact holes H2 may be formed by using an anisotropic dry etching process.

Figure 21:
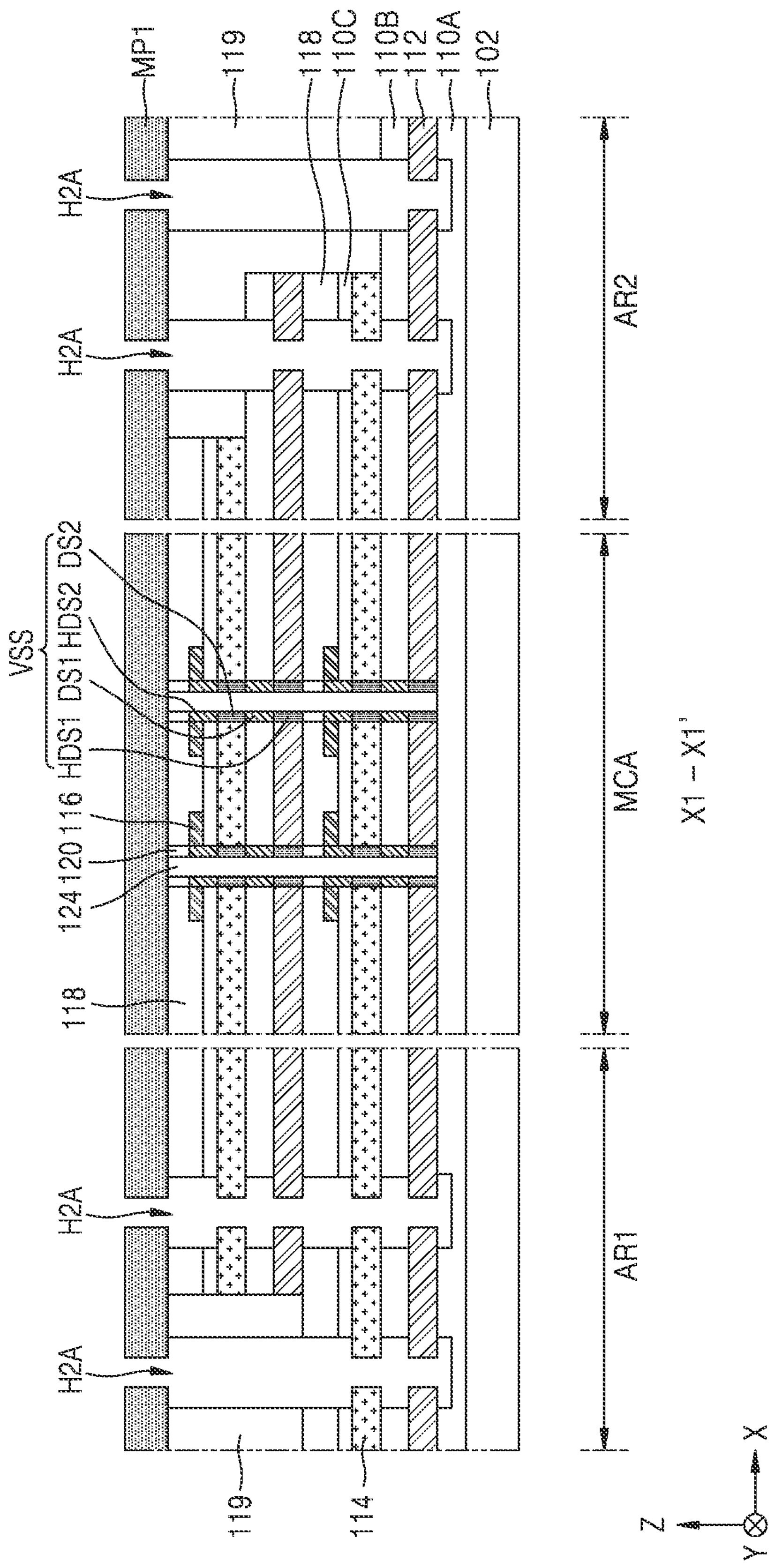

Referring to FIG. 21, in the resultant structure of FIG. 20, a portion of each of the plurality of insulating films 110A, 110B, and 110C, a plurality of inter-cell insulating films 118, and the mold insulating film 119 that are exposed through the plurality of contact holes H2 may be selectively removed. Thus, respective partial regions of the plurality of contact holes H2 may be expanded in a lateral direction (or a direction along an X-Y plane) and the vertical direction (Z direction) to form a plurality of expanded contact holes H2A. The plurality of expanded contact holes H2A may be formed by using a wet etching process.

Figure 22A:
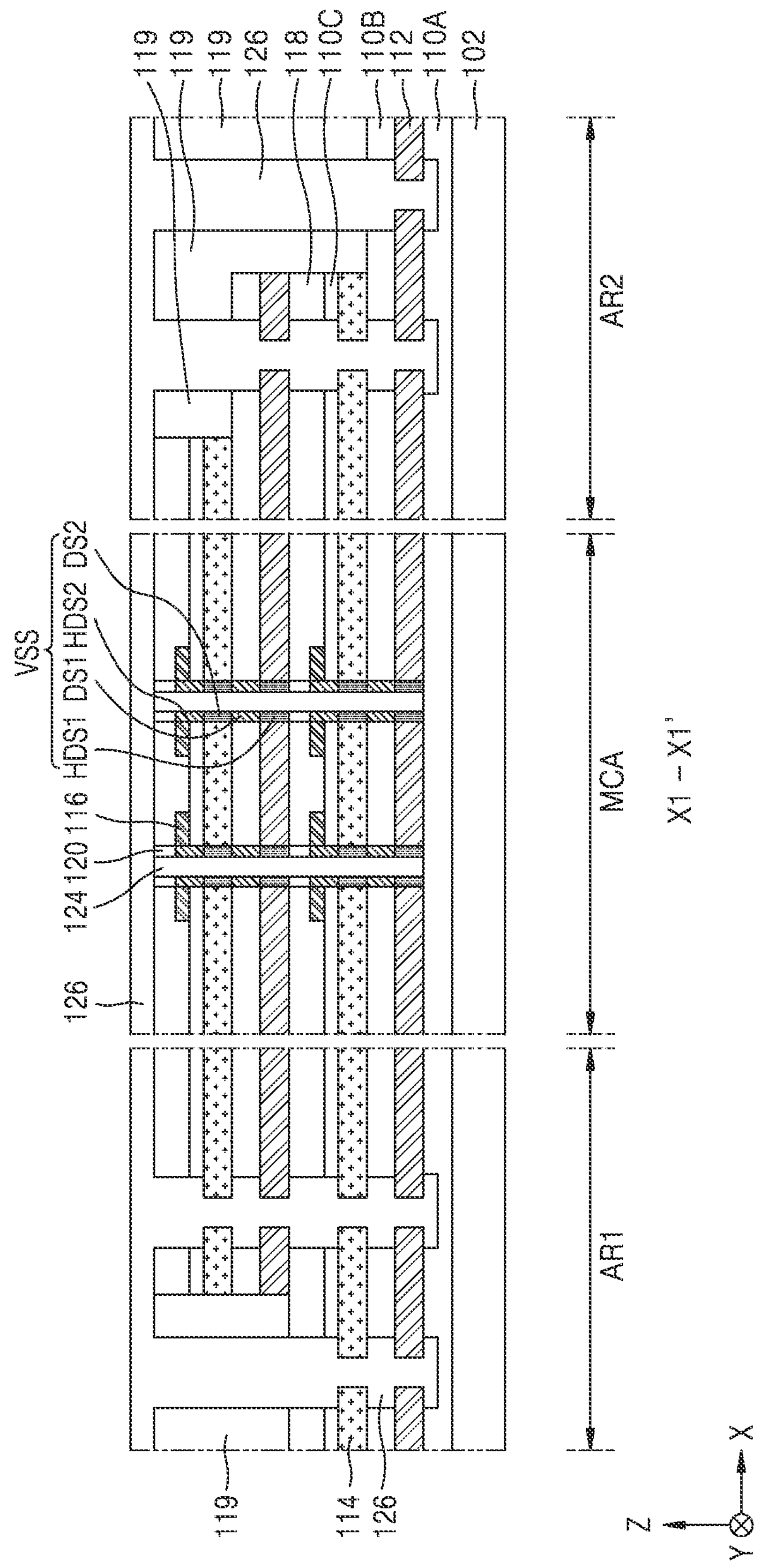
Figure 22B:
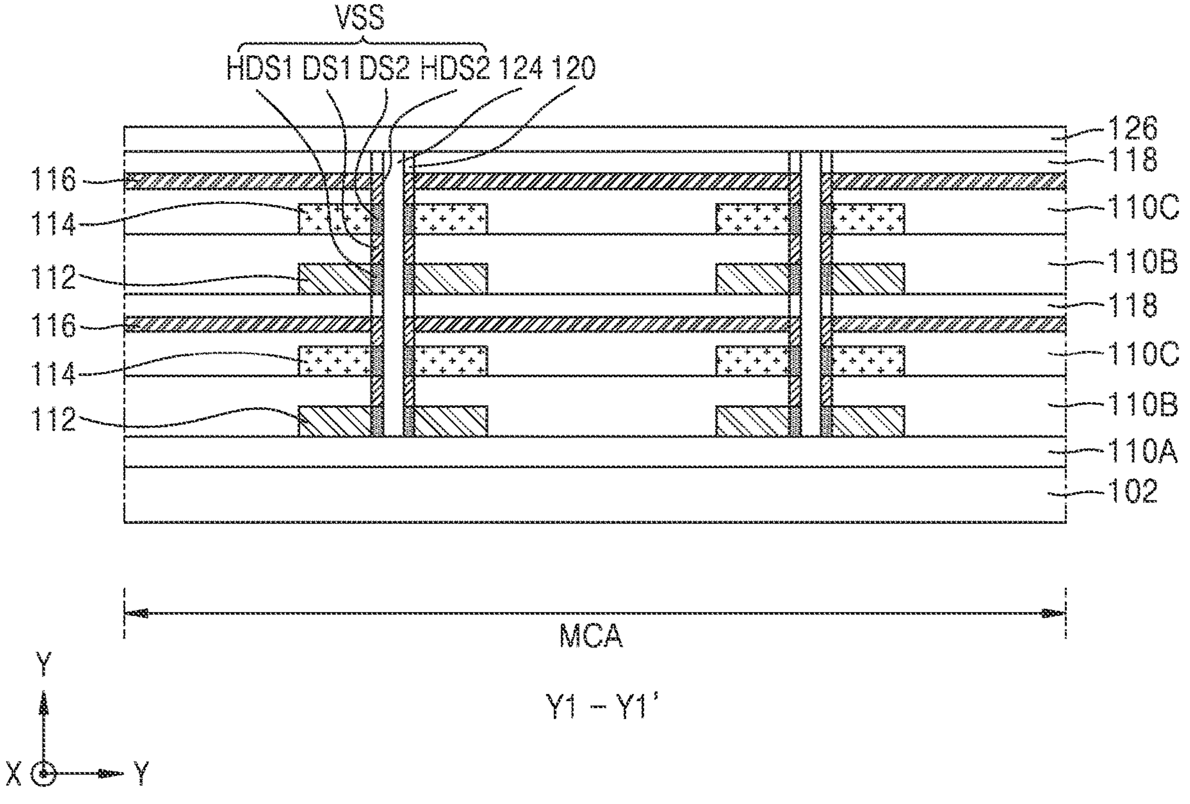

Referring to FIGS. 22A and 22B, the mask pattern MP1 may be removed from the resultant structure of FIG. 21 to expose the top surface of each of an uppermost one of the inter-cell insulating films 118 and the mold insulating film 119. Thereafter, a buried insulating film 126 may be formed fill the plurality of expanded contact holes H2A and cover the top surface of each of the uppermost one of the inter-cell insulating films 118 and the mold insulating film 119.

Figure 23:
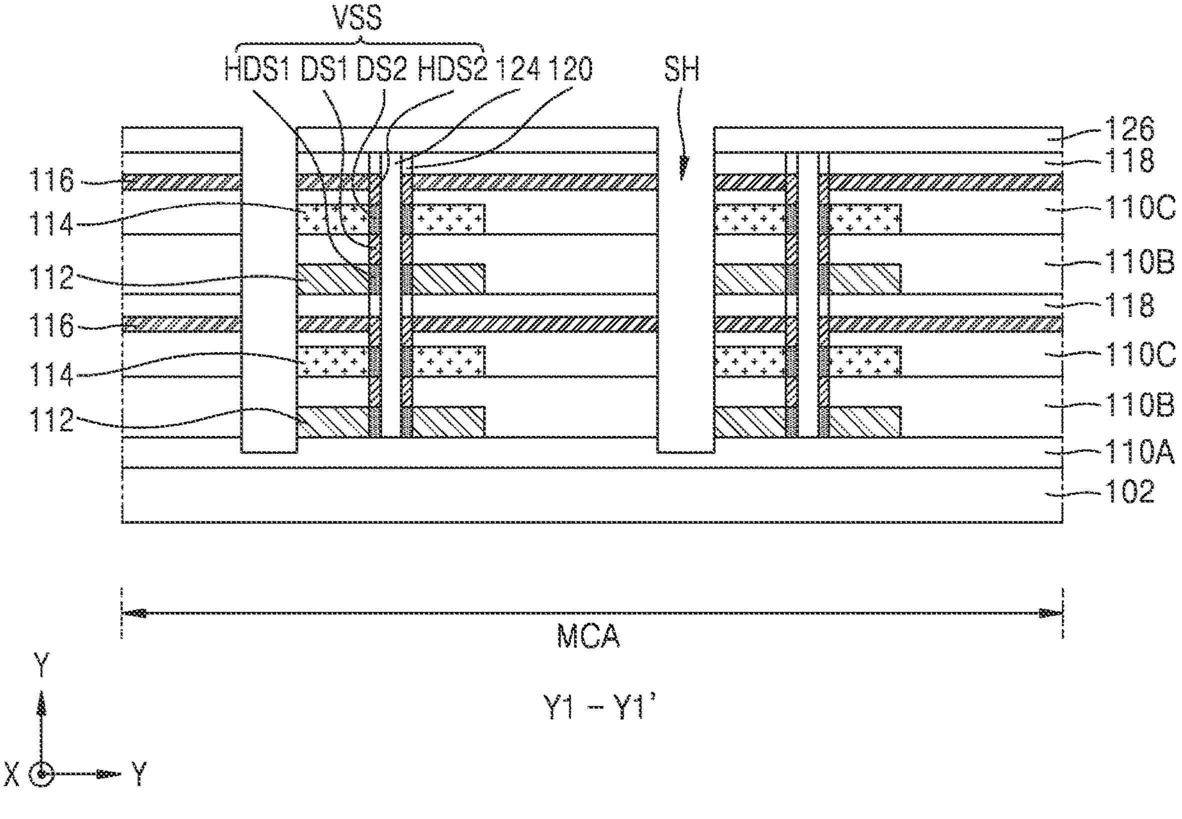

Referring to FIG. 23, partial regions may be etched from the resultant structure of FIGS. 22A and 22B in the memory cell array unit MCA. Thus, a plurality of slits SH, each of which has a bar-type planar shape extending long in a first lateral direction (X direction), may be formed. The insulating film 110A closest to the substrate 102 may be exposed at the bottom of each of the plurality of slits SH. The plurality of first sacrificial patterns 112, the plurality of second sacrificial patterns 114, and the plurality of third sacrificial patterns 116 may be exposed at respective inner sidewalls of the plurality of slits SH.

Figure 24A:
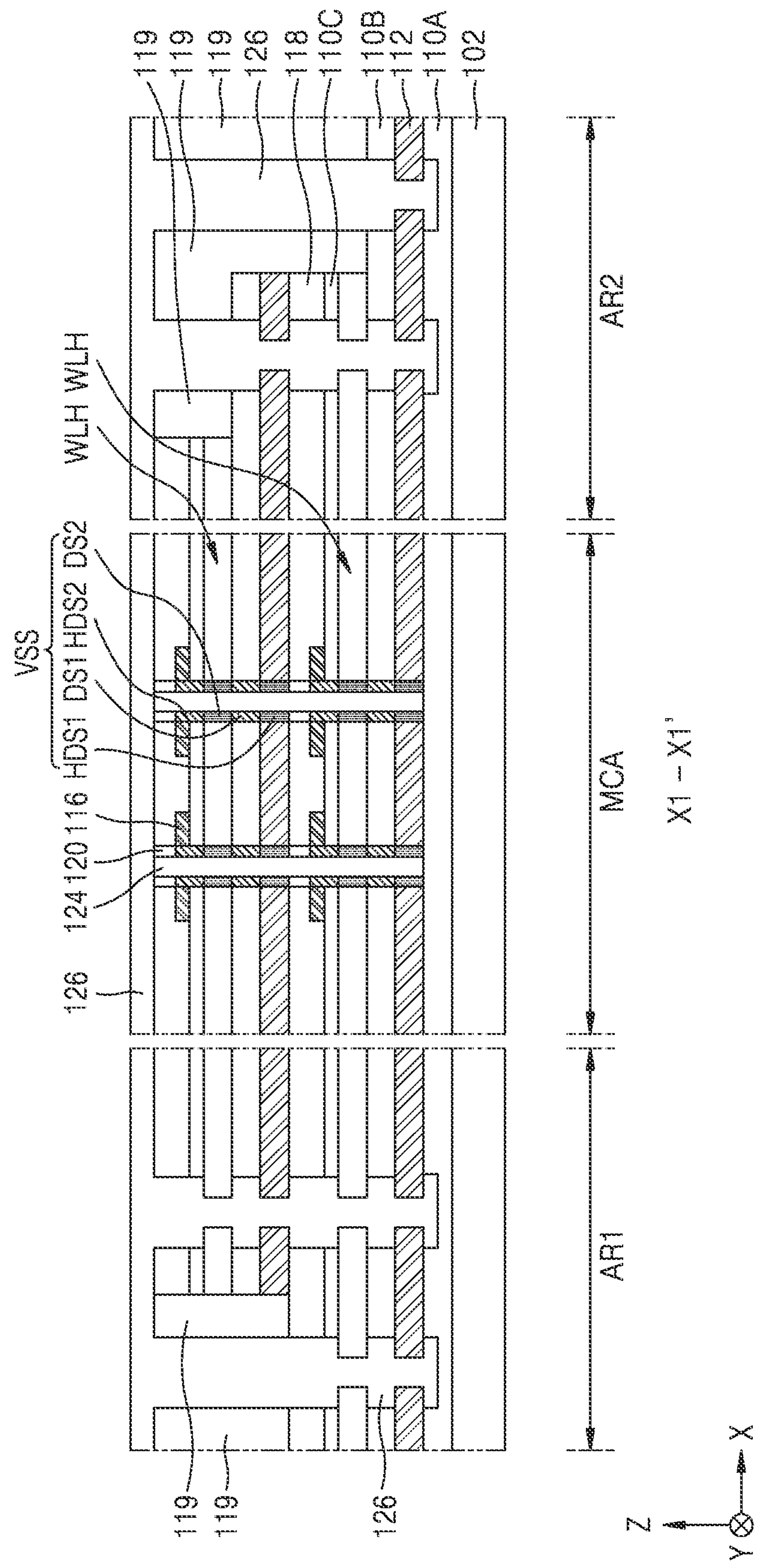
Figure 24B:
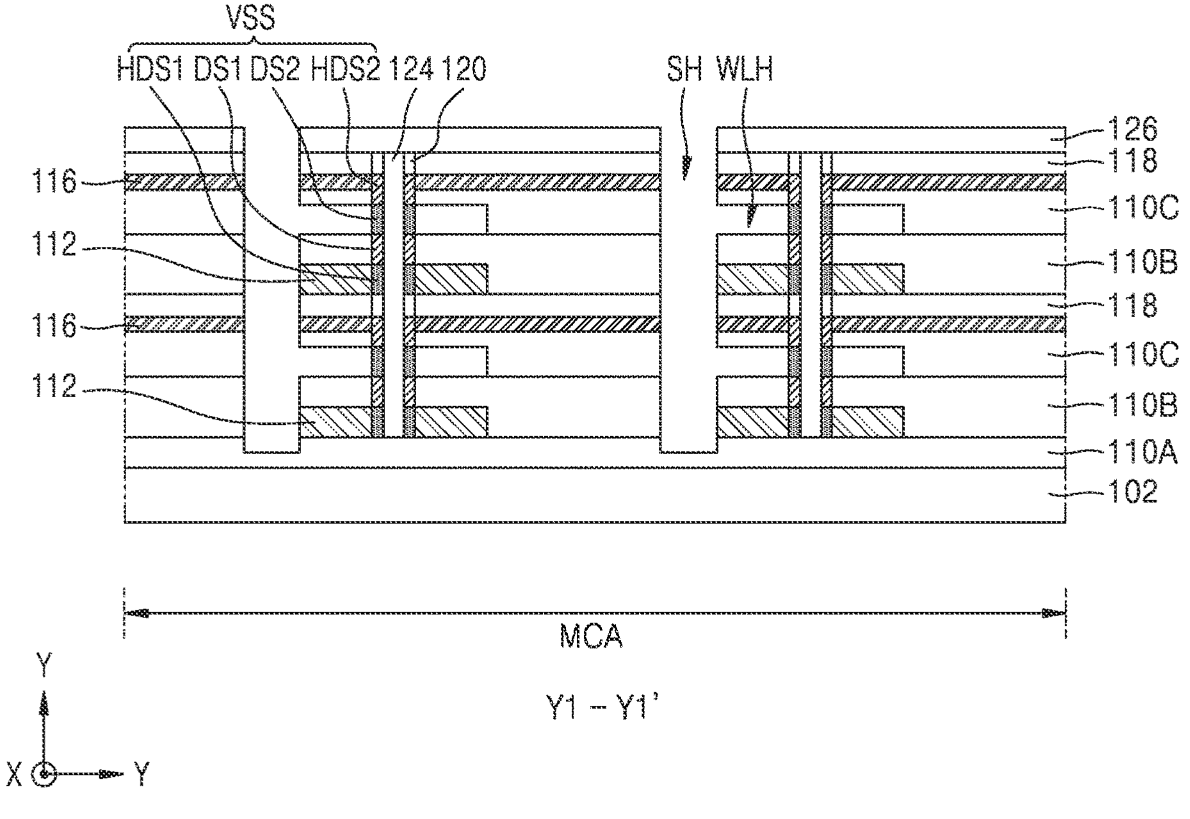

Referring to FIGS. 24A and 24B, the plurality of second sacrificial patterns 114 may be selectively removed through the plurality of slits SH, and thus, a plurality of word line spaces WLH may be formed. The plurality of second sacrificial patterns 114 may be selectively removed by using a wet etching process. The first lightly doped film DS1 may be exposed in the plurality of word line spaces WLH.

Figure 25A:
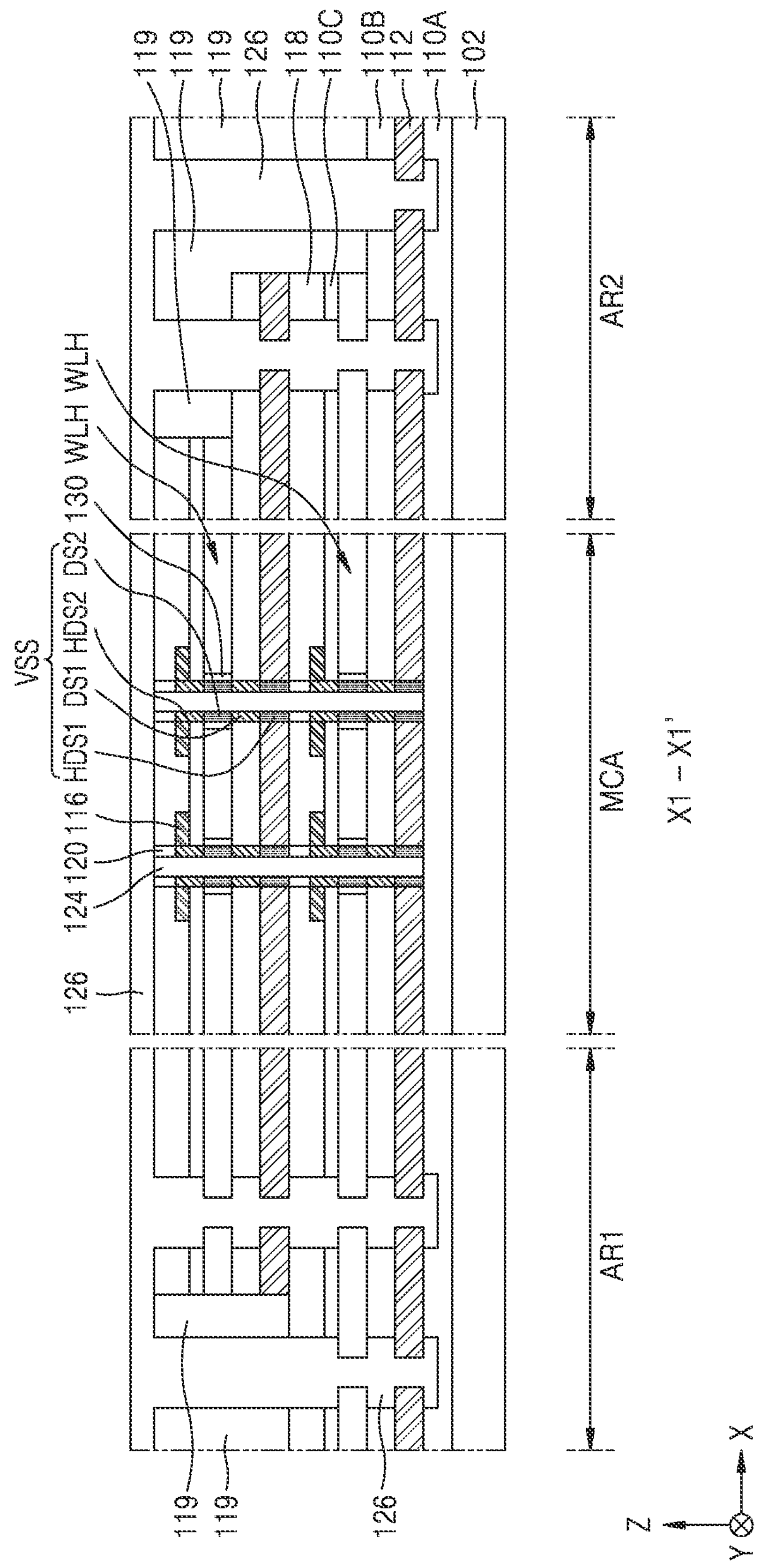
Figure 25B:
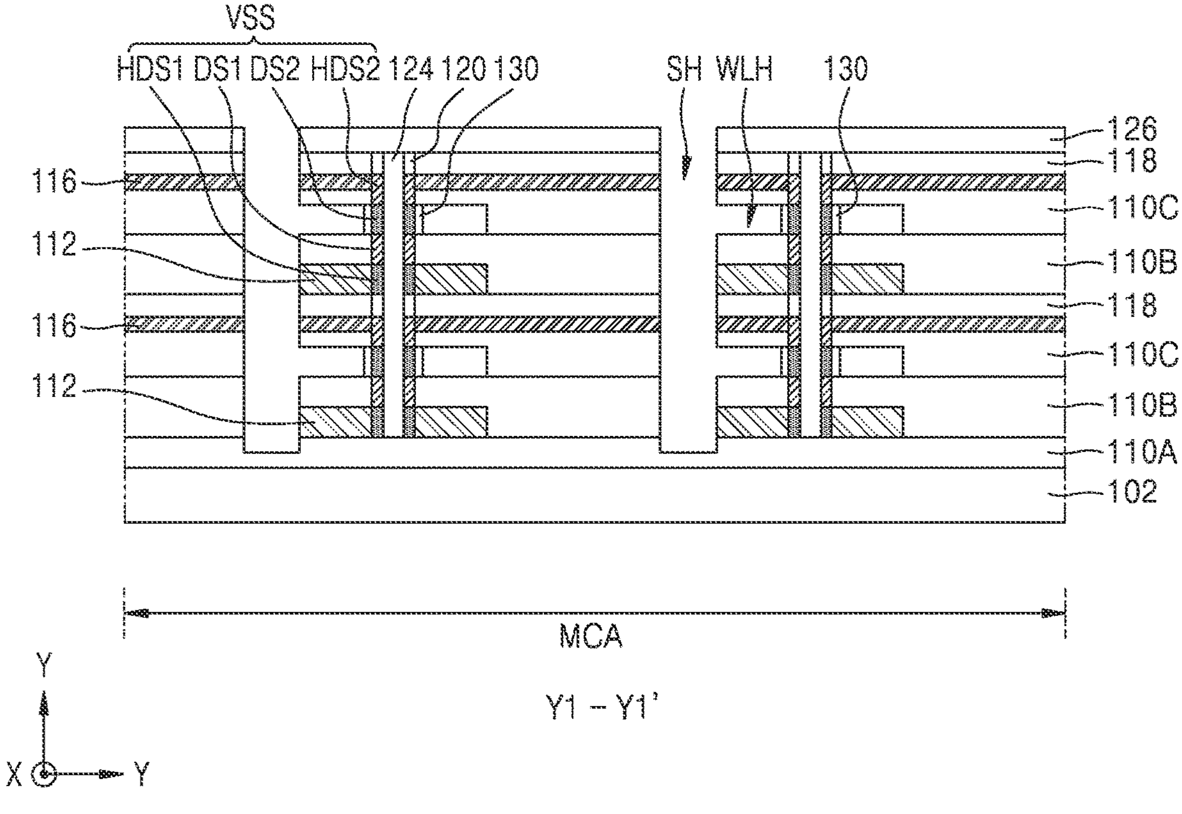

Referring to FIGS. 25A and 25B, a gate dielectric film 130 may be formed to cover a surface of the first lightly doped film DS1, which is exposed in the plurality of word line spaces WLH. In embodiments, the gate dielectric film 130 may be formed by using a selective atomic layer deposition (ALD) process.

In other embodiments, the gate dielectric film 230 shown in FIGS. 3A to 3D may be formed instead of the gate dielectric film 130. The formation of the gate dielectric film 230 may include forming the gate dielectric film 230 by using an ALD process to conformally cover exposed surfaces in the resultant structure of FIGS. 24A and 24B and removing other portions excluding portions of the gate dielectric film 230 that are inside the plurality of word line spaces WLH.

Figure 26A:
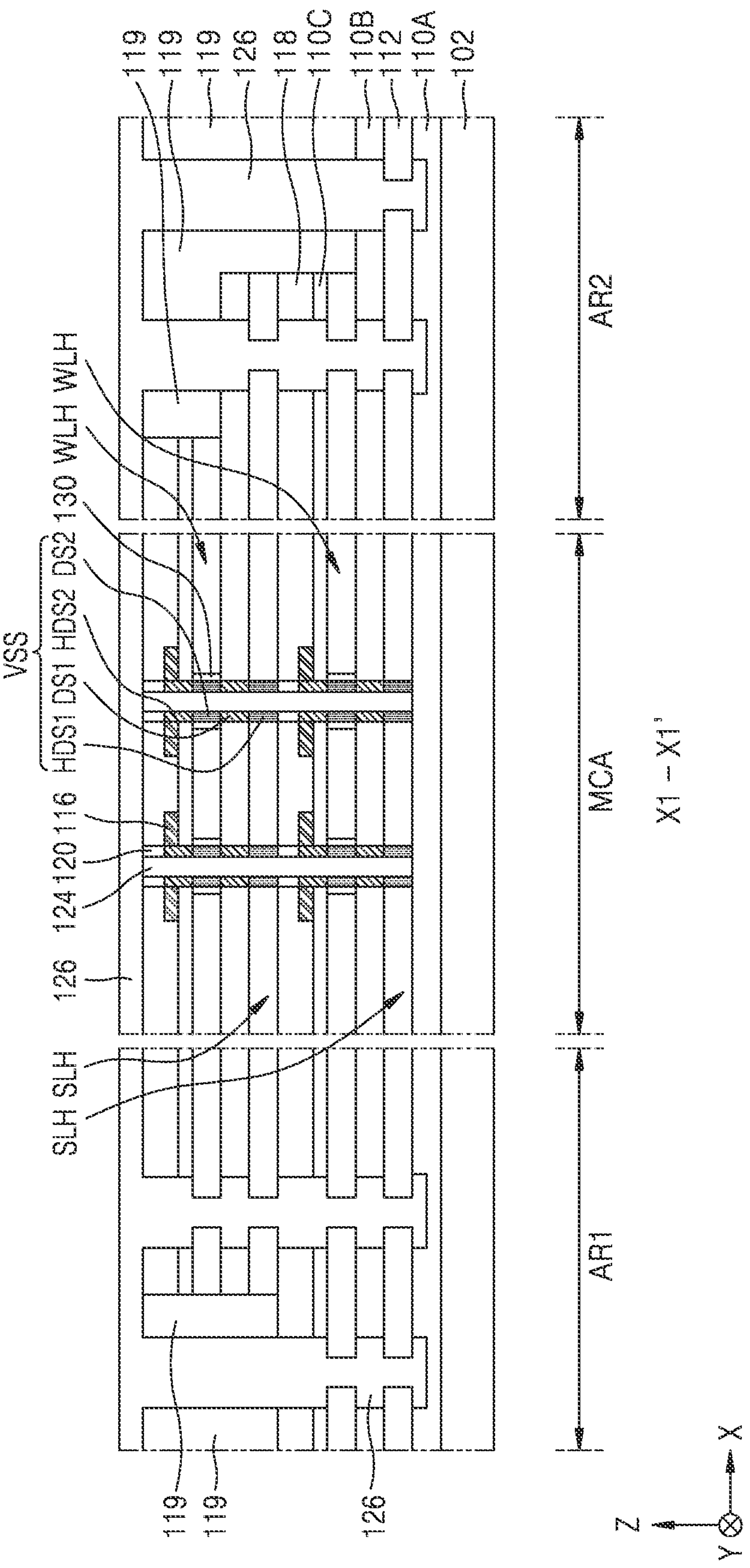
Figure 26B:
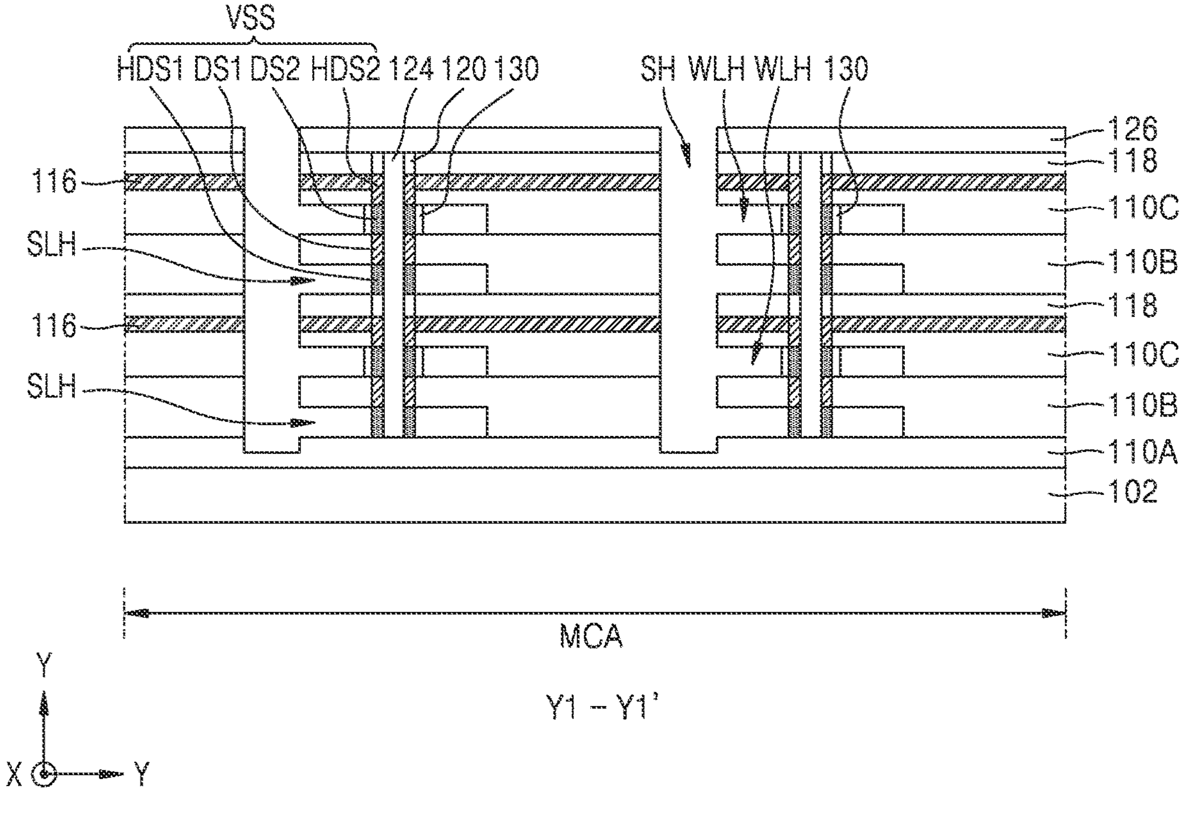

Referring to FIGS. 26A and 26B, the plurality of first sacrificial patterns 112 may be selectively removed through the plurality of slits SH, and thus, a plurality of sensing line spaces SLH may be formed. The plurality of first sacrificial patterns 112 may be selectively removed by using a wet etching process. The first heavily doped film HDS1 may be exposed in the plurality of sensing line spaces SLH.

Figure 27A:
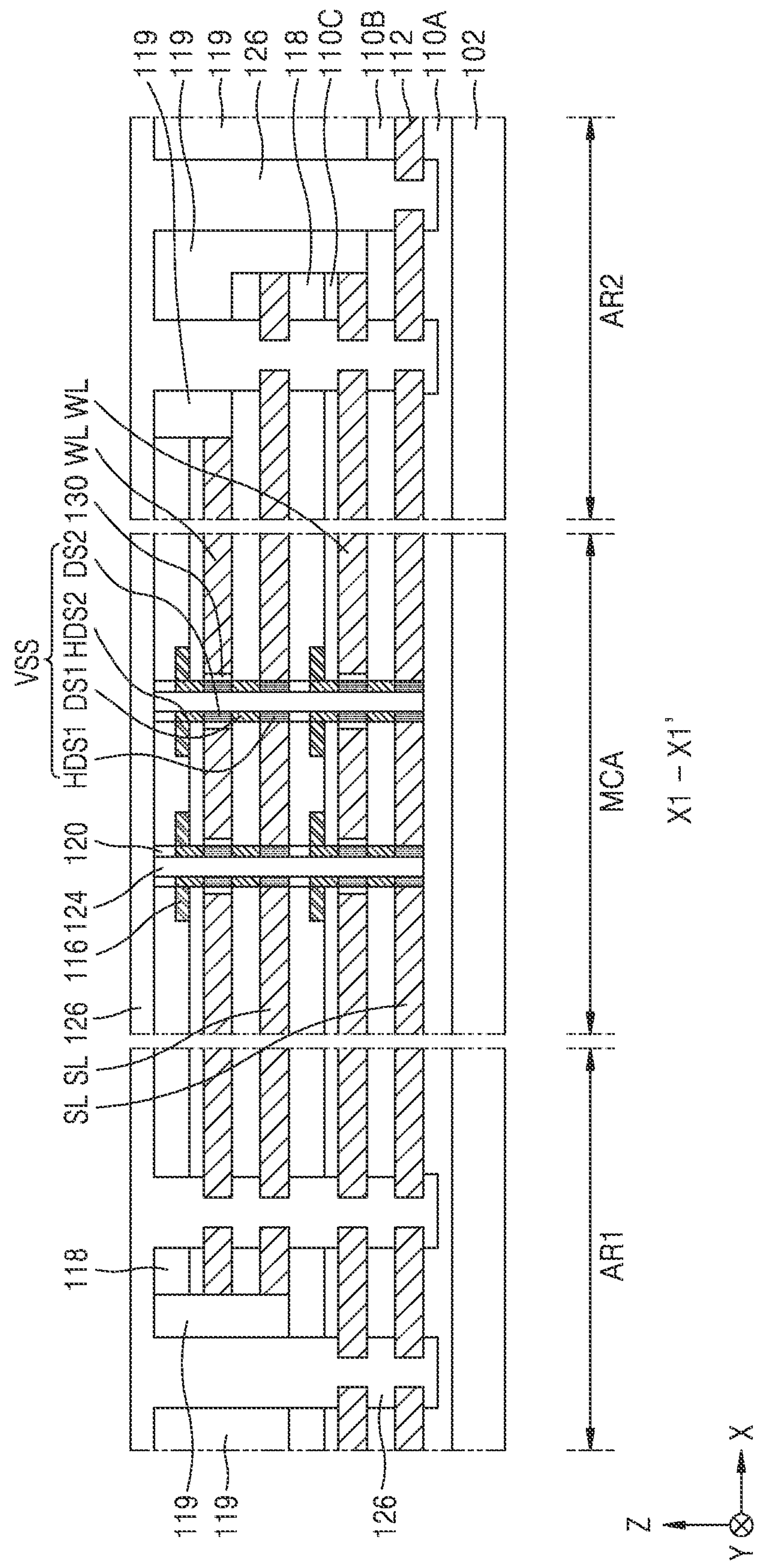
Figure 27B:
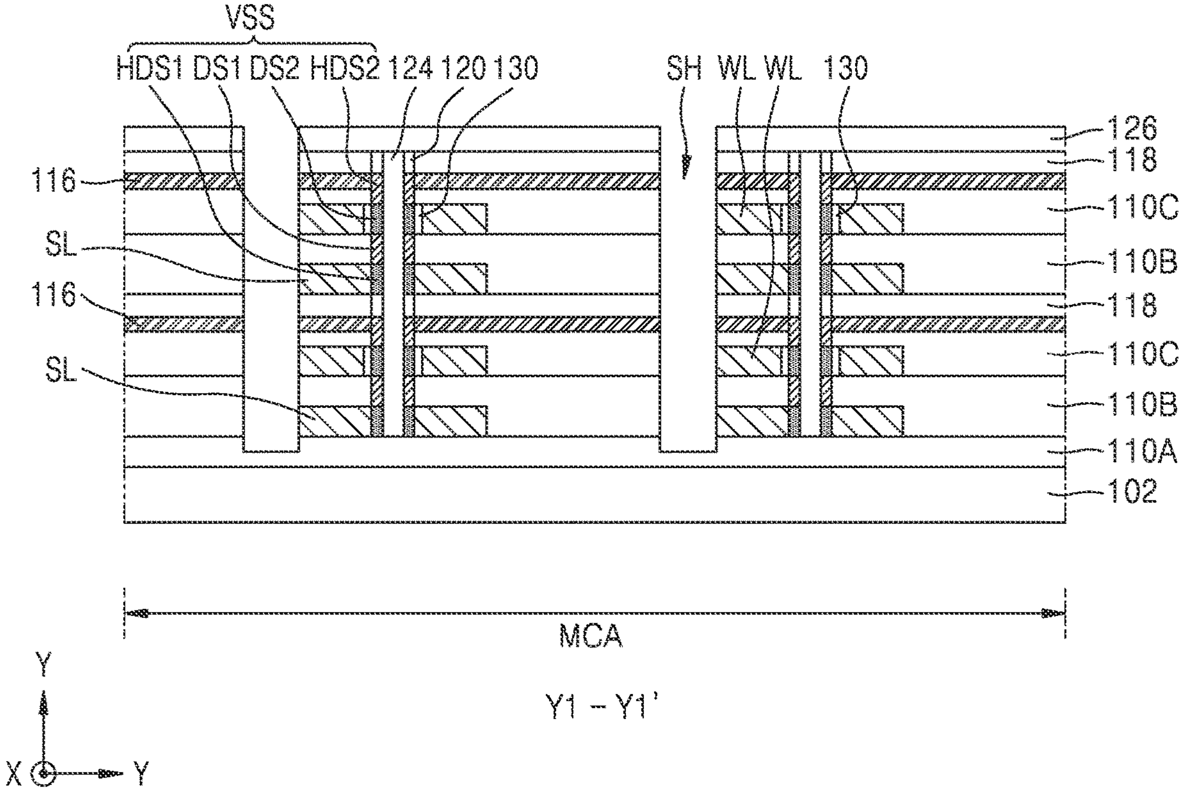

Referring to FIGS. 27A and 27B, in the resultant structure of FIGS. 26A and 26B, a plurality of word lines WL in the plurality of word line spaces WLH and a plurality of sensing lines SL in the plurality of sensing line spaces SLH may be formed.

The formation of the plurality of word lines WL and the plurality of sensing lines SL may include forming a conductive layer in the plurality of word line spaces WLH and the plurality of sensing line spaces SLH through the plurality of slits SH by using an ALD process or a chemical vapor deposition (CVD) process in the resultant structure of FIGS. 26A and 26B and removing unnecessary portions excluding portions of the conductive layer, which are respectively inside the plurality of word line spaces WLH and the plurality of sensing line spaces SLH. The conductive layer may include W, Al, Mo, Ru, Al, Co, Ti, TiN, Ta, TaN, WN, TiSiN, WSiN, doped polysilicon, or a combination thereof, without being limited thereto.

Figure 28:
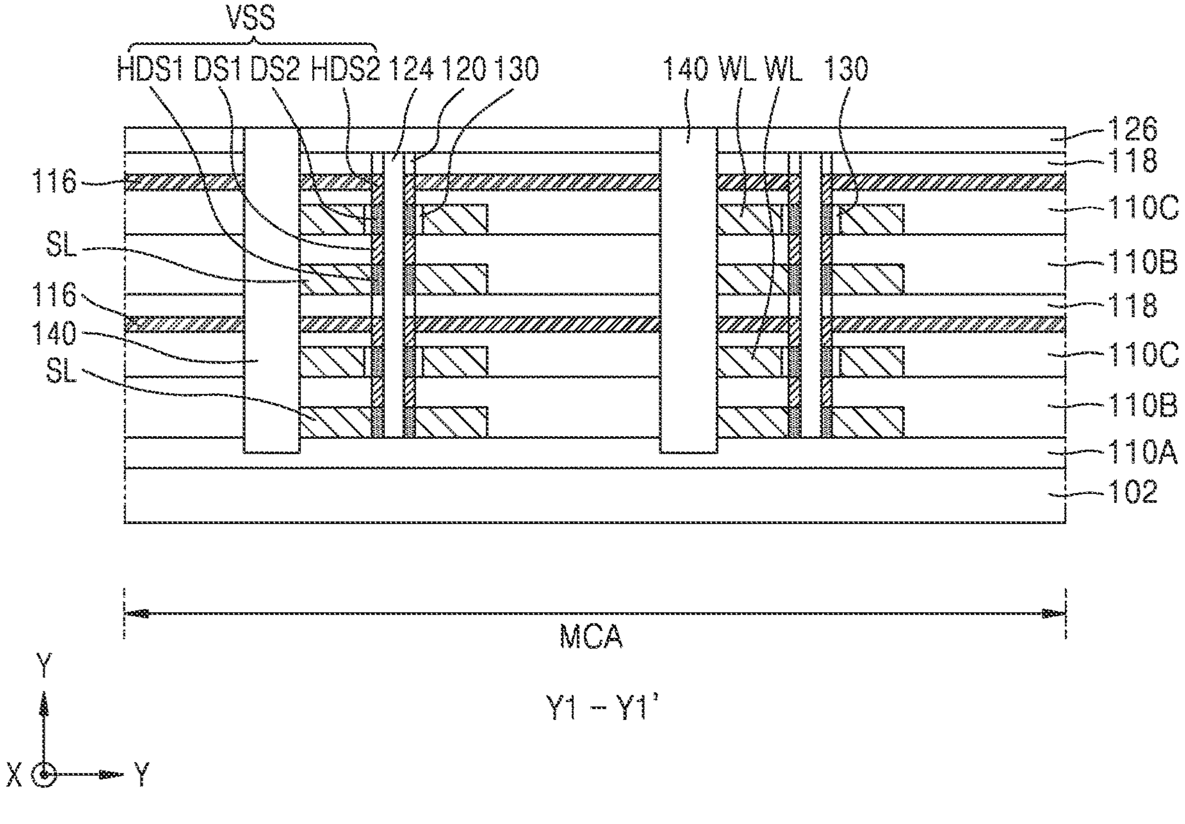

Referring to FIG. 28, in the resultant structure of FIGS. 27A and 27B, a plurality of isolation insulating films 140 may be formed to fill the plurality of slits SH. The formation of the plurality of isolation insulating films 140 may include forming a silicon oxide film having such a sufficient thickness as to fill the plurality of slits SH in the resultant structure of FIGS. 27A and 27B and removing a portion of the silicon oxide film to expose a top surface of the buried insulating film 126.

Figure 29:
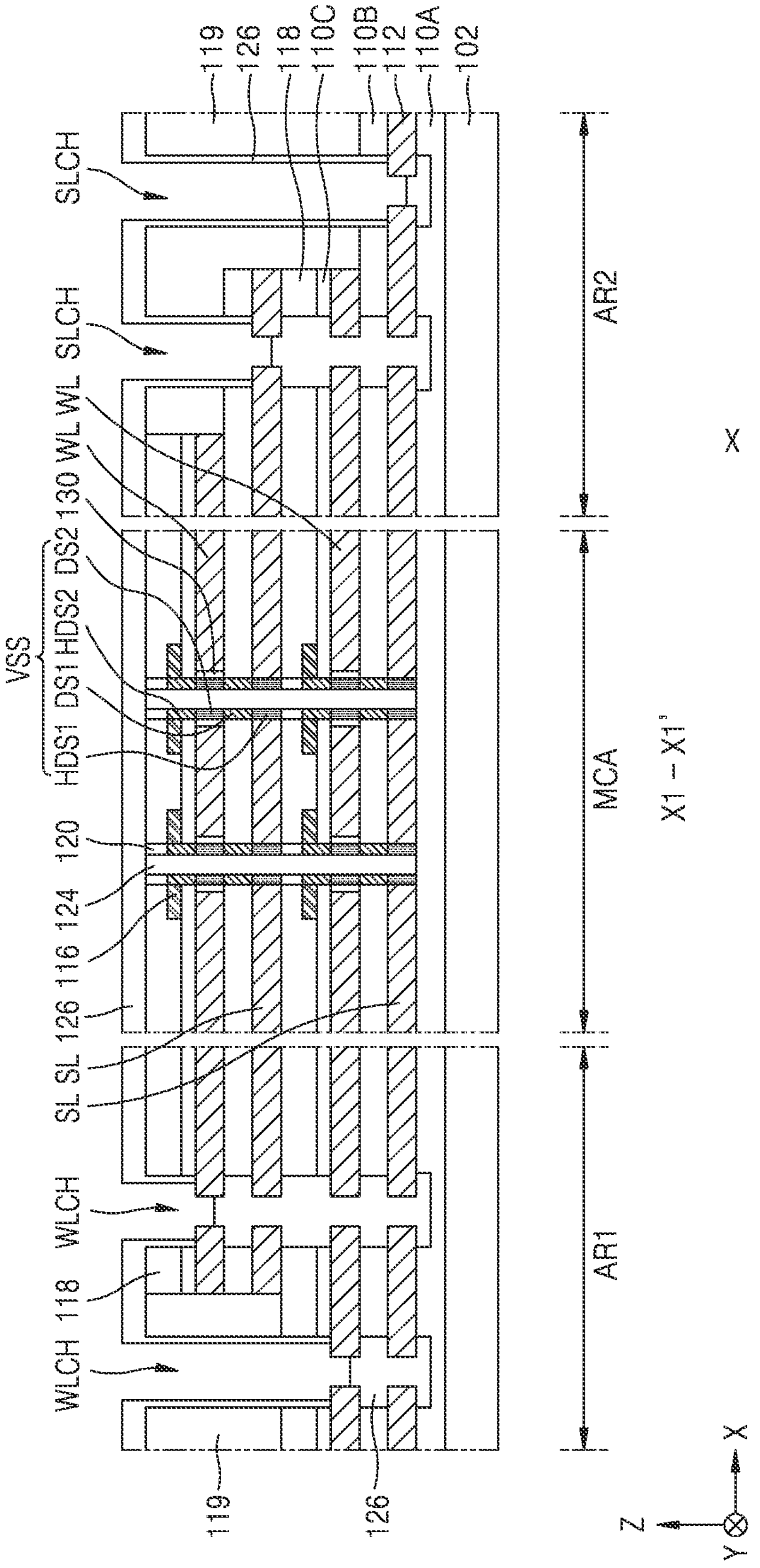

Referring to FIG. 29, a plurality of word line contact holes WLCH passing through an insulating structure including the buried insulating film 126 and the mold insulating film 119 in the vertical direction (Z direction) may be formed in the first connection unit AR1. A plurality of sensing line contacts SLCH passing through an insulating structure including the buried insulating film 126 and the mold insulating film 119 in the vertical direction (Z direction) may be formed in the second connection unit AR2.

The plurality of word lines WL and the buried insulating film 126 may be exposed through the plurality of word line contact holes WLCH in the first connection unit AR1, and the plurality of sensing lines SL and the buried insulating film 126 may be exposed through the plurality of sensing line contacts SLCH in the second connection unit AR2.

Figure 30:
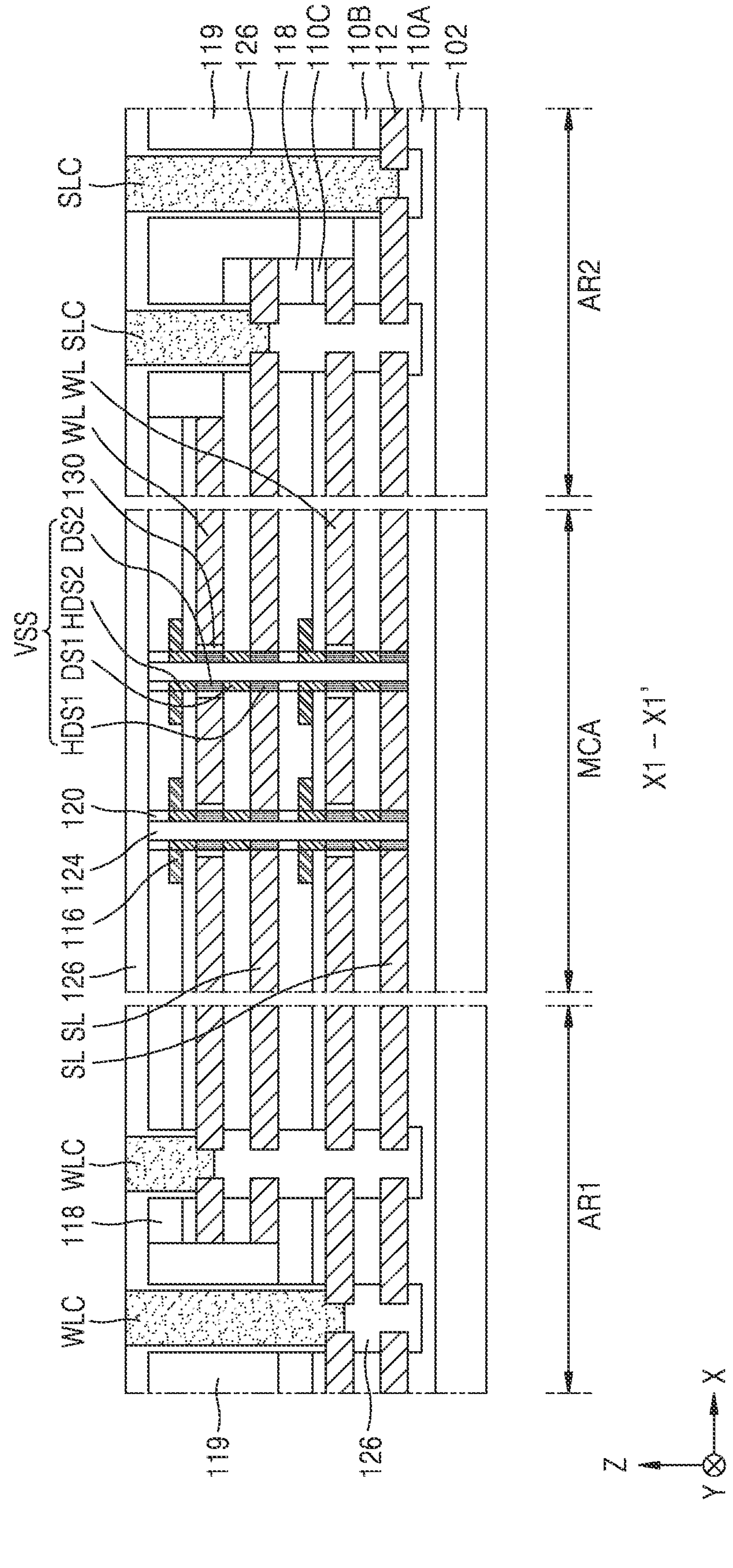

Referring to FIG. 30, a plurality of word line contacts WLC may be respectively formed inside the plurality of word line contact holes WLCH in the first connection unit AR1, and a plurality of sensing line contacts SLC may be respectively formed inside the plurality of sensing line contacts SLCH in the second connection unit AR2.

Figure 31:
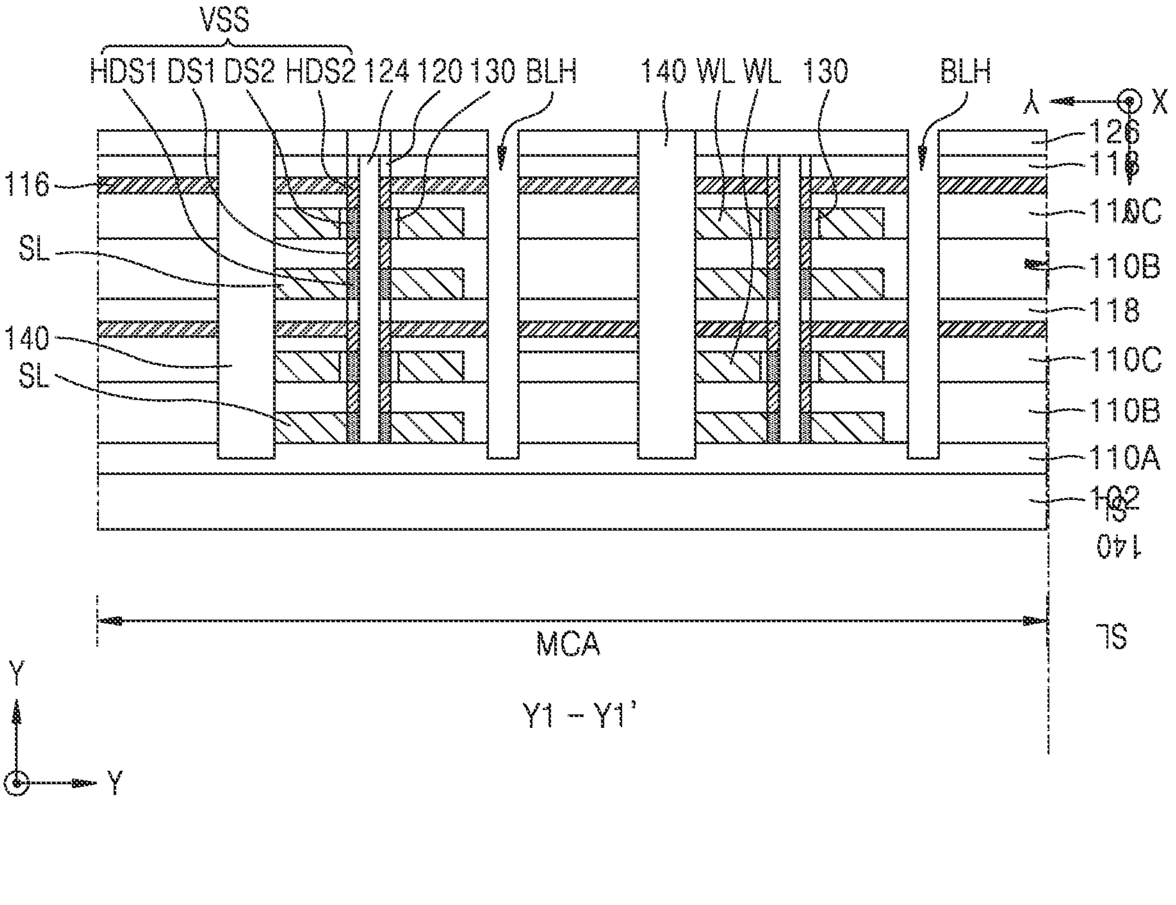

Referring to FIG. 31, in the memory cell array unit MCA, a plurality of bit line holes BLH passing through the plurality of insulating films 110A, 110B, and 110C, the plurality of third sacrificial patterns 116, the plurality of inter-cell insulating films 118, and the buried insulating film 126 in the vertical direction (Z direction) may be formed apart from the plurality of vertical semiconductor structures VSS in a lateral direction with the plurality of word lines WL and the plurality of sensing lines SL therebetween. The insulating film 110A closest to the substrate 102 may be exposed at the bottom of each of the plurality of bit line holes BLH. The plurality of bit line holes BLH may be formed by using an anisotropic dry etching process.

Figure 32A:
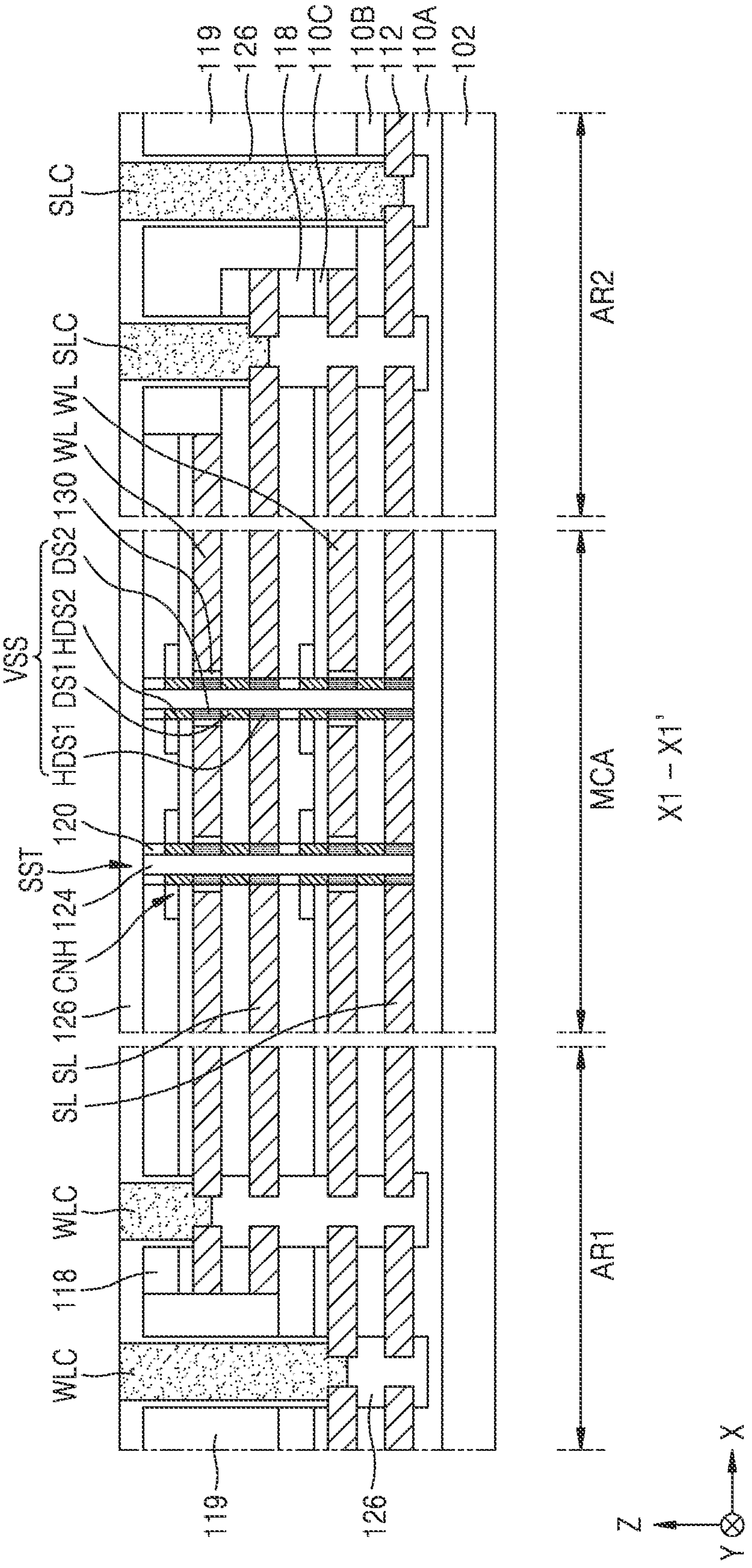
Figure 32B:
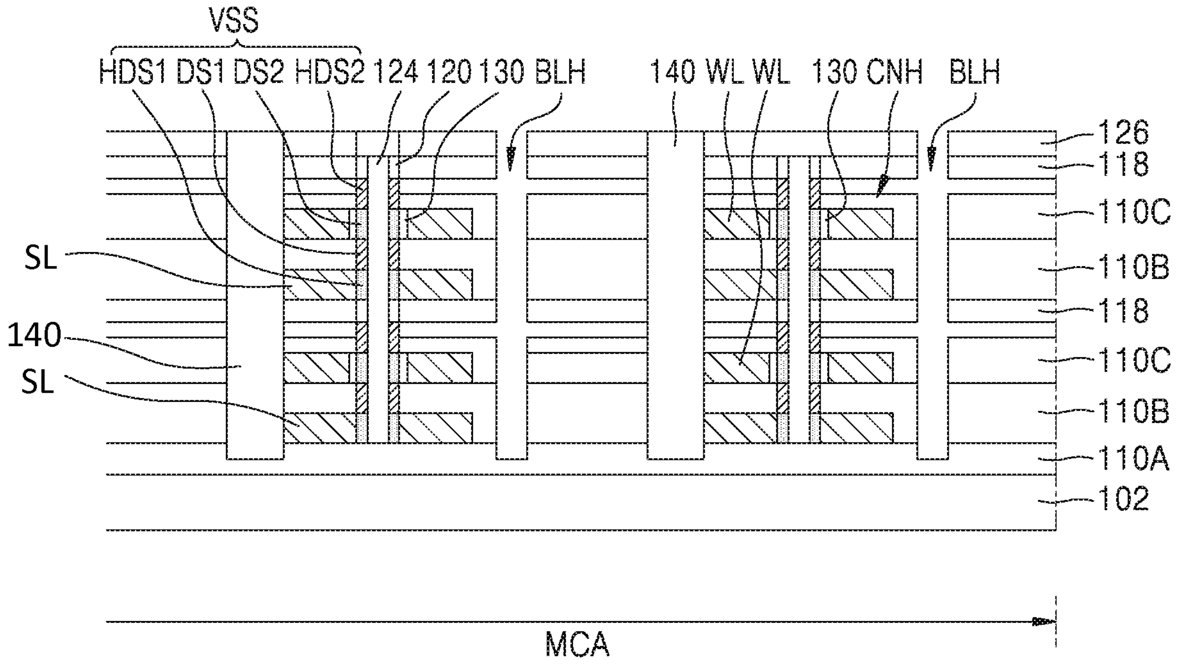

Referring to FIGS. 32A and 32B, in the resultant structure of FIG. 31, the plurality of third sacrificial patterns 116 may be selectively removed through the plurality of bit line holes BLH, and thus, a plurality of connection spaces CNH may be formed. The second heavily doped film HDS2 may be exposed in each of the plurality of connection spaces CNH.

Figure 33A:
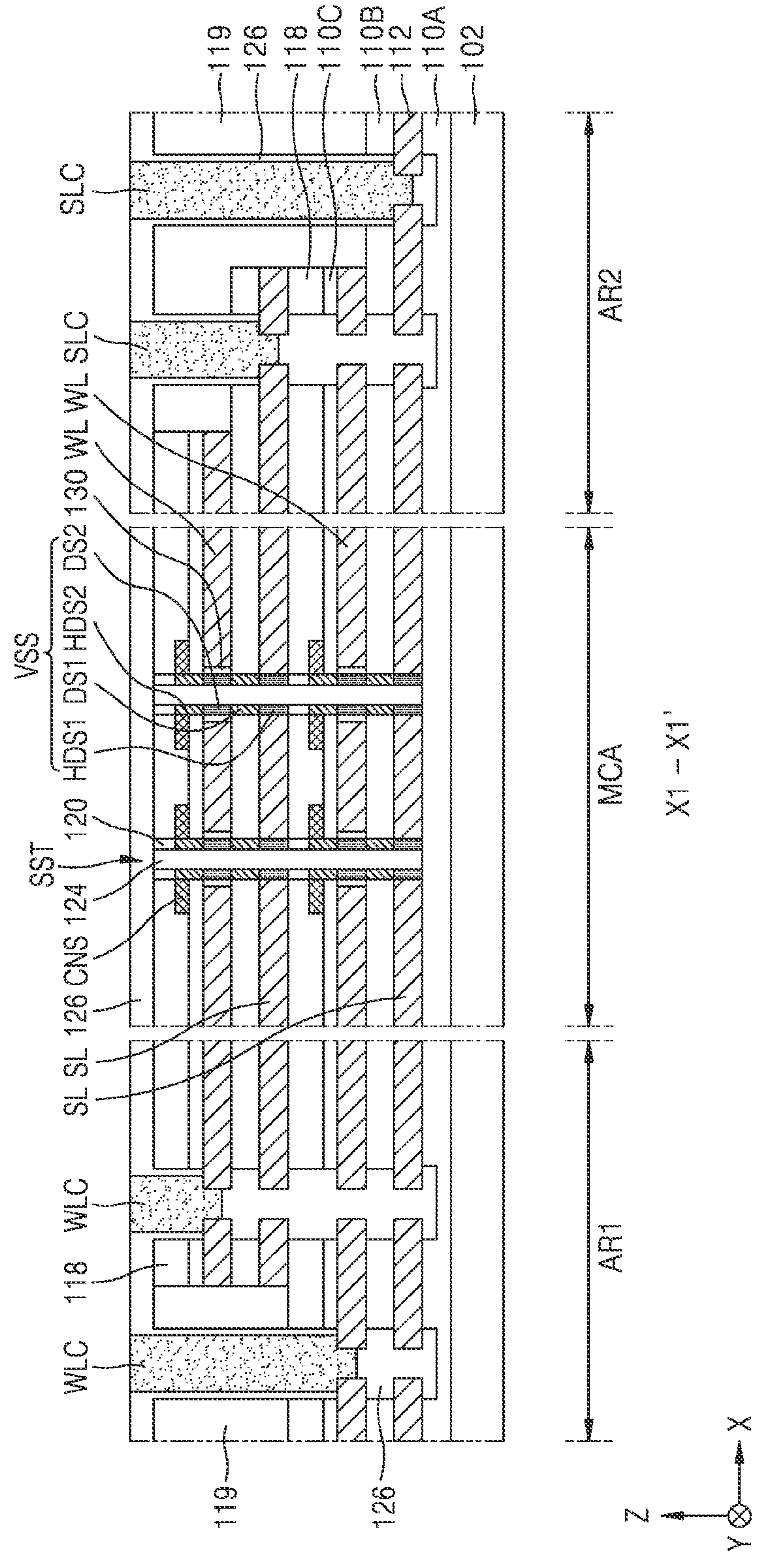
Figure 33B:
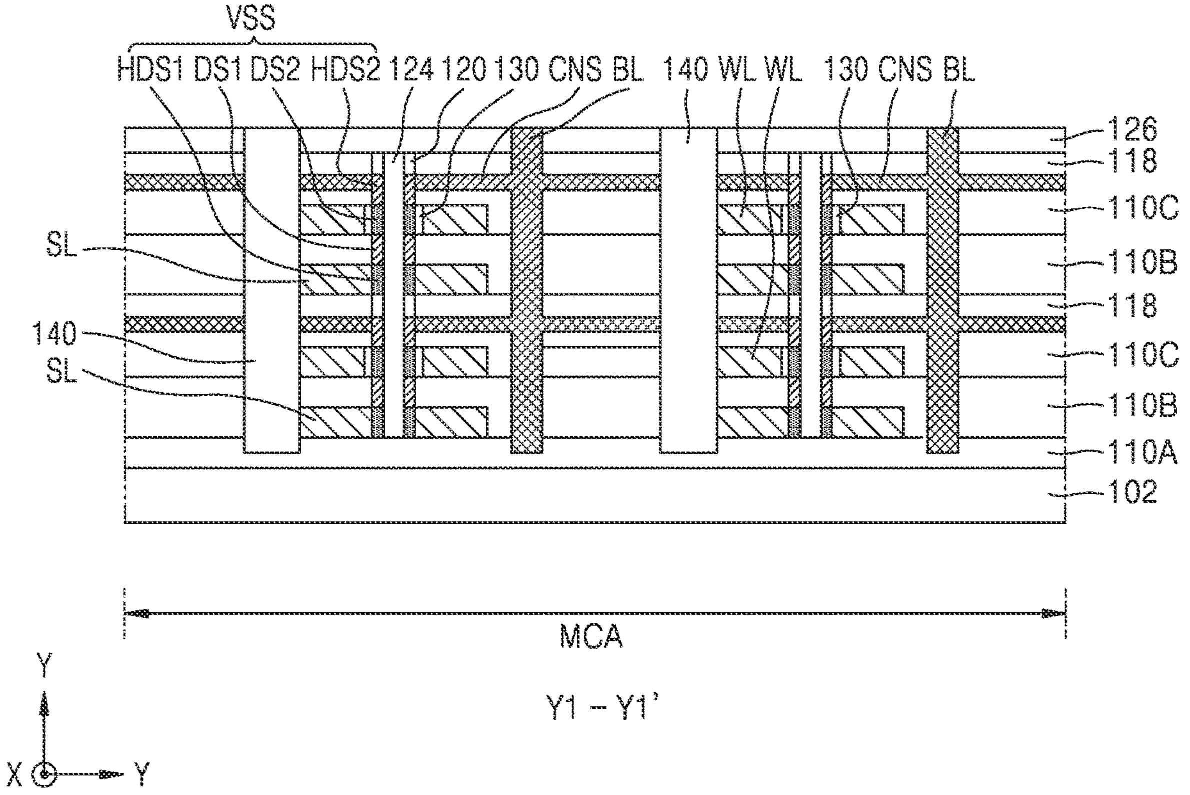

Referring to FIGS. 33A and 33B, in the resultant structure of FIGS. 32A and 32B, the plurality of connection spaces CNH and the plurality of bit line holes BLH may be filled by a conductive material, and thus, a plurality of conductive connection structures CNS and a plurality of bit lines BL may be formed.

Although methods of manufacturing the semiconductor memory device 100 shown in FIGS. 1 and 2A to 2D has been described with reference to FIGS. 13A to 33B, it will be understood that semiconductor memory devices having variously changed structures may be manufactured by applying various modifications and changes to the processes described with reference to FIGS. 13A to 33B within the scope of the present disclosure.

While aspects of embodiments have been particularly shown and described, it will be understood that various changes in form and details may be made therein without departing from the spirit and scope of the following claims.

What is claimed is:

1. A semiconductor memory device comprising:

a word line extending in a lateral direction;

a sensing line apart from the word line, the sensing line overlapping the word line in a vertical direction and extending in the lateral direction;

a vertical semiconductor structure passing through the word line and the sensing line in the vertical direction, the vertical semiconductor structure having a vertical channel region facing the word line in the lateral direction; and a gate dielectric film between the vertical channel region and the word line, wherein the vertical semiconductor structure comprises a first heavily doped film of a first conductivity type, a first lightly doped film of a second conductivity type, a second lightly doped film of the first conductivity type, and a second heavily doped film of the second conductivity type, which are sequentially provided in the vertical direction, wherein the vertical channel region comprises the first lightly doped film or the second lightly doped film, and wherein the sensing line is in contact with the first heavily doped film of the vertical semiconductor structure.

2. The semiconductor memory device of claim 1, further comprising an insulating pillar passing through the vertical semiconductor structure in the vertical direction, the insulating pillar being apart from each of the word line and the sensing line in the lateral direction, wherein each of the first heavily doped film, the first lightly doped film, the second lightly doped film, and the second heavily doped film defines a hollow accommodating the insulating pillar.

3. The semiconductor memory device of claim 1, further comprising a bit line apart from each of the word line and the sensing line in the lateral direction, the bit line being connected to the second heavily doped film.

4. The semiconductor memory device of claim 3, wherein the bit line extends long in the vertical direction and faces the vertical semiconductor structure in the lateral direction with the word line and the sensing line therebetween.

5. The semiconductor memory device of claim 1, wherein, in the vertical semiconductor structure, the first heavily doped film comprises an $n^+$ doping region, the first lightly doped film comprises a p doping region, the second lightly doped film comprises an n doping region, and the second heavily doped film comprises a $p^+$ doping region, wherein the vertical channel region comprises the n doping region, and wherein the word line faces the n doping region in the lateral direction with the gate dielectric film therebetween.

6. The semiconductor memory device of claim 1, wherein, in the vertical semiconductor structure, the first heavily doped film comprises an $n^+$ doping region, the first lightly doped film comprises a p doping region, the second lightly doped film comprises an n doping region, and the second heavily doped film comprises a $p^+$ doping region, wherein the vertical channel region comprises the p doping region, and wherein the word line faces the p doping region in the lateral direction with the gate dielectric film therebetween.

7. The semiconductor memory device of claim 1, further comprising:

a conductive connection structure in contact with and surrounding the second heavily doped film; and a bit line connected to the second heavily doped film through the conductive connection structure, wherein the bit line is apart from each of the word line and the sensing line in the lateral direction, and extends long in the vertical direction.

8. The semiconductor memory device of claim 1, further comprising:

a conductive connection structure in contact with and surrounding the second heavily doped film; and a bit line connected to the second heavily doped film through the conductive connection structure, wherein the bit line passes through each of the word line and the sensing line in the vertical direction, and is apart from each of the word line and the sensing line.

9. A semiconductor memory device comprising a memory cell string comprising a plurality of memory cells arranged in a line in a vertical direction, wherein each of the plurality of memory cells comprises:

a word line extending in a lateral direction;

a sensing line apart from the word line, the sensing line overlapping the word line in the vertical direction and extending in the lateral direction;

a vertical semiconductor structure passing through the word line and the sensing line in the vertical direction, the vertical semiconductor structure having a vertical channel region facing the word line in the lateral direction; and a gate dielectric film between the vertical channel region and the word line, wherein, in each of the plurality of memory cells, the vertical semiconductor structure comprises a first heavily doped film of a first conductivity type, a first lightly doped film of a second conductivity type, a second lightly doped film of the first conductivity type, and a second heavily doped film of the second conductivity type, which are sequentially provided in the vertical direction, wherein the vertical channel region comprises the first lightly doped film or the second lightly doped film in each of the plurality of memory cells, and wherein the sensing line is in contact with the first heavily doped film of the vertical semiconductor structure in each of the plurality of memory cells.

10. The semiconductor memory device of claim 9, further comprising a bit line apart from each of the word line and the sensing line in the lateral direction, the bit line extending long in the vertical direction, and the bit line facing the vertical semiconductor structure of each of the plurality of memory cells in the lateral direction with the word line and the sensing line therebetween, wherein the plurality of memory cells share the bit line.

11. The semiconductor memory device of claim 9, wherein each of the plurality of memory cells comprises one transistor and does not comprise a capacitor.

12. The semiconductor memory device of claim 9, further comprising an insulating pillar passing through the vertical semiconductor structure of each of the plurality of memory cells in the vertical direction, wherein, in each of the plurality of memory cells, each of the first heavily doped film, the first lightly doped film, the second lightly doped film, and the second heavily doped film defines a hollow that accommodates the insulating pillar.

13. The semiconductor memory device of claim 9, further comprising a plurality of inter-cell insulating structures, each of the plurality of inter-cell insulating structures being between two adjacent ones of the plurality of memory cells, wherein the vertical semiconductor structure of each of the plurality of memory cells extends in a straight line in the vertical direction, and wherein the vertical semiconductor structure of a first memory cell of the plurality of memory cells is apart from the vertical semiconductor structure of a second memory cell of the plurality of memory cells that is adjacent to the first memory cell, in the vertical direction with one of the plurality of inter-cell insulating structures therebetween.

14. The semiconductor memory device of claim 9, wherein the lateral direction is a first lateral direction, and a second lateral direction crosses the first lateral direction, and wherein the semiconductor memory device further comprises:

a word line contact apart from the vertical semiconductor structure of each of the plurality of memory cells in the first lateral direction and connected to the word line;

a sensing line contact apart from the vertical semiconductor structure of each of the plurality of memory cells in the first lateral direction, the sensing line contact being apart from the word line contact in the first lateral direction with the vertical semiconductor structure therebetween; and a bit line apart from the word line and the sensing line in the second lateral direction, the bit line extending long in the vertical direction.

15. The semiconductor memory device of claim 9, wherein, in the vertical semiconductor structure of each of the plurality of memory cells, the first heavily doped film comprises an $n^+$ doping region, the first lightly doped film comprises a p doping region, the second lightly doped film comprises an n doping region, and the second heavily doped film comprises a $p^+$ doping region, wherein the vertical channel region comprises the n doping region, and wherein the word line faces the n doping region in the lateral direction with the gate dielectric film therebetween.

16. The semiconductor memory device of claim 9, wherein, in the vertical semiconductor structure of each of the plurality of memory cells, the first heavily doped film comprises an $n^+$ doping region, the first lightly doped film comprises a p doping region, the second lightly doped film comprises an n doping region, and the second heavily doped film comprises a $p^+$ doping region, wherein the vertical channel region comprises the p doping region, and wherein the word line faces the p doping region in the lateral direction with the gate dielectric film therebetween.

17. A semiconductor memory device comprising a memory cell array comprising a plurality of memory cells three-dimensionally and repeatedly arranged on a substrate in a first lateral direction, a second lateral direction, and a vertical direction, wherein the first lateral direction crosses the second lateral direction, and the vertical direction is perpendicular to each of the first lateral direction and the second lateral direction, wherein the memory cell array comprises:

a plurality of sensing lines and a plurality of word lines alternately arranged, one-by-one, in the vertical direction, the plurality of sensing lines and the plurality of word lines being apart from each other in the vertical direction;

a plurality of insulating films respectively between the plurality of sensing lines and the plurality of word lines;

a stack structure passing through the plurality of sensing lines, the plurality of word lines, and the plurality of insulating films in the vertical direction, the stack structure comprising a plurality of vertical semiconductor structures overlapping each other in the vertical direction, each of the plurality of vertical semiconductor structures having a vertical channel region;

an insulating pillar passing through the plurality of vertical semiconductor structures in the vertical direction;

a plurality of gate dielectric films between respective vertical channel regions of the plurality of vertical semiconductor structures and the plurality of word lines; and a plurality of bit lines passing through the plurality of insulating films, wherein, from among the plurality of memory cells, memory cells arranged in a line in the vertical direction share a selected one of the plurality of bit lines, wherein each of the plurality of vertical semiconductor structures comprises a first heavily doped film of a first conductivity type, a first lightly doped film of a second conductivity type, a second lightly doped film of the first conductivity type, and a second heavily doped film of the second conductivity type, which are sequentially provided in the vertical direction, and wherein the vertical channel region of each of the plurality of vertical semiconductor structures comprises the first lightly doped film or the second lightly doped film.

18. The semiconductor memory device of claim 17, wherein the first heavily doped film of each of the plurality of vertical semiconductor structures is in contact with a selected one of the plurality of sensing lines, and wherein the second heavily doped film of each of the plurality of vertical semiconductor structures is in contact with a selected one of the plurality of bit lines.

19. The semiconductor memory device of claim 17, further comprising:

a first connection circuit and a second connection circuit on the substrate, the first connection circuit and the second connection circuit being apart from each other in the first lateral direction with the memory cell array therebetween;

a plurality of word line contacts respectively connected to the plurality of word lines in a one-to-one manner in the first connection circuit, the plurality of word line contacts extending long in the vertical direction; and a plurality of sensing line contacts respectively connected to the plurality of sensing lines in a one-to-one manner in the second connection circuit, the plurality of sensing line contacts extending in the vertical direction.

20. The semiconductor memory device of claim 17, wherein each of the plurality of memory cells comprises one transistor and does not comprise a capacitor.

* * * * *